United States Patent
Fujisawa et al.

(10) Patent No.: US 9,087,850 B2
(45) Date of Patent: Jul. 21, 2015

(54) METHOD FOR MANUFACTURING SEMICONDUCTOR DEVICE

(75) Inventors: Atsushi Fujisawa, Kameda (JP); Hiroshi Fujii, Kameda (JP)

(73) Assignee: Renesas Electronics Corporation, Kawasaki-shi (JP)

(*) Notice: Subject to any disclaimer, the term of this patent is extended or adjusted under 35 U.S.C. 154(b) by 464 days.

(21) Appl. No.: 13/382,332

(22) PCT Filed: Jun. 30, 2010

(86) PCT No.: PCT/JP2010/061141
§ 371 (c)(1),
(2), (4) Date: Jan. 5, 2012

(87) PCT Pub. No.: WO2011/004746
PCT Pub. Date: Jan. 13, 2011

(65) Prior Publication Data
US 2012/0108013 A1    May 3, 2012

(30) Foreign Application Priority Data
Jul. 6, 2009    (JP) .................................. 2009-159511

(51) Int. Cl.
*H01L 21/56*    (2006.01)
*B23K 26/40*    (2014.01)
(Continued)

(52) U.S. Cl.
CPC .......... *H01L 21/565* (2013.01); *B23K 26/4065* (2013.01); *H01L 21/4842* (2013.01);
(Continued)

(58) Field of Classification Search
CPC . H01L 21/4821; H01L 21/4835; H01L 21/56; H01L 23/495; H01L 23/49541; H01L 23/49558; H01L 23/49575; H01L 23/49579; H01L 23/28; H01L 23/3107
USPC .......................................... 438/111, 112, 127
See application file for complete search history.

(56) References Cited

U.S. PATENT DOCUMENTS 5,662,822 A * 9/1997 Tada et al. ................ 219/121.67
5,989,474 A * 11/1999 Suzuki .......................... 264/400
(Continued)

FOREIGN PATENT DOCUMENTS

GB    02177965    2/1987
JP    62-172735 A    7/1987
(Continued)

OTHER PUBLICATIONS

Online English Machine translation of JP 04-157761, Numata Toru, published May 29, 1999.*
(Continued)

*Primary Examiner* — Peniel M Gumedzoe
(74) *Attorney, Agent, or Firm* — Miles & Stockbridge P.C.

(57) ABSTRACT

In QFN packages for vehicles which are required to have high reliability, the side surface of leads is mostly covered with lead-to-lead resin protrusions, which prevent smooth formation of solder fillets during reflow mounting. When the lead-to-lead protrusions are mechanically removed using a punching die, there is a high possibility of causing cracks of the main body of the package or terminal deformation. When a spacing is provided between the punching die and the main body of the package in order to avoid such damages, a resin residue is produced to hinder complete removal of this lead-to-lead resin protrusion. The present invention provides a method for manufacturing semiconductor device of a QFN type package using multiple leadframes having a dam bar for tying external end portions of a plurality of leads. This method includes a step of removing a sealing resin filled between the circumference of a mold cavity and the dam bar by using laser and then carrying out surface treatment, for example, solder plating.

9 Claims, 45 Drawing Sheets

(51) Int. Cl.
*H01L 21/48* (2006.01)
*H01L 23/31* (2006.01)
*H01L 23/495* (2006.01)
*H01L 23/00* (2006.01)

(52) U.S. Cl.
CPC ...... *H01L23/3107* (2013.01); *H01L 23/49541* (2013.01); *H01L 23/49548* (2013.01); *H01L 23/49579* (2013.01); *H01L 23/49582* (2013.01); *H01L 24/29* (2013.01); *H01L 24/32* (2013.01); *H01L 24/45* (2013.01); *H01L 24/48* (2013.01); *H01L 24/83* (2013.01); *H01L 24/85* (2013.01); *H01L 2224/29339* (2013.01); *H01L 2224/32245* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48247* (2013.01); *H01L 2224/48465* (2013.01); *H01L 2224/73265* (2013.01); *H01L 2224/8385* (2013.01); *H01L 2224/83191* (2013.01); *H01L 2224/85* (2013.01); *H01L 2224/92* (2013.01); *H01L 2224/92247* (2013.01); *H01L 2924/01004* (2013.01); *H01L 2924/01013* (2013.01); *H01L 2924/01014* (2013.01); *H01L 2924/01015* (2013.01); *H01L 2924/01028* (2013.01); *H01L 2924/01029* (2013.01); *H01L 2924/01047* (2013.01); *H01L 2924/01078* (2013.01); *H01L 2924/01079* (2013.01); *H01L 2924/07802* (2013.01); *H01L 2924/10253* (2013.01); *H01L 2924/14* (2013.01); *H01L 2924/18301* (2013.01)

(56) References Cited

U.S. PATENT DOCUMENTS

2011/0097854 A1* 4/2011 Fujishima et al. ............ 438/123
2011/0198739 A1* 8/2011 Amanai et al. ................ 257/667

FOREIGN PATENT DOCUMENTS

| JP | 1991-106063 | 2/1991 |
|----|----|----|
| JP | 4-157761 A | 5/1992 |
| JP | H4-157761 | 5/1992 |
| JP | 5-315381 A | 11/1993 |
| JP | 2000-299400 A | 10/2000 |
| JP | 2002-184795 A | 6/2002 |
| JP | 2003-124422 A | 4/2003 |
| JP | 2004-247612 A | 9/2004 |
| JP | 2008-537511 | 9/2008 |
| JP | 2008-252005 | 10/2008 |
| JP | 2008-252005 A | 10/2008 |
| WO | WO 2006-118454 A1 | 11/2006 |

OTHER PUBLICATIONS

Online English Machine translation of JP 2008-252005, Yoshiba Shigeji, published Mar. 30, 2007.*

Office Action issued Aug. 1, 2013, in Japanese Patent Application No. 2011-521893.

Office Action issued Sep. 12, 2013, in Japanese Patent Application No. 2011-521893.

Office Action issued Mar. 3, 2014, in Chinese Patent Application No. CN201080030507.1.

Office Action issued Jun. 12, 2014, in Japanese Patent Application No. JP 2013-212719.

* cited by examiner

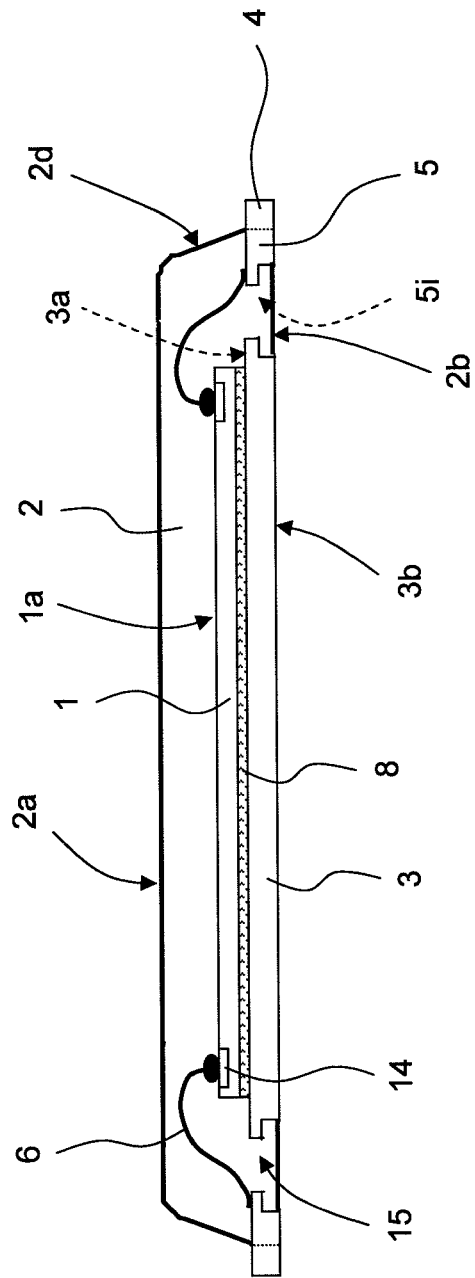

METHOD FOR MANUFACTURING SEMICONDUCTOR DEVICE

TECHNICAL FIELD

The present invention relates to a technology effective when applied to a packaging technology in a method for manufacturing semiconductor device (or semiconductor integrated circuit device).

BACKGROUND ART

Japanese Patent Laid-Open No. 2000-299400 (Patent Document 1) discloses a technology, in a non-leaded flat package, of removing a sealing material present between leads by using a punching die and covering exposed leads with a metal film by plating for enhancing their solder adhesion, in order to prevent a short-circuit between leads at the time of packaging.

Japanese Patent Laid-Open No. Hei 4-157761 (Patent Document 2) discloses a technique, in resin sealing with a lead frame, of using laser irradiation for removing a resin piece formed at a resin dam portion.

PRIOR ART LITERATURES

Patent Documents

[Patent Document 1] Japanese Patent Laid-Open No. 2000-299400
[Patent Document 2] Japanese Patent Laid-Open No. Hei 4-157761

DISCLOSURE OF THE INVENTION

Problems that the Invention is to Solve

Compared with QFP (quad-flat package) type semiconductor devices, QFN (quad-flat nonleaded package) type semiconductor devices or PQF (protruded-leads quad-flat package with heat die-pad, currently called "protruded-leads quad-flat package" which is a temporary formal English name) type semiconductor devices, one of the modifications of the QFN type semiconductors, (they will hereinafter be called "QFN type semiconductor devices") are said to be effective for miniaturization of electronic systems because a protrusion amount of leads (outer lead portions) from the side surface of a sealing body is short so that a packaging area can be reduced proportionately. Incidentally, at this time, the PQF type package is sometimes called "protruded-leads quad".

Compared with QFP type semiconductor devices, however, the length of a lead coupled to an electrode pad of a mounting substrate in the QFN type semiconductor devices is short, meaning that a mounting strength is low. Described specifically, a mounting strength is low because in a plurality of leads exposed from a sealing body which will be outer lead portions, a portion of the sealing body is formed also between two adjacent leads so that a contact area between a conductive member (such as solder) to be used upon mounting on a mounting substrate and a lead exposed from the sealing body is smaller than that of the QFP type semiconductor devices.

The present inventors therefore investigated removal of a resin formed between leads by using the method shown in Japanese Patent Laid-Open No. 2000-299400 (Patent Document 2) in order to improve the area of a lead exposed from a sealing body. When a resin between leads is removed by using a punching die as described in Japanese Patent Laid-Open No. 2000-299400 (Patent Document 1), however, the punching die should have a width smaller than the distance between leads in consideration of misalignment of the punching die. It is therefore difficult to remove a resin formed on the side surface of the lead.

As a result, the present inventors studied a method of removing a resin formed between leads by exposing it to a laser light as shown in Japanese Patent Laid-Open No. Hei 4-157761 (Patent Document 2), but found that the resin formed on the side surface of the lead could not be removed completely. The present inventors studied the cause of it and found as follows. Described specifically, when the side surface of the lead is perpendicular to the top surface (or bottom surface) of the lead, a laser light irradiated only to a first direction (for example, a direction from the top surface side of the lead to the bottom surface side) from a laser gun (laser beam delivery head) does not reach sufficiently to the side surface of the lead. In addition, when a leadframe is formed using an etching system, the side surface of the lead after etching does not become flat and a small prominence formed by etching becomes an obstacle, preventing the laser light from being irradiated to the side surface on the back side (side opposite to the laser irradiated side) of this prominence. This means that it becomes difficult to remove the resin attached to the side surface of the lead by a single laser irradiation step.

The present invention has been made for solving the above-mentioned problems.

An object of the invention is to provide a manufacturing process of a highly reliable semiconductor device.

The above and other objects and novel features of the present invention will become apparent from the description herein and the accompanying drawings.

Means for Solving the Problems

Typical inventions, among the inventions disclosed herein, will next be outlined briefly.

In the present invention, there is provided a method for manufacturing semiconductor device using resin sealing, wherein after a resin molding step, an irradiation angle of a laser beam is inclined between the side surface of an outer lead and a plane parallel thereto upon removal of a resin member between a plurality of outer leads (including the side surface) protruded from a resin sealing body.

Effects of the Invention

Advantages available by typical inventions, among the inventions disclosed herein, will next be described briefly.

In the method for manufacturing semiconductor device by using resin sealing, when after a resin molding step, a resin member between a plurality of outer leads (including the side surface) protruded from a resin sealed body is removed by laser beam irradiation, it is possible to improve removal of a residual resin member by inclining an irradiation angle of a laser beam between the side surface of the outer leads and a plane parallel thereto.

BRIEF DESCRIPTION OF THE DRAWINGS

FIG. 4 is a cross-sectional view of the package corresponding to the cross-section X-X' of FIG. 1;

FIG. 6 is a top view of the lead frame describing the relationship between each portion of the lead frame illustrated in FIG. 5 and a sealing body, a half etch region, a portion to be cut finally, and the like.

BEST MODE FOR CARRYING OUT THE INVENTION

Summary of the Embodiments

Figure 1:
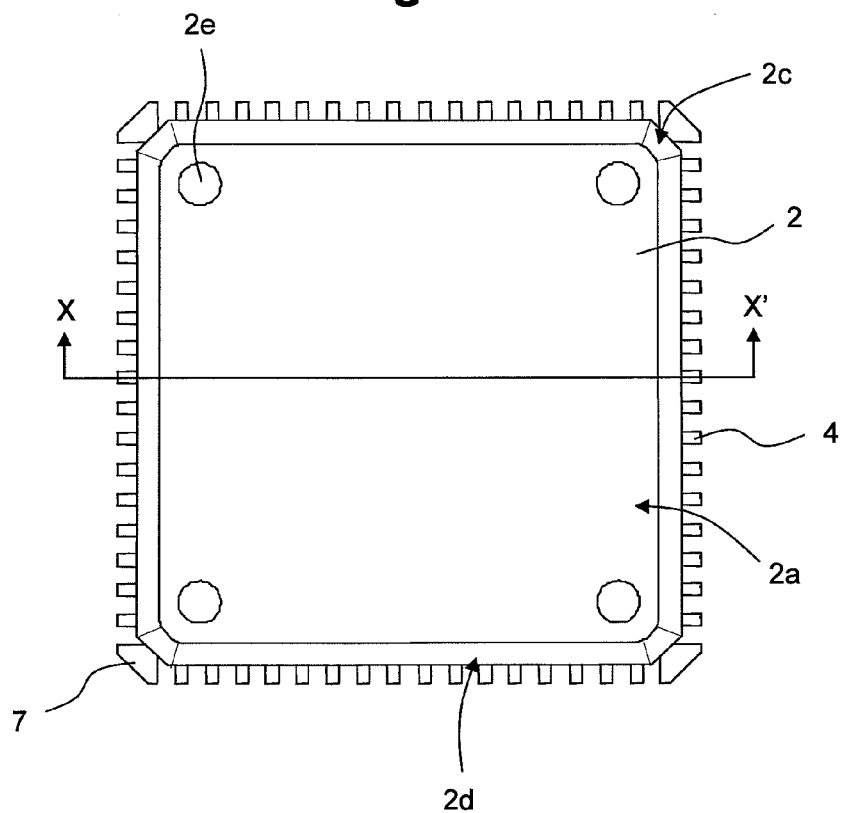
FIG. 1 is a package top view showing an example of a QFN-type like package structure of a semiconductor device manufactured using a method for manufacturing semiconductor device according to one embodiment of the invention.

Typical embodiments of the invention disclosed herein will next be outlined.

1. A method for manufacturing semiconductor device, including the steps of:

(a) setting a leadframe on which a semiconductor chip is fixed in a molding die, and sealing the semiconductor chip with a sealing resin so as to form a resin sealing body on the leadframe, the leadframe including:

(i) a die pad to which the semiconductor chip is fixed, (ii) a plurality of inner leads extending to a side surface of the resin sealing body from the outer periphery of the die pad so as to form a substantially same plane with the bottom surface of the resin sealing body, and a plurality of outer leads connected d to the inner leads, respectively, and protruding from the side surface of the resin sealing body;

(iii) a dam bar for connecting the vicinities of the outer end portions of the outer leads;

(iv) a lead-to-lead resin protrusion filling between the outer leads therewith and protruding from the side surface of the resin sealing body; and the method for manufacturing semiconductor device further including the step of:

(b) after the step (a), removing the lead-to-lead resin protrusion by irradiating a laser light to the lead-to-lead resin protrusion, the step (b) further including the step of:

(b1) obliquely irradiating the laser light to the side surface of the outer leads.

2. The method for manufacturing semiconductor device as described above in 1, wherein a cross-section of the outer leads perpendicular to the longitudinal direction has an erected and substantially trapezoidal shape.

3. The method for manufacturing semiconductor device as described above in 1 or 2, wherein in the step (b1), the laser light is irradiated from the upper surface side of the leadframe.

4. The method for manufacturing semiconductor device as described above in any one of 1 to 3, wherein in the step (b1), the laser light is irradiated to the upper surface or lower surface of the leadframe from a substantially perpendicular direction thereto.

5. The method for manufacturing semiconductor device as described above in any one of 1 to 4, wherein in the step (b1), the upper surface or lower surface of the leadframe is retained substantially horizontal.

6. The method for manufacturing semiconductor device as described above in any one of 1 to 5, wherein in the step (b1), the laser light has an inclination angle of 6 degrees or more but not more than 30 degrees.

7. The method for manufacturing semiconductor device as described above in any one of 1 to 5, wherein in the step (b1), the laser light has an inclination angle of 10 degrees or more but not more than 25 degrees.

8. The method for manufacturing semiconductor device as described above in any one of 1 to 5, wherein in the step (b1), the laser light has an inclination angle of 10 degrees or more but not greater than 20 degrees.

9. The method for manufacturing semiconductor device as described above in any one of 1 to 8, wherein the cross-section, on the inner end side of the inner leads, perpendicular to the longitudinal direction has an inverted and substantially trapezoidal shape.

10. The method for manufacturing semiconductor device as described above in any one of 1 to 9, wherein the leadframe is formed by patterning through wet etching from upper and lower surfaces thereof.

11. The method for manufacturing semiconductor device as described above in any one of 1 to 10, further including the step of:

(c) after the step (b), forming a solder layer on the surface of an exposed portion of the outer leads.

12. The method for manufacturing semiconductor device as described above in any one of 1 to 11, further including the step of:

(d) after the step (c), performing laser marking on the resin sealing body.

13. The method for manufacturing semiconductor device as described above in 12, wherein a laser power in the laser marking is smaller than a laser power in the step (b1).

14. The method for manufacturing semiconductor device as described above in any one of 1 to 13, further including the step of:

(e) after the step (d), cutting the outer end portion of the outer leads to separate the outer leads from the dam bar and at the same time separate the resin sealing body from the leadframe.

15. The method for manufacturing semiconductor device as described above in any one of 1 to 14, wherein in the step (b1), a resin burr on the outer leads is removed by irradiating the laser light also to the outer leads.

16. The method for manufacturing semiconductor device as described above in any one of 1 to 15, wherein the laser light is near infrared light.

17. The method for manufacturing semiconductor device as described above in any one of 1 to 16, wherein the laser light can be obtained from a YAG laser.

18. The method for manufacturing semiconductor device as described above in any one of 1 to 17, wherein the laser light has a wavelength of 1064 nm.

19. The method for manufacturing semiconductor device as described above in any one of 11 to 18, further including the step of:

(f) after the step (b) but before the step (c), subjecting the surface of the outer leads to a water jet treatment.

20. The method for manufacturing semiconductor device as described above in any one of 1 to 19, wherein the sealing in the step (a) is performed through transfer molding.

21. The method for manufacturing semiconductor device as described above in any one of 1 to 20, wherein in the step (b1), the laser light has an inclination angle of 6 degrees or more but not more than 120 degrees.

22. The method for manufacturing semiconductor device as described above in any one of claims 1 to 20, wherein in the step (b1), the laser light has an inclination angle of 10 degrees or more but not more than 100 degrees.

23. The method for manufacturing semiconductor device according to any one of 1 to 20, wherein in the step (b1), the laser light has an inclination angle of 10 degrees or more but not more than 60 degrees.

Other embodiments of the invention disclosed herein will next be outlined.

1. A method for manufacturing semiconductor device, including the steps of:

(a) setting a leadframe on which a semiconductor chip is fixed in a molding die, and sealing the semiconductor chip with a sealing resin so as to form a resin sealing body on the leadframe, the leadframe including:

(i) a die pad to which the semiconductor chip is fixed, (ii) a plurality of inner leads extending to a side surface of the resin sealing body from the outer periphery of the die pad so as to form substantially the same plane with the bottom surface of the resin sealing body, and (iii) a plurality of outer leads connected to each of the inner leads and protruding from the side surface of the resin sealing body; and the method for manufacturing semiconductor device further including the step of:

(b) after the step (a), irradiating a laser light to the outer leads to remove a resin member between the outer leads or on the side surface of the outer leads, the step (b) further including the step of:

(b1) obliquely irradiating the laser light to the side surface of the outer leads.

2. The method for manufacturing semiconductor device as described above in 1, wherein a cross-section of the outer leads perpendicular to the longitudinal direction is an erected and substantially trapezoidal shape.

3. The method for manufacturing semiconductor device as described above in 1 or 2, wherein in the step (b1), the laser light is irradiated from the upper surface side of the leadframe.

4. The method for manufacturing semiconductor device as described above in any one of 1 to 3, wherein in the step (b1), the laser light is irradiated to the upper surface or lower surface of the leadframe from a substantially perpendicular direction thereto.

5. The method for manufacturing semiconductor device as described above in any one of claims 1 to 4, wherein in the step (b1), the upper surface or lower surface of the leadframe is retained substantially horizontal.

6. The method for manufacturing semiconductor device as described above in any one of 1 to 5, wherein in the step (b1), the laser light has an inclination angle of 6 degrees or more but not more than 300 degrees.

7. The method for manufacturing semiconductor device as described above in any one of 1 to 5, wherein in the step (b1), the laser light has an inclination angle of 10 degrees or more but not more than 25 degrees.

8. The method for manufacturing semiconductor device as described above in any one of 1 to 5, wherein in the step (b1), the laser light has an inclination angle of 10 degrees or more but not greater than 20 degrees.

9. The method for manufacturing semiconductor device as described above in any one of 1 to 8, wherein the cross-section perpendicular in the longitudinal direction on the inner edge of the inner leads has an inverted and substantially trapezoidal shape.

10. The method for manufacturing semiconductor device as described above in any one of 1 to 9, wherein the leadframe is formed by patterning through wet etching from upper and lower surfaces thereof.

11. The method for manufacturing semiconductor device as described above in any one of 1 to 10, further including the step of:

(c) after the step (b), forming a solder layer on the surface of an exposed portion of the outer leads.

12. The method for manufacturing semiconductor device as described above in any one of 1 to 11, further including the step of:

(d) after the step (c), performing laser marking on the resin sealing body.

13. The method for manufacturing semiconductor device as described above in 12, wherein a laser power in the laser marking is smaller than a laser power in the step (b1).

14. The method for manufacturing semiconductor device as described above in any one of 1 to 13, wherein in the step (b1), a resin burr on the outer leads is removed by irradiating the laser light also to the outer leads.

15. The method for manufacturing semiconductor device as described above in any one of 1 to 14, wherein the laser light is a near infrared light.

16. The method for manufacturing semiconductor device as described above in any one of 1 to 15, wherein the laser light can be obtained from a YAG laser.

17. The method for manufacturing semiconductor device as described above in any one of 1 to 16, wherein the laser light has a wavelength of 1064 nm.

18. The method for manufacturing semiconductor device as described above in any one of 11 to 17, further including the step of:

(e) after the step (b) but before the step (c), subjecting the surface of the outer leads to a water jet treatment.

19. The method for manufacturing semiconductor device as described above in any one of 1 to 18, wherein the sealing in the step (a) is performed through transfer molding.

20. The method for manufacturing semiconductor device as described above in any one of 1 to 19, wherein in the step (b1), the laser light has an inclination angle of 6 degrees or more but not more than 120 degrees.

21. The method for manufacturing semiconductor device as described above in any one of 1 to 19, wherein in the step (b1), the laser light has an inclination angle of 10 degrees or more but not more than 100 degrees.

22. The method for manufacturing semiconductor device as described above in any one of 1 to 19, wherein in the step (b1), the laser light has an inclination angle of 10 degrees or more but not more than 60 degrees.

Further embodiments of the invention disclosed herein will next be outlined.

1. A method for manufacturing semiconductor device, including the steps of:

(a) setting a leadframe to which a semiconductor chip is fixed in a molding die, and sealing the semiconductor chip with a sealing resin so as to form a resin sealing body on the leadframe, the leadframe including:

(i) a die pad to which the semiconductor chip is fixed, (ii) a plurality of inner leads extending to a side surface of the resin sealing body from the outer periphery of the die pad so as to form substantially the same plane with the bottom surface of the resin sealing body, and plurality of outer leads connected to the inner leads, respectively, and protruding from the side surface of the resin sealing body;

(iii) a dam bar connecting the vicinities of the outer end portions of the outer leads;

(iv) a lead-to-lead resin protrusion filling between the outer leads therewith and protruding from the side surface of the resin sealing body;

the method for manufacturing semiconductor device further including the steps of:

(b) after the step (a), removing the lead-to-lead resin protrusion by irradiating a laser light to the lead-to-lead resin protrusion, (c) after the step (b), irradiating a laser light to a first portion of a resin around a boundary between the surface exposed by the removal of the lead-to-lead resin protrusion and the remaining resin surface, thereby removing the surface of the first portion of the resin; and (d) after the step (c), forming a metal film on the surface of the leadframe protruded from the resin sealing body.

2. The method for manufacturing semiconductor device as described above in 1, wherein in the step (b), a laser light is irradiated to the lead-to-lead resin protrusion and the outer leads, respectively, to remove the lead-to-lead resin protrusion and expose the side surface of each of the outer leads.

3. The method for manufacturing semiconductor device as described above in 1 or 2, wherein in the step (b), the laser light is obliquely irradiated to the side surface of each of the outer leads.

4. The method for manufacturing semiconductor device as described above in any one of 1 to 3, wherein the cross-section of the outer leads perpendicular to the longitudinal direction is an erected and substantially trapezoidal shape and in the step (b), the laser light is irradiated from the upper surface side of the leadframe.

5. The method for manufacturing semiconductor device as described above in any one of 1 to 4, wherein removal of the first portion of the resin in the step (c) is performed by carrying out spot irradiation of the laser light to remove the upper surface side of the resin.

6. The method for manufacturing semiconductor device as described above in any one of 1 to 4, wherein the removal of the first portion of the resin in the step (c) is performed by carrying out spot irradiation of the laser light to allow the laser light to penetrate from the upper surface side to the lower surface side of the resin.

7. The method for manufacturing semiconductor device as described above in any one of 1 to 6, wherein the first portion of the resin is a portion of the resin sealing body.

8. The method for manufacturing semiconductor device as described above in any one of 1 to 6, wherein the first portion of the resin is a remaining portion of the lead-to-lead resin protrusion.

9. The method for manufacturing semiconductor device as described above in any one of 1 to 8, wherein in the step (c), the laser light is spot irradiated with an inclination to the center portion side of the resin sealing body.

Explanation on Description Form, Basic Terms, and Usage Herein

1. In the present application, a description in embodiments may be made after divided in a plurality of sections if necessary for convenience's sake. These sections are not independent each other, but they may each be a part of a single example or one of them may be partial details of the other or a modification example of a part or whole of the other unless otherwise specifically indicated.

In principle, description is not repeated with regards to similar portions. In the embodiments, when a reference is made to constituent elements, they are not essential unless otherwise specifically indicated, limited to the number theoretically, or principally apparent from the context that it is not.

2. Similarly, in the description of embodiments, when "X made of A" or the like is used with regard to the material, composition or the like, a component other than A is not excluded from main constituent elements unless otherwise specifically indicated or principally apparent from the context it is not. For example, with regard to a component, the above sentence means "X containing A as a main component". For example, it is needless to say that the term "silicon member" or the like means not only a member made of pure silicon but also a member containing a SiGe alloy or another multielement alloy having silicon as a main component, and an additive.

Further, the term "copper," "gold," "epoxy resin", "tin", or the like means not only a material of a pure member but also a material contained in a member as a main component unless otherwise specifically indicated or principally apparent from the context it is not.

3. Similarly, preferred examples of the shape, position, attribute or the like are shown, but it is needless to say that the shape, position, attribute, or the like is not limited strictly to the preferred one unless otherwise specifically indicated or principally apparent from the context that it is not.

4. Further, when a reference is made to a specific number or amount, the number or amount can be more than or less than the specific number or amount unless otherwise specifically indicated, limited to the specific number or amount theoretically, or apparent from the context that it is not.

5. The term "wafer" means a single crystal silicon wafer over which a semiconductor device (semiconductor device or an electronic device) is to be formed, but it is needless to say that it embraces an epitaxial wafer and a composite wafer of a semiconductor layer and an insulating substrate such as SOI substrate or LCD glass substrate. Individual integrated circuit devices divided from the wafer are designated as "semiconductor chips" or merely "chips." In the present application, a semiconductor as a substrate mainly means a silicon-based semiconductor, but it may be a GaAs semiconductor or another compound semiconductor.

6. The definition of a plastic package such as QFN as referred to herein will be described concretely in Section 1 of Details of the Embodiments.

Further Detailed Description of the Embodiments

Embodiments will next be described more specifically. In the accompanying drawings, the same or similar portions are identified by the same or similar symbols or reference numerals, and explanations thereof will not be repeated in principle.

In addition, in the accompanying drawings, even a cross-sectional view is not hatched if hatching may make the illustration complicated or it can be clearly distinguished from a void space. In this connection, the background contour line of even a planarly closed hole may be omitted as far as it is clear from an explanation or the like. Furthermore, in a drawing, even if an area is not a cross section, it may be hatched in order to show that it is not a void space.

Incidentally, details of the removal of an unnecessary resin portion by using a laser from a semiconductor package analogous to a QFN type package are described in Japanese Patent Application No. 2008-164388 (Filing date in Japan: Jun. 24, 2008), that is, Japanese Patent Laid-Open No. 2010-10187 so that a description on them is essentially not repeated herein. In addition, details of a leadframe structure, packaging process, and the like of a semiconductor package analogous to a QFN type package are described in International Application PCT/JP2006/074942 (International Publication No. 2009/81494 brochure) so that a description on them is not repeated herein in principle.

Figure 2:
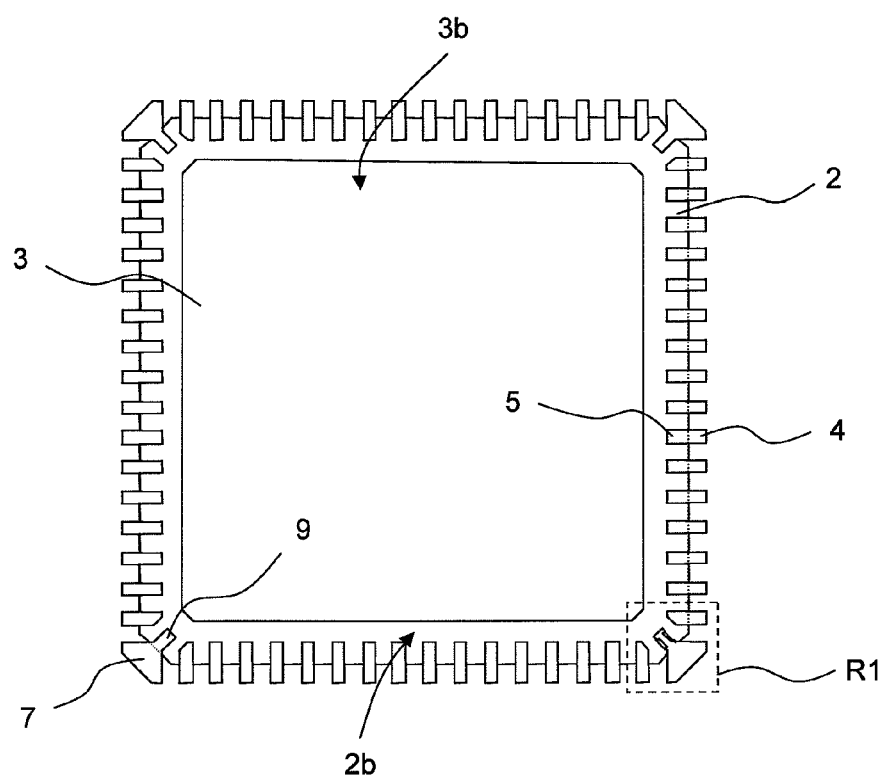
FIG. 2 is a package bottom view showing an example of the package structure of the semiconductor device manufactured using the method for manufacturing semiconductor device according to the one embodiment of the invention.
Figure 3:
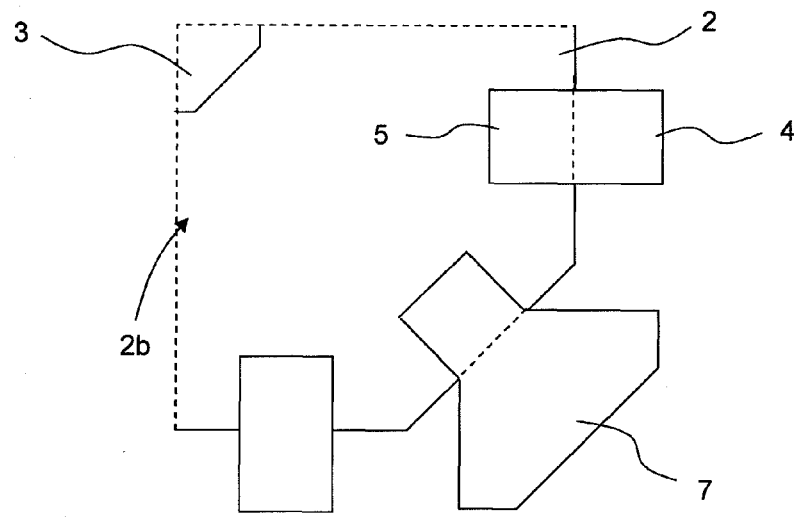
FIG. 3 is a package-enlarged bottom view of a back-surface corner portion R1 of sealing body shown in FIG. 2.

1. Description on a package structure of a semiconductor device manufactured using a method for manufacturing semiconductor device according to one embodiment of the present application (mainly from FIG. 1 to FIG. 4):

FIG. 1 is a package top view showing an example of a QFN-type like package structure of a semiconductor device manufactured using a method for manufacturing semiconductor device according to one embodiment of the invention. FIG. 2 is a package bottom view showing an example of the package structure of a semiconductor device manufactured using the method for manufacturing semiconductor device according to the one embodiment of the invention. FIG. 3 is a package-enlarged bottom view of a back-surface corner portion R1 of sealing body shown in FIG. 2. FIG. 4 is a cross-sectional view of the package corresponding to the cross-section X-X' of FIG. 1. With reference to these figures, a description will be given below about a package structure and the like of a semiconductor device manufactured using the method for manufacturing semiconductor device according to the one embodiment of the present application.

First, a description will be made of plastic packages such as QFN type. A QFN type plastic package is similar to QFP (quad flat package), but in it, a large number of outer leads protrude by from about 0.1 to 0.5 mm from the bottom end portions of the side surfaces which correspond to the sides of a package upper surface, with outer lead-to-outer lead spaces being sealed by lead-to-lead resin protrusions. Accordingly, this package has the advantage that compared with the QFP having outer leads extending relatively long from the package side surfaces, a mounting area can be saved.

However, since the side surfaces of the outer leads are almost covered with a resin, solder reflow mounting cannot be achieved to a satisfactory extent. In practice, this problem has been overcome by mechanically scraping off the lead-to-lead resin protrusions to partially or wholly expose the side surfaces of the outer leads. Therefore, a description will next be made of a QFN-type like plastic package whose lead-to-lead resin protrusions have been removed by some method. Incidentally, such a QFN-type like plastic package is decided to be called "PQF (protruded-leads quad-flat package) type" in future.

Reference will first be made to the package upper surface. As shown in FIG. 1, an upper surface 2a of a package 2 (resin sealing body) is almost a quadrangular shape (substantially square in the drawing). Although the upper surface is octagonal because of a chamfered corner 2c, the size of the chamfered corner 2c is small compared with the diameter of the package so that the upper surface can basically be regarded to have a quadrangular shape (square or rectangle). An outer lead 4 is protruded, for example, about 0.3 mm from the bottom end portion of a side surface 2d which corresponds to each side of the package upper surface 2a. From the bottom end portion of the chamfered corner 2c, a bumper 7 for visual inspection upon cooling and mounting is protruded. Incidentally, a circle at every corner of the package upper surface 2a is an ejector pin trace 2e.

The bumper 7 is coupled to an electrode pad on a mounting substrate via a conductive member (such as solder) so that it can improve the mounting strength of a semiconductor device. In addition, it can release heat from a semiconductor chip 1 (FIG. 4) to the outside (on the side of the mounting substrate) through a die pad 3 (FIG. 4), a suspending lead 9 (FIG. 5) integrally formed with the die pad 3, and this bumper 7 which is a portion of the die pad 3 and wider than the suspending lead 9 (die pad support lead) so that it has an advantage of suppressing a reliability deterioration (malfunction due to heat) of a semiconductor device.

A description will next be made of a package lower surface. As shown in FIGS. 2 and 3, a lower surface 3b of the die pad 3 is exposed for heat dissipation from the central part of a lower surface 2b of the package 2. Typically, the shape of the lower surface 3b of the die pad 3 is substantially the same as the planar shape of the package 2. In this case, it is substantially square (typically a quadrangular shape, including a rectangular shape) and has four sides. In the vicinity of the bumper 7, the suspending lead 9 (a lead for suspending the die pad, that is, a die pad support lead) is partially exposed.

A description will now be given about the cross-section X-X' of FIG. 1. As shown in FIG. 4, the back surface of the semiconductor chip 1 is fixed to an upper surface 3a of the die pad 3 which is located at the center of the bottom surface 2b of the package (resin sealing body) 2 through an adhesive layer 8 (which may be a silver paste layer) such as DAF (die attach film). The outer lead 4 is protruded from the bottom end portion of each side surface 2d of the resin sealing body 2. A bonding pad 14 formed on an upper surface 1a (surface opposite to the back surface of the semiconductor chip 1) of the semiconductor chip 1 and an inner end portion 5i of an inner lead 5 (periphery of the die pad 3 and the lower surface of a portion opposite to the inner end portion 5i of the inner lead 5 are subjected to a half etching treatment and become a half etch portion 15) are coupled to each other with a gold wire 6 (not only a gold-based wire but also an aluminum-based, copper-based, or silver-based wire is usable) containing gold as a principal component. One of the features of the QFN type plastic package as compared with QFP is that the lower surface of an exposed portion of the inner lead 5 and the lower surface 2b of the sealing body 2 configure almost the same plane with each other and that the outer lead 4 protrudes substantially linearly up to the outer end portion thereof from the bottom end portion of the side surface 2d of the sealing body 2. According to this manufacturing method, the lower surface of the lead frame coincides with the lower surface of the package and therefore the lower surface 3b of the die pad 3 configures a center portion of the lower surface 2b of the package. Described specifically, the lower surface 3b of the die pad 3 and the exposed lower surfaces of the leads (such as inner lead 5, outer lead 4, suspending lead 9, and bumper 7) and the bottom surface 2b of the sealing body form almost the same plane, while similarly, the upper surface 3a of the die pad 3 and upper surfaces of the leads (such as inner lead 5, outer lead 4, suspending lead 9, and bumper 7) configure almost the same plane.

As will be described later, in the present embodiment, the lateral width of the outer lead 4 is different between the upper surface and the lower surface and that of the lower surface is greater. This means that the side surface of the outer lead is inclined. It is inclined with an acute angle with a vertical plane as a standard.

On the other hand, at least a portion of the inner lead 5 shows an opposite inclination to the outer lead 4. This means that the lateral width of the upper surface is greater than that of the lower surface. It is inclined also with an acute angle. Such a structure is employed in order to prevent the inner lead 5 from falling off from the sealing body. In addition, a wider upper surface of the inner lead 5 is effective for securing a stable wire bonding property.

The basic dimensions of the package, which will be described herein, are as follows. The thickness of a leadframe is about 0.2 mm (a preferable range is 0.1 mm or more but not more than 0.3 mm), a lead pitch (the pitch of the outer lead and the inner lead) is about 0.5 mm (a preferable range is 0.2 mm or more but not more than 0.8 mm), a lead protrusion length, that is, the length of the outer lead is about 0.3 mm (a preferable range is 0.1 mm or more but not more than 0.5 mm, more preferably 0.2 mm or more but not more than 0.4 mm), a package width (the width of the sealing body) is about 8 mm (a preferable range is 3 mm or more but not more than 10 mm), a package thickness (the thickness of the sealing body) is about 0.8 mm (a preferable range is 0.3 mm or more but not more than 1.2 mm), and the number of leads (pins) is about 64 (a useful application range is about 20 or more but not more than 150, preferably 40 or more, particularly preferably 50 or more).

The invention of the application cannot be applied only to the package shape shown specifically herein but needless to say, it can be applied widely to at least semiconductor devices (electronic devices) having a lead protruded from a resin sealing body.

2. Description on the structure of a lead frame to be used in the method for manufacturing semiconductor device according to the one embodiment of the present application and an assembly process flow in the method for manufacturing semiconductor device (mainly from FIG. 5 to FIG. 20)

This section provides a description on the structure of a leadframe to be used in the method of manufacturing the semiconductor device described in Section 1 and an assembly process flow in the method of manufacturing the semiconductor device.

Figure 5:
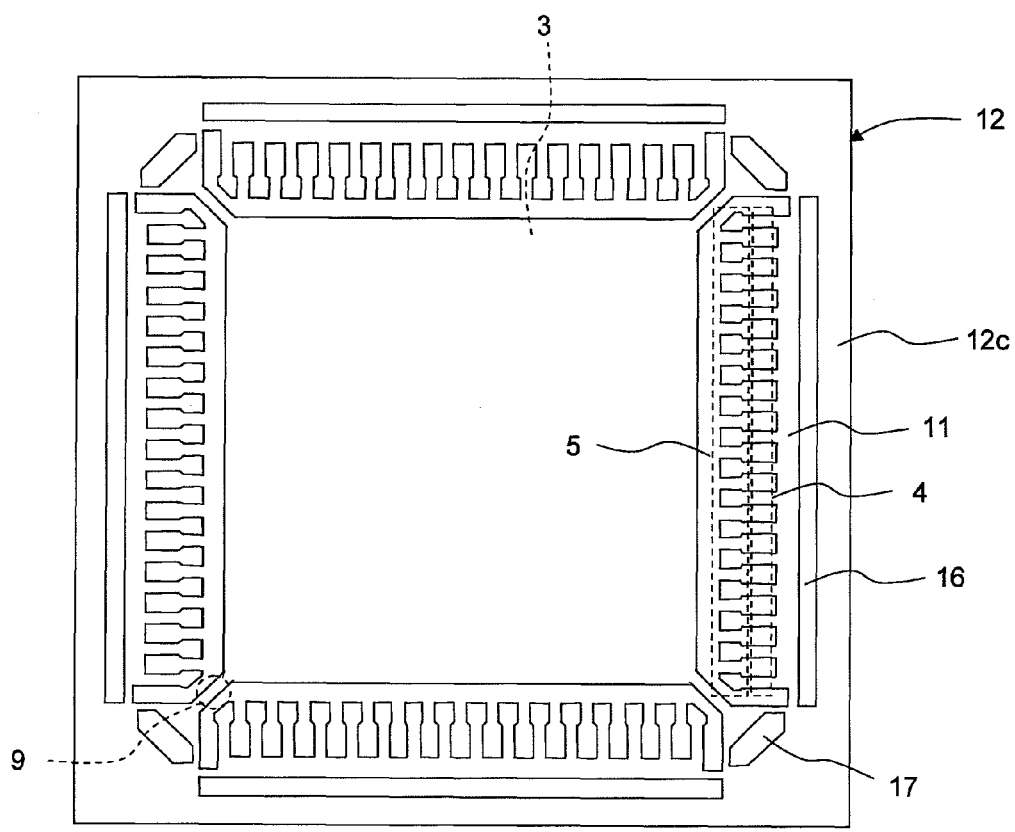
FIG. 5 is a top view of a lead frame to be used in the method for manufacturing semiconductor device according to the one embodiment of the invention.
Figure 6:
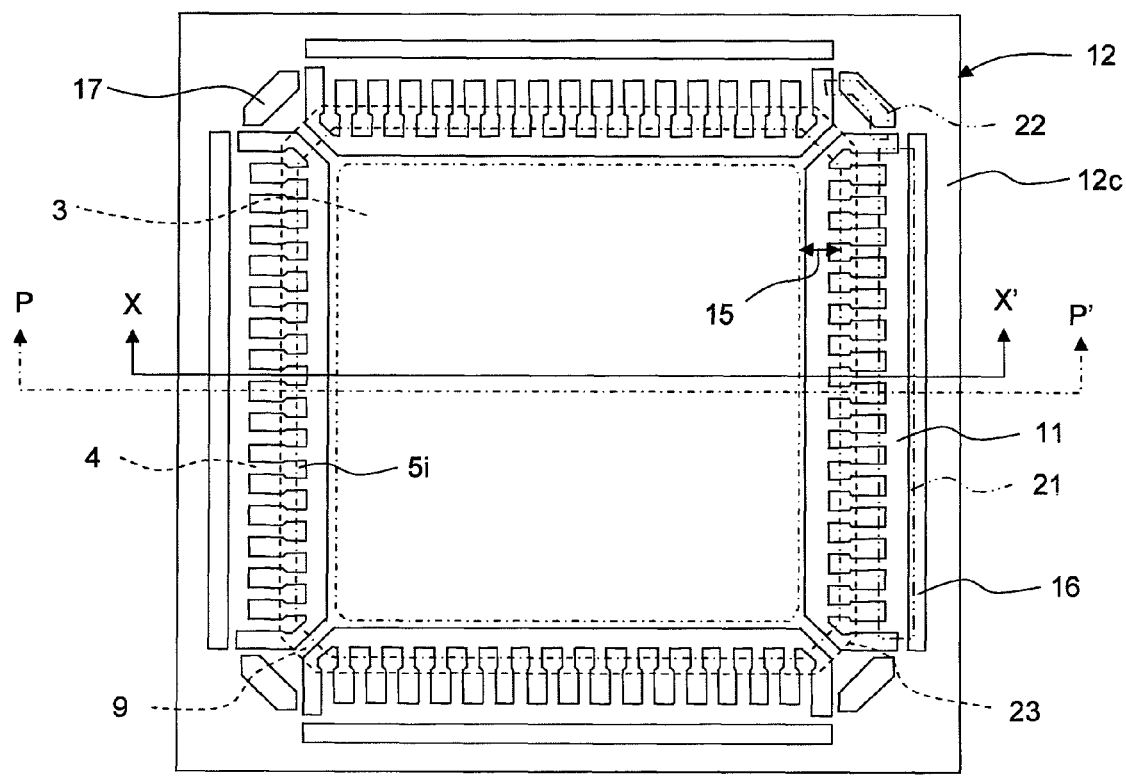
Figure 7:
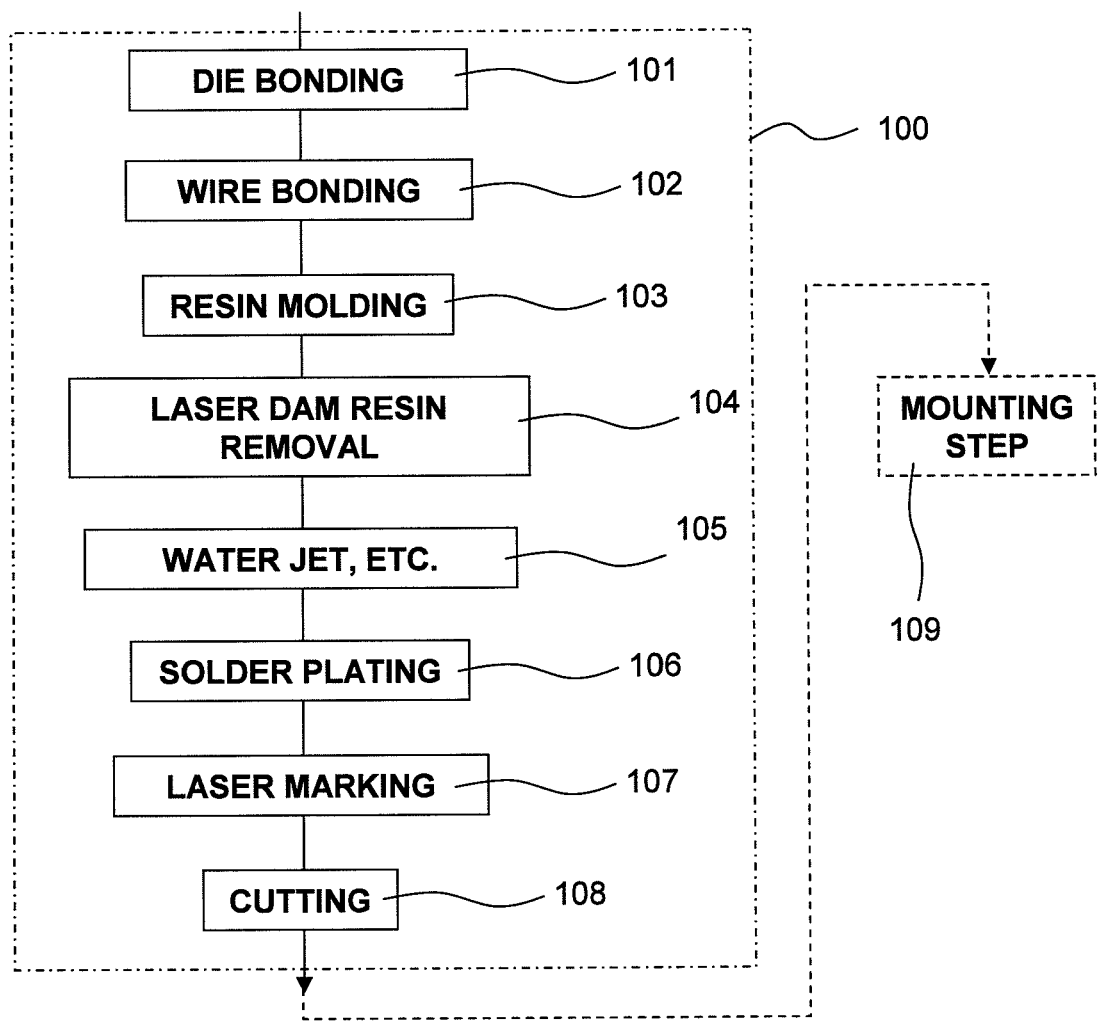
FIG. 7 is a process block flow chart showing the flow of an assembly step (including a portion of a packaging step) in the method for manufacturing semiconductor device according to the one embodiment of the invention.
Figure 8:
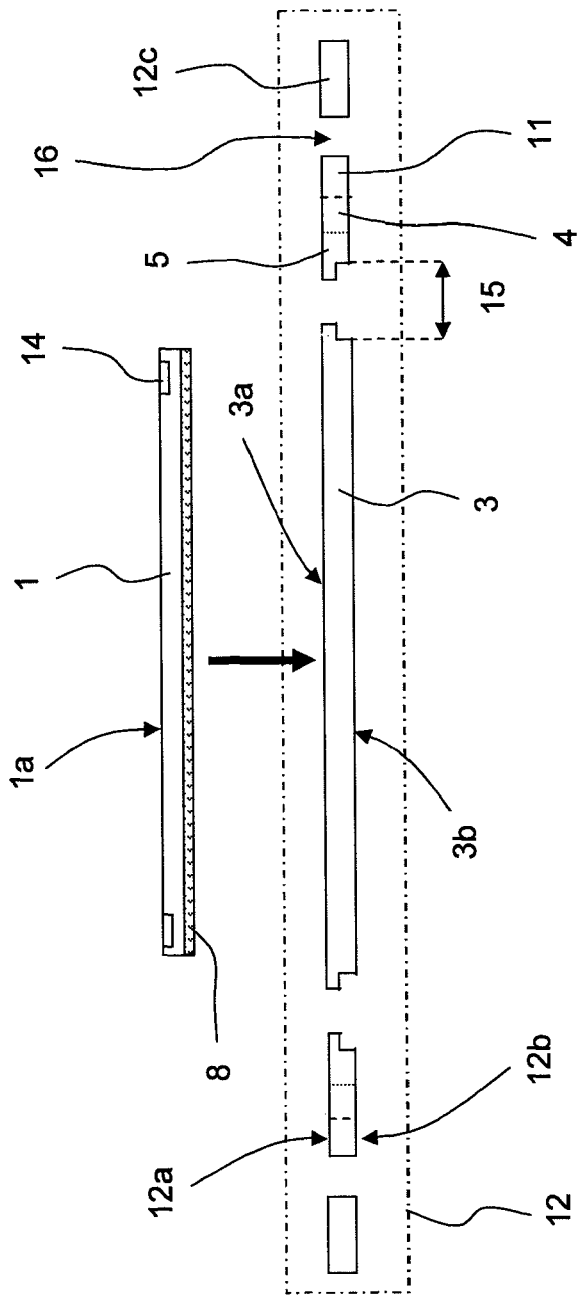
FIG. 8 is a device cross-section (cross-section X-X' of FIG. 6) process flow chart (during die bonding) corresponding to FIG. 7.
Figure 9:
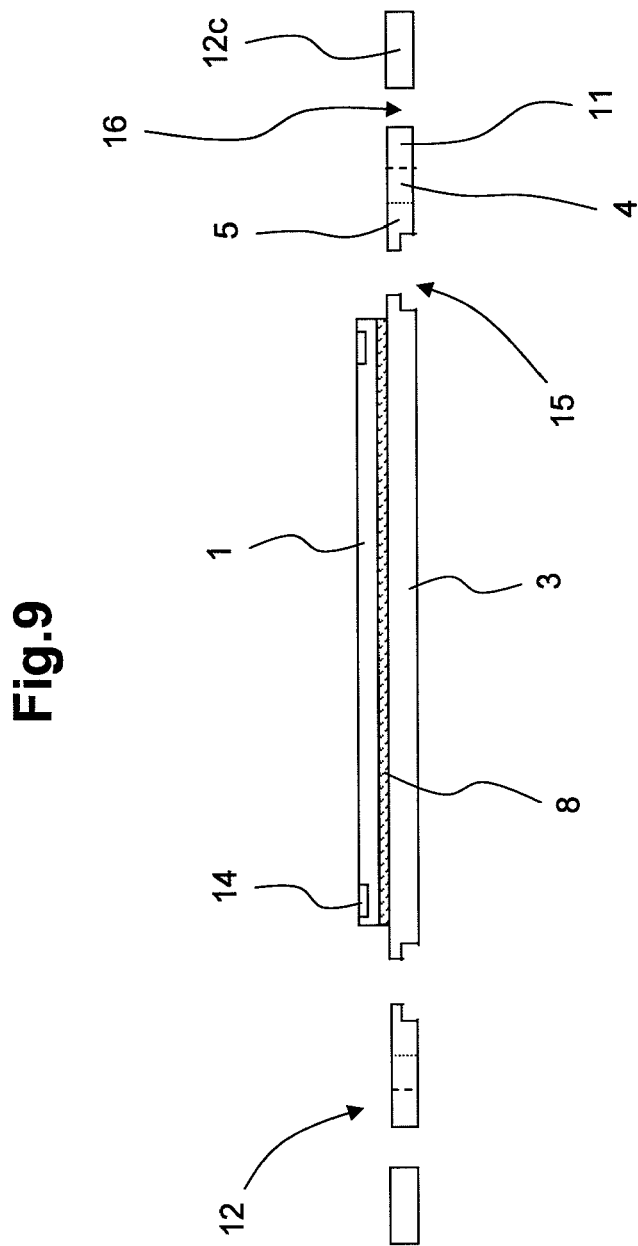
FIG. 9 is a device cross-section (cross-section X-X' of FIG. 6) process flow chart (at the time of completion of die bonding) corresponding to FIG. 7.
Figure 10:
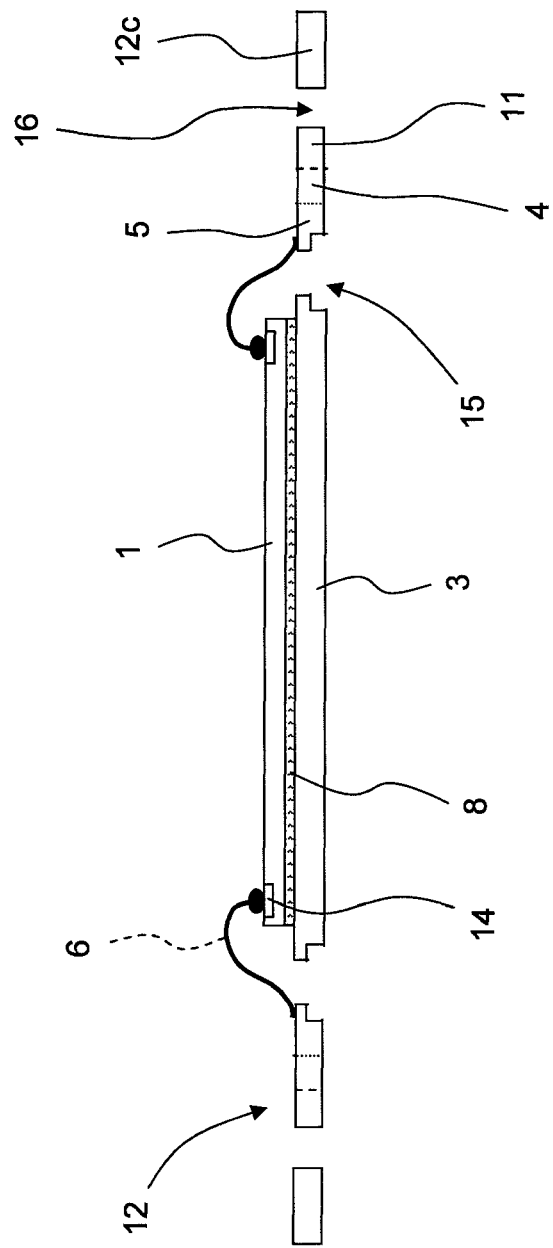
FIG. 10 is a device cross-section (cross-section X-X' of FIG. 6) process flow chart (at the time of completion of wire bonding) corresponding to FIG. 7.
Figure 11:
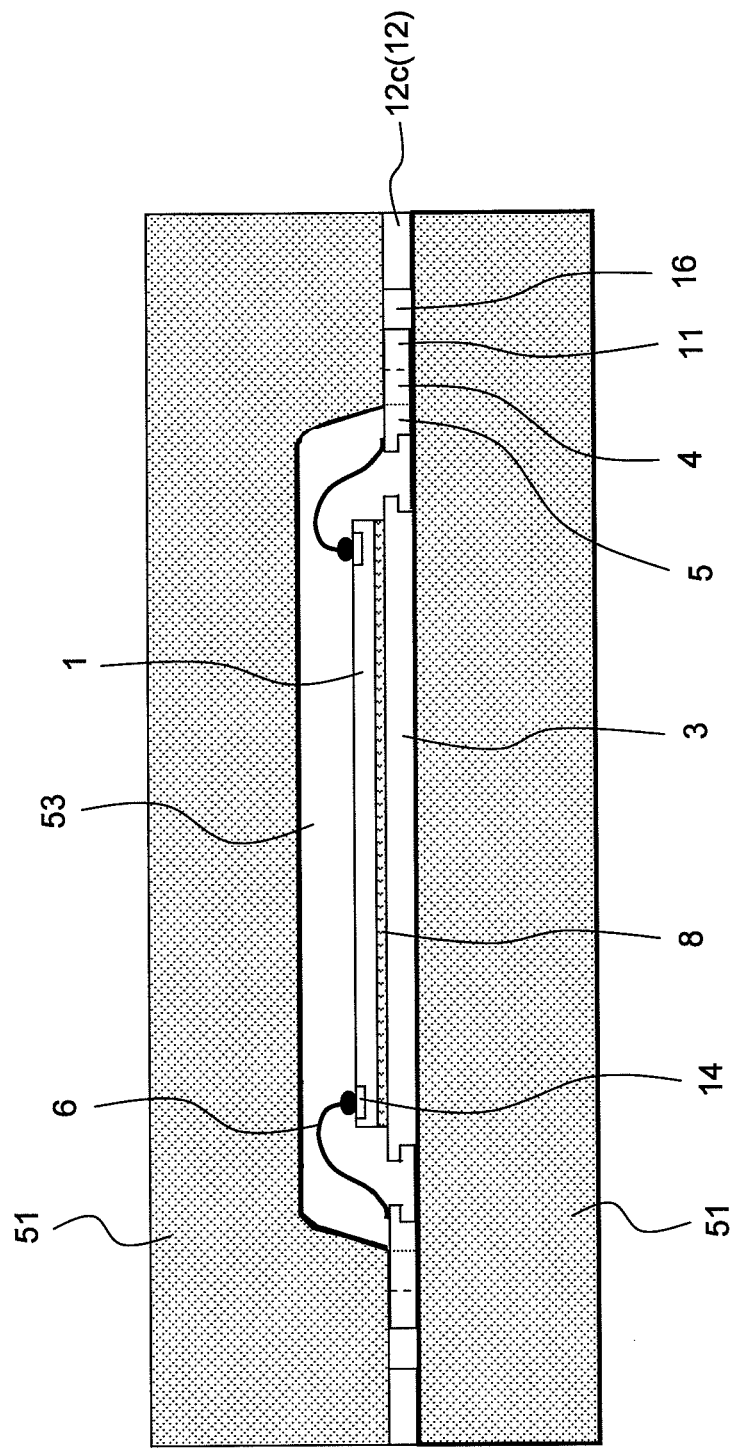
FIG. 11 is a device cross-section (cross-section X-X' of FIG. 6) process flow chart (at the time of die clamping in a molding die) corresponding to FIG. 7.
Figure 12:
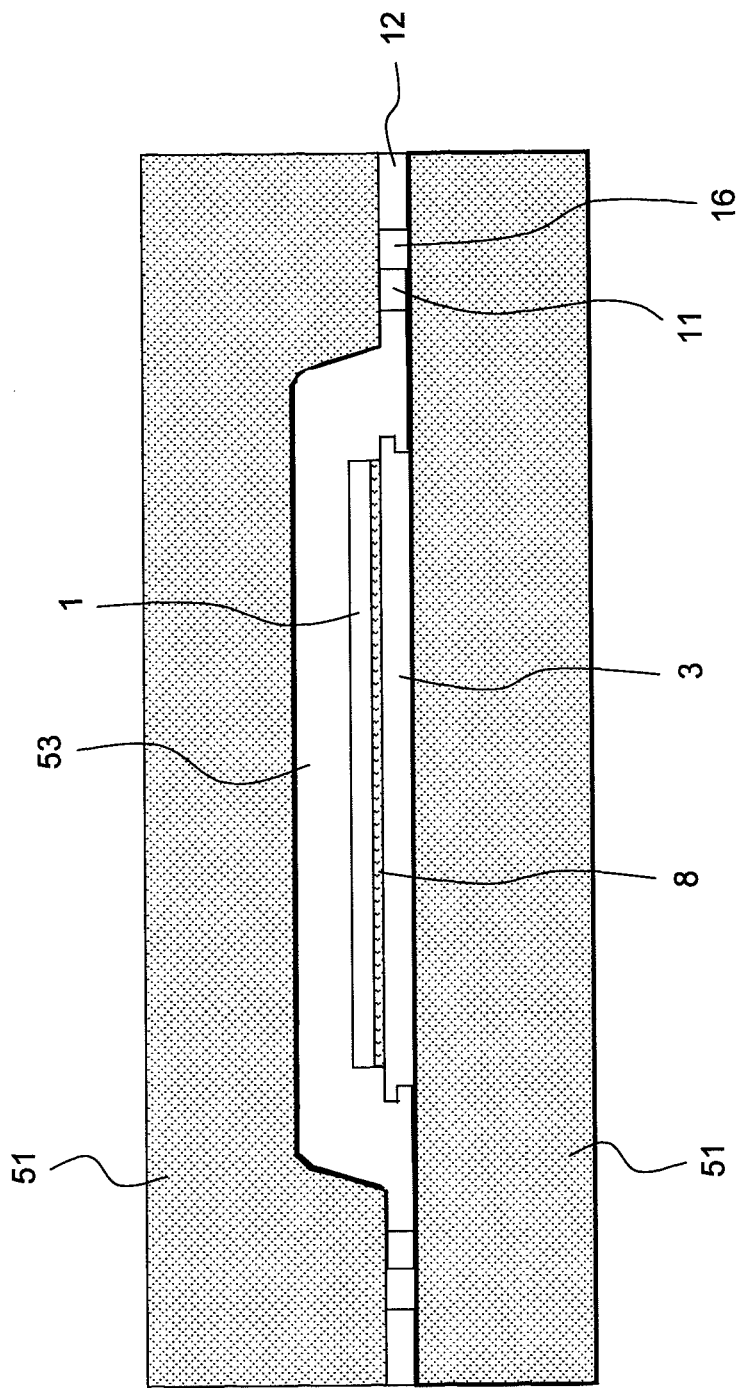
FIG. 12 is a device cross-section (cross-section P-P' of FIG. 6) process flow chart (at the time of die clamping in a molding die) corresponding to FIG. 7.
Figure 13:
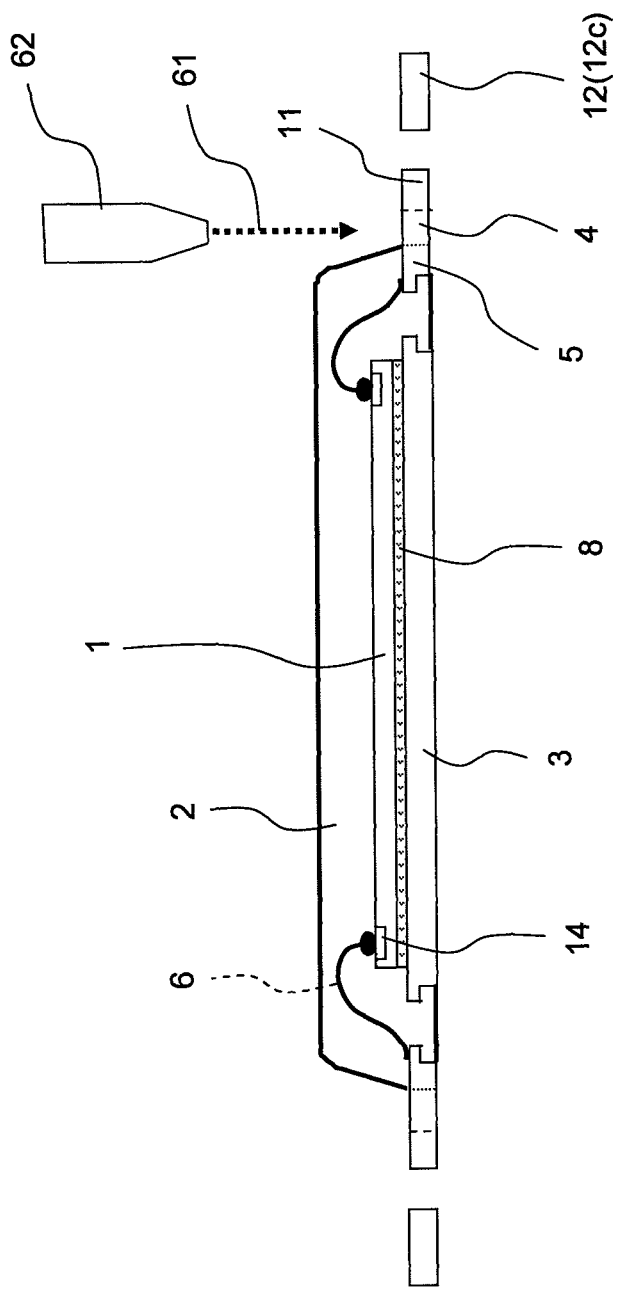
FIG. 13 is a device cross-section (cross-section X-X' of FIG. 6) process flow chart (during laser resin removal) corresponding to FIG. 7.
Figure 14:
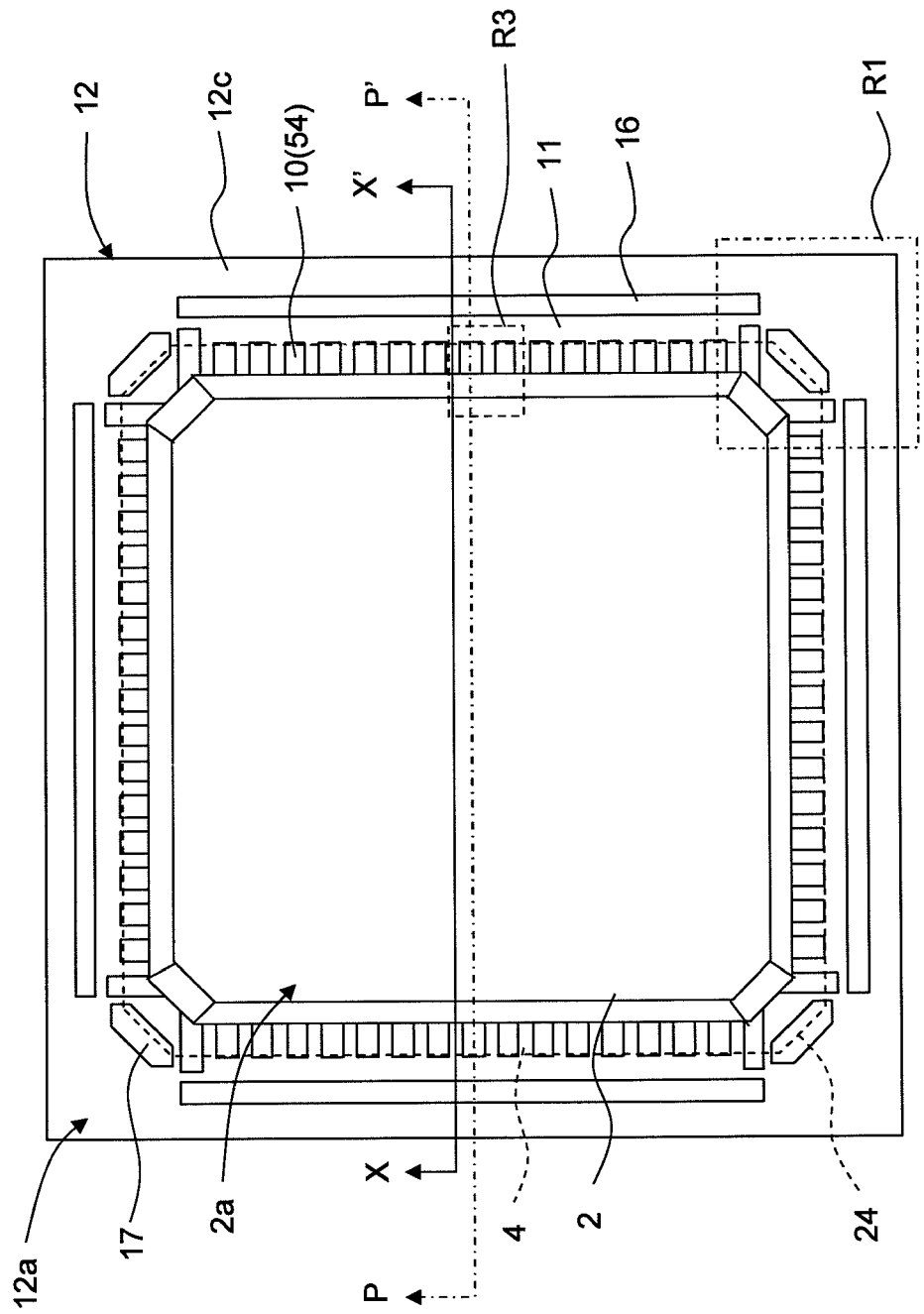
FIG. 14 is a lead frame top view corresponding to FIG. 13 (FIG. 13 corresponds to the cross-section X-X', while the cross-section P-P' corresponds to the cross-section P-P' of FIG. 21).
Figure 15:
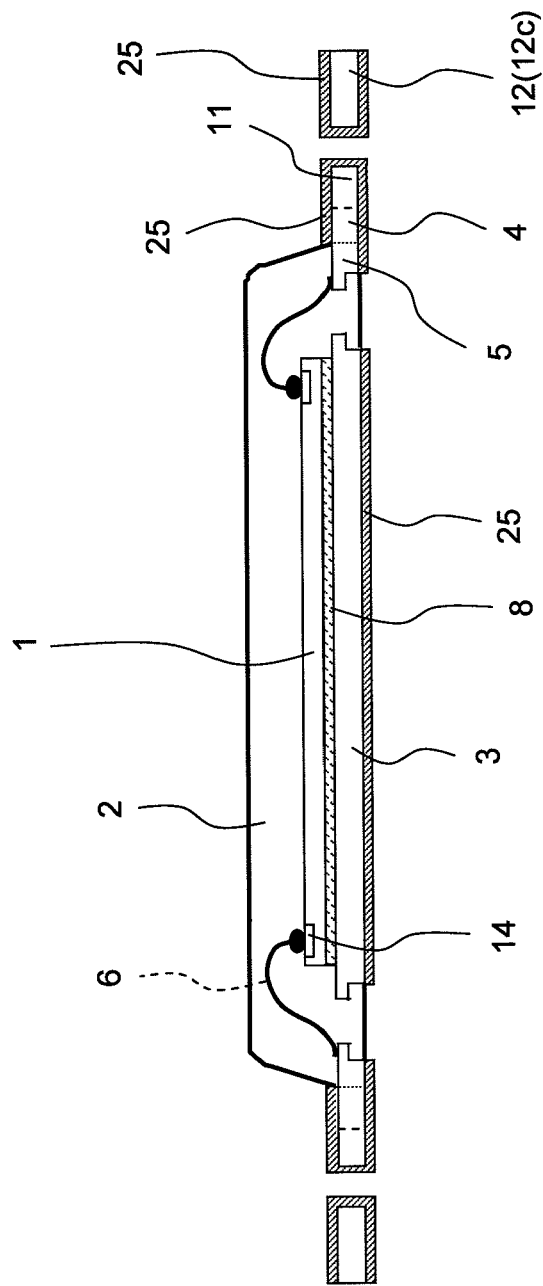
FIG. 15 is a device cross-section (cross-section X-X' of FIG. 6) process flow chart (at the time of completion of solder plating) corresponding to FIG. 7.
Figure 16:
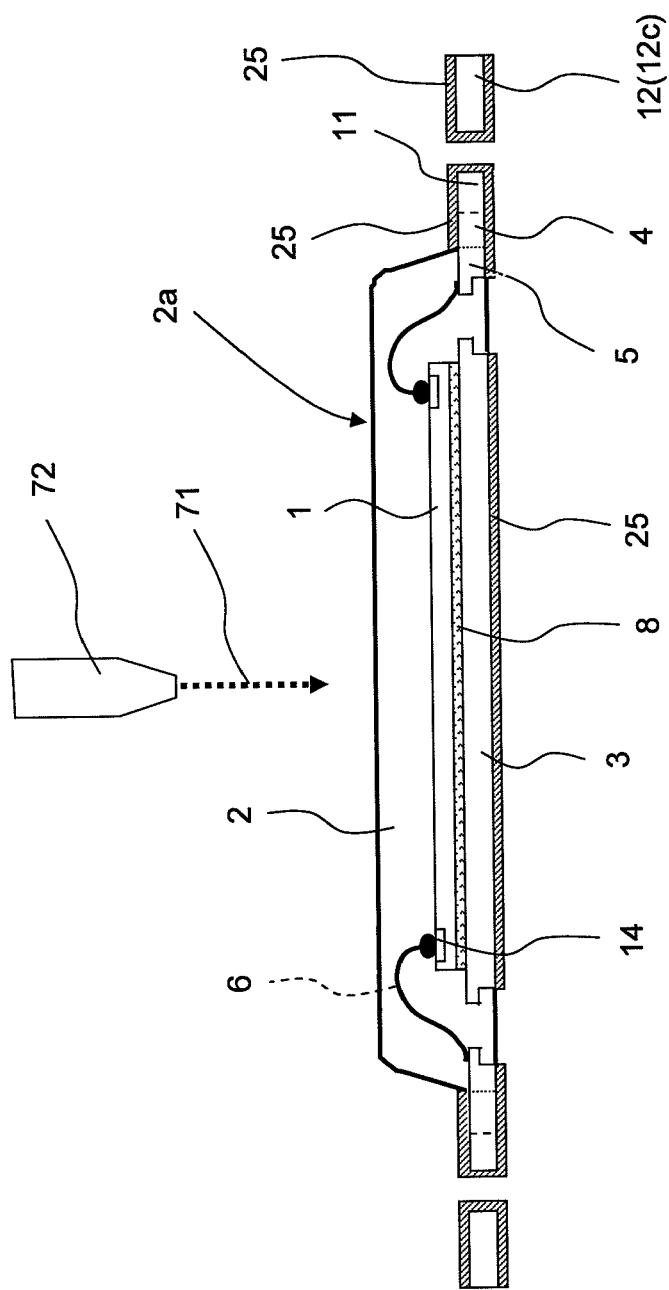
FIG. 16 is a device cross-section (cross-section X-X' of FIG. 6) process flow chart (during laser marking) corresponding to FIG. 7.
Figure 17:
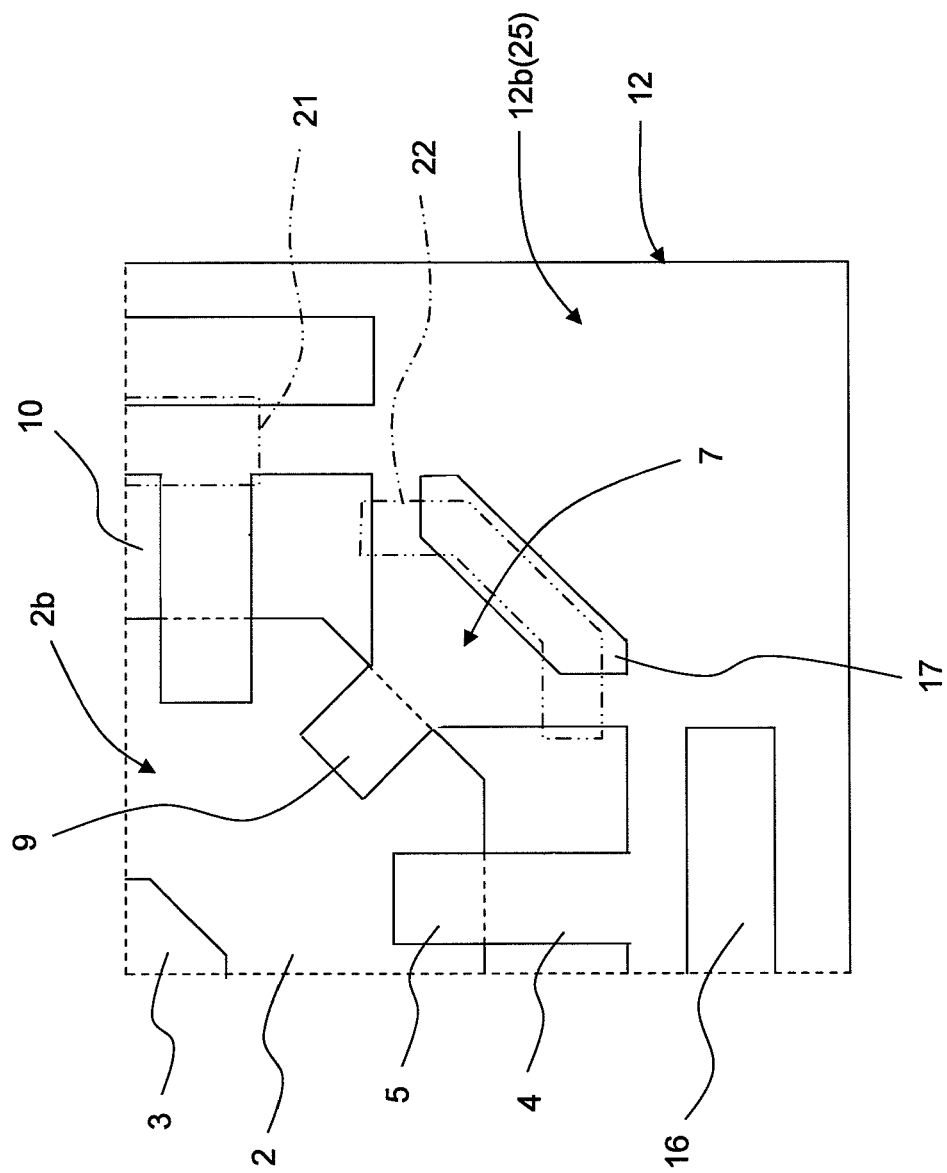
FIG. 17 is a leadframe bottom-surface enlarged view corresponding to the back-surface corner portion R1 of sealing body shown in FIG. 14, for describing a cutting step in FIG. 7.
Figure 18:
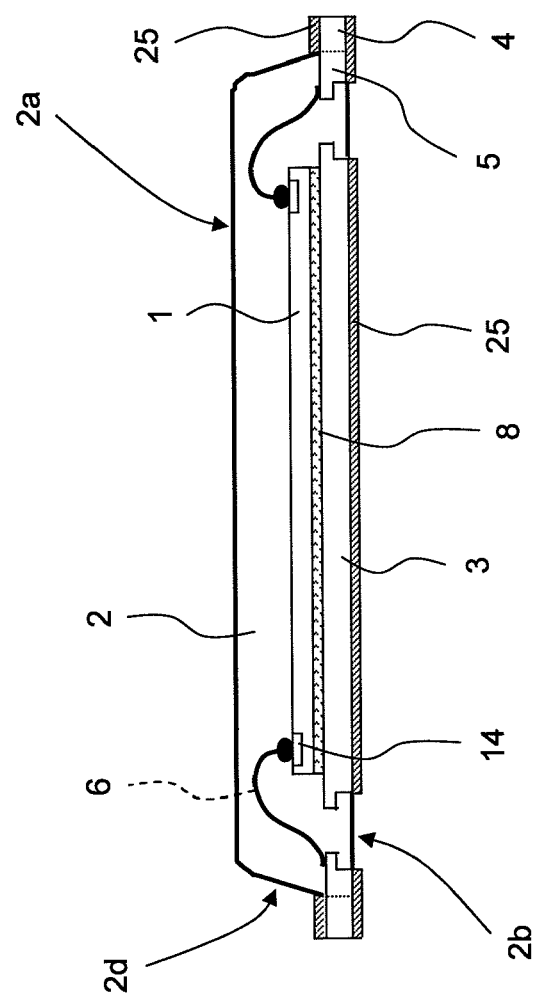
FIG. 18 is a device cross-section (cross-section X-X' of FIG. 6) process flow chart (at the time of completion of the cutting step) corresponding to FIG. 7.
Figure 19:
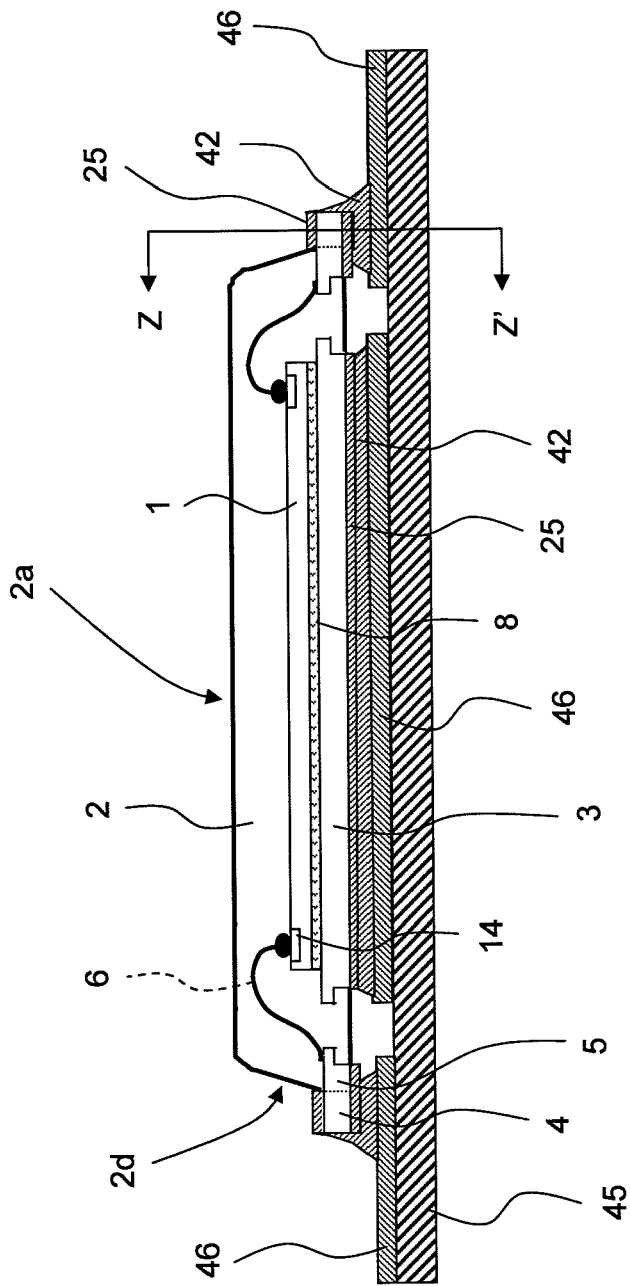
FIG. 19 is a device cross-section (cross-section X-X' of FIG. 6) process flow chart (at the time of completion of solder reflow mounting) corresponding to FIG. 7 (actually, a solder layer and a re-solidified solder layer configure a solder fillet while forming no clear boundary therebetween but, the solder plating layer is shown as an independent layer for convenience of description).
Figure 20:
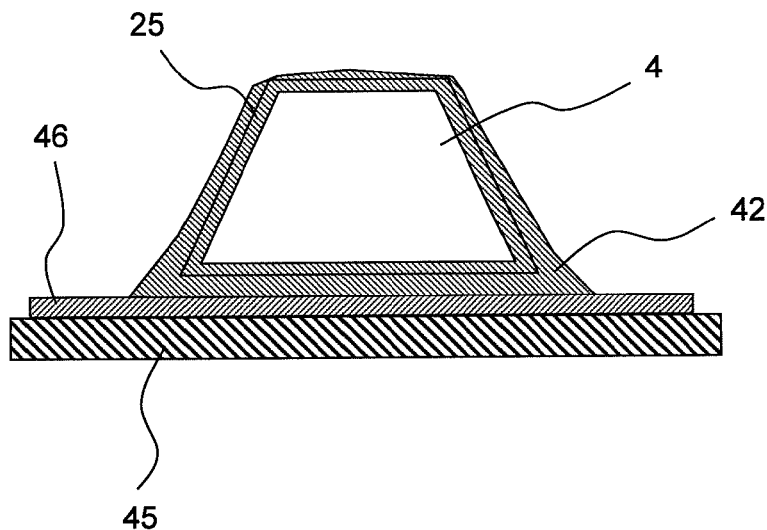
FIG. 20 is a Z-Z' cross-sectional view of FIG. 19.

FIG. 5 is a top view of a lead frame to be used in the method for manufacturing semiconductor device according to the one embodiment of the invention. FIG. 6 is a top view of the lead frame describing the relationship between each portion of the lead frame illustrated in FIG. 5 and a sealing body, a half etch region, a portion to be cut finally, and the like. FIG. 7 is a process block flow chart showing the flow of an assembly step (including a portion of a packaging step) in the method for manufacturing semiconductor device according to the one embodiment of the invention. FIG. 8 is a device cross-section (cross-section X-X' of FIG. 6) process flow chart (during die bonding) corresponding to FIG. 7. FIG. 9 is a device cross-section (cross-section X-X' of FIG. 6) process flow chart (at the time of completion of die bonding) corresponding to FIG. 7. FIG. 10 is a device cross-section (cross-section X-X' of FIG. 6) process flow chart (at the time of completion of wire bonding) corresponding to FIG. 7. FIG. 11 is a device cross-section (cross-section X-X' of FIG. 6) process flow chart (at the time of die clamping in a molding die) corresponding to FIG. 7. FIG. 12 is a device cross-section (cross-section P-P' of FIG. 6) process flow chart (at the time of die clamping in a molding die) corresponding to FIG. 7. FIG. 13 is a device cross-section (cross-section X-X' of FIG. 6) process flow chart (during laser resin removal) corresponding to FIG. 7. FIG. 14 is a lead frame top view corresponding to FIG. 13 (FIG. 13 corresponds to the cross-section X-X', while the cross-section P-P' corresponds to the cross-section P-P' of FIG. 21). FIG. 15 is a device cross-section (cross-section X-X' of FIG. 6) process flow chart (at the time of completion of solder plating) corresponding to FIG. 7. FIG. 16 is a device cross-section (cross-section X-X' of FIG. 6) process flow chart (during laser marking) corresponding to FIG. 7. FIG. 17 is a leadframe lower-surface enlarged view corresponding to the back-surface corner portion R1 of sealing body shown in FIG. 14, for describing a cutting step in FIG. 7. FIG. 18 is a device cross-section (cross-section X-X' of FIG. 6) process flow chart (at the time of completion of the cutting step) corresponding to FIG. 7. FIG. 19 is a device cross-section (cross-section X-X' of FIG. 6) process flow chart (at the time of completion of solder reflow mounting) corresponding to FIG. 7 (actually, a solder layer and a re-solidified solder layer configure a solder fillet while forming no clear boundary therebetween but, the solder plating layer is shown as an independent layer for convenience of description). FIG. 20 is a Z-Z' cross-sectional view of FIG. 19.

First, based on FIGS. 5 and 6, a description will be made of the structure of a leadframe (mainly, a planar structure, particularly an upper surface structure and a minute etching structure and the like are omitted for the convenience of illustration) to be used in the method for manufacturing semiconductor device according to the one embodiment of the present application. A leadframe 12 shown in FIGS. 5 and 6 is in the state just introduced in the assembly step. The leadframe shown here is generally a unit device region (a region, on the lead frame, corresponding to one semiconductor device) and a matrix-state leadframe in which a plurality of unit device regions have been coupled to each other in a matrix form is typically used. Here, a description is however made of only a single unit region to prevent complications.

The material of the lead frame is, for example, a copper-based material containing copper as a principal component and also containing tin, nickel, and the like. It may be a Zr-added copper-based material, an iron-added copper-based material, or any other copper-based material. The lead frame used herein is formed by patterning through etching. Punching may be employed instead, but etching is superior in the miniaturization accuracy and is in addition effective in its combination with half-etching or the like. In addition, etching is more suited also for the processing such as giving inclination to the side surface of the outer lead.

Next, the inside of the unit device region will be described in detail. As illustrated in FIGS. 5 and 6, it has, at the center thereof, the die pad 3 and the suspending lead 9 fixes it to the bumper 7 at the periphery of the die pad. The die pad 3 has, at the periphery thereof, an anti-warp slit 16 to prevent it from warping due to a thermal stress. The suspending lead 9, the inner-lead inner end portion 5i (bonding portion), the periphery of the die pad, and the like in the half-etch portion 15 are half-etched from the back surface side (this half etching is not essential but effective for preventing leads and the like from falling off).

For improving the wire bonding property, a bonding metal layer having, for example, silver as a principal component is formed by plating or the like on the inner end portion 5i on the upper surface of the inner lead inner end 5. The vicinities of the outer end portions of the outer leads 4 are coupled by a tie bar 11 (dam bar). Dash-double dot lines indicate a projection pattern of a punching die 21 for separating the tie bar portion from the sealing body after resin sealing. Likewise, a broken line at each corner indicates a projection pattern of a punching die 22 for separating both the sealing body 2 and the bumper 7 from the surrounding lead frame body 12 (frame portion 12 of the leadframe). At the corners of the leadframe 12, corner openings 17 (usually, one of them is used in practice) to be used upon resin injection are provided. The broken line in a substantially square form in FIG. 6 shows an outer circumference 23 of the resin sealing body (or mold cavity).

In accordance with the process flow 100 shown in FIG. 7, the assembly process (mainly, assembly flow) will next be described in order. First, the semiconductor chip 1 is prepared in a wafer step. When a typical integrated circuit chip is taken as an example, the semiconductor chip 1 has, on the upper surface 1a of the semiconductor chip 1, a plurality of bonding pads 14 (FIG. 4), a peripheral circuit block, and MIS (metal insulator semiconductor) logic & memory circuit blocks. One chip is attached to one unit device region in the example shown here, but a plurality of chips may be attached (fixed). In the description herein, the chip is fixed onto the die pad 3. When a plurality of chips is fixed, they may be fixed directly or indirectly via another chip. In addition, in the example shown here, the die pad 3 is greater than the semiconductor chip 1, but the semiconductor chip 1 may be greater or both may be of substantially the same size. This can also be applied to one of X and Y axes in a horizontal direction. A description will next be made of the cross-section X-X' of FIG. 6 and if necessary, also of the cross-section P-P' of FIG. 6.

When the chip 1 is completed, as illustrated in FIGS. 8 and 9, the chip 1 is die-bonded to each of the unit device regions of the leadframe 12 shown in FIGS. 5 and 6. Described specifically, the back surface 1b of the chip 1 is attached to the upper surface 3a (main surface opposite to the lower surface 3b) of the die pad 3 of the upper surface 12a (main surface opposite to the back surface 12b) of the leadframe 12 via an adhesive layer 8 by using thermal compression bonding (a die bonding step 101 of FIG. 7).

Then, as shown in FIG. 10, a bonding wire (for example, a gold wire) is coupled to between the bonding pad 14 on the device surface 1a of the chip 1 and the inner lead 5 by using ball & wedge bonding (a wire bonding step 102 of FIG. 7).

Figure 21:
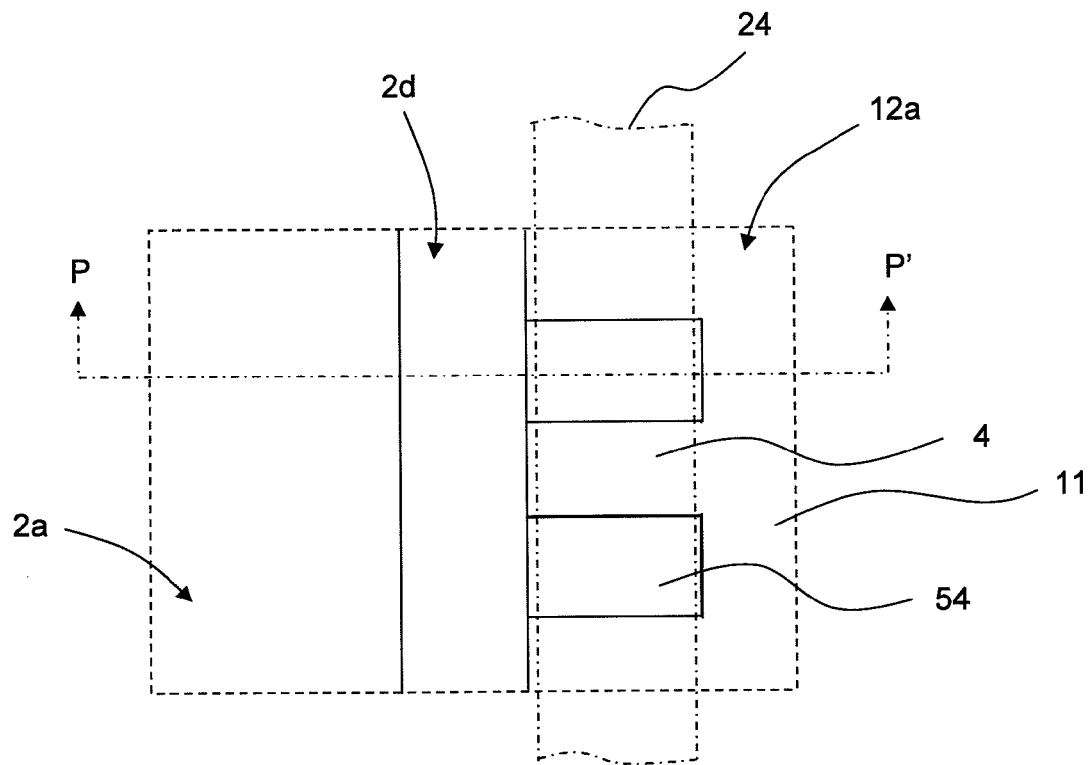
FIG. 21 is a fragmentary enlarged top view (before removal of a lead-to-lead resin protrusion) of the sealing-body peripheral portion R3 shown in FIG. 14.

Next, as shown in FIG. 11 (corresponding to the cross-section X-X' of FIG. 6) and FIG. 12 (corresponding to the cross-section P-P' of FIG. 6), a sealing region 23 (dotted line in FIG. 6) is resin sealed using transfer molding to obtain a resin sealing body 2 (a resin sealing step 103 of FIG. 7). More specifically, as illustrated in FIGS. 11 and 12, the leadframe 12 which has finished wire bonding is set so that the principal portion of the unit device region coincides with a mold cavity 53 between the upper and lower molding dies 51. Next, a sealing resin is injected into the cavity 53. At this time, as is apparent from FIG. 12, the resin exceeds the original boundary of the mold cavity 53 and is filled even between the leads with the dam bar 11 at the top. The resin is cured there and forms a lead-to-lead resin protrusion 54 (FIG. 21). This lead-to-lead resin protrusion 54 is compressed sufficiently after a pressure time (pressurization for sealing) after filling so that it has a firm structure. In this point, it is a little different in properties from a resin burr (so-called flash burr) produced by curing of a resin leaked from a slight space between the lead and the molding die 51 without sealing pressure.

The sealing resin used for sealing is composed mainly of a low-molecular-weight epoxy resin as a principal resin component, about 80 wt % of a silica-based filler, and the like and has a halogen-free configuration (a halogen-based flame retardant may be added when addition of it does not environmentally cause a problem) as a whole.

The leadframe 12 (more precisely, a sealing-body leadframe composite including the sealing body 2) taken out from the molding die 51 is subjected to a gate/runner break treatment (for separating an unnecessary resin of the gate portion and the runner portion from the sealing body 2 and the leadframe 12). Then, the resin sealing body 2 is subjected to a resin curing treatment.

At this time, the outer lead 4 around the side surface 2d of the sealing body 2 in each unit device region of the leadframe 12 has thereon a thin resin burr made of a sealing resin leaked from the space of the molding die 51 (thinner than the lead-to-lead resin protrusion 54).

As shown in FIG. 13, a laser light 61 is irradiated to the lead-to-lead resin protrusion 54 formed in an outer lead-to-outer lead opening 10 of the lead frame 12 by means of a resin-removal laser beam delivery head 62 to remove the lead-to-lead resin protrusion 54 (a laser resin removal step 104 in FIG. 7). At this time, as shown in FIG. 14 (FIG. 13 is the cross-section X-X' of it), the same laser light 61 may be irradiated to the resin burr on the upper surface of the outer lead 4 to remove the resin burr almost simultaneously (this acts to enhance the effects of the electrolysis and water jet to be conducted later). This enables to irradiate a laser light to the entirety of a circular laser irradiation region 24 surrounded with the circumference of the resin sealing body 2 and a substantially square broken line as shown in FIG. 14, facilitating the control of an irradiation apparatus and improving the processing rate. Thus, simultaneous removal of the resin burr (a minute resin piece leaked from the cavity) on the upper surface of the outer lead 4 is effective for simplifying a scanning operation and in addition, improving the delivery of a solder to the upper surface upon mounting.

The laser used here is, for example, a YAG laser (such as Nd: YAG) and a laser light 61 has a fundamental wavelength of 1064 nm. It is a near infrared light and is used for removing a resin thermally. Even if a near infrared light is irradiated to the package body in a somewhat offset manner, it will cause no great damage to the package body. On the contrary, it has the effect of relieving the strain of the package if the amount thereof is small. The laser output is, for example, about 40 W and a pulse frequency is 20 kHz or so. The light is adjusted to be focused on the resin surface to be removed. The laser line width and the laser spacing are each, for example, about 40 micrometers and the scanning speed is, for example, about 300 mm/sec. The number of times of irradiation is, for example, about three times (three rounds around the sealing body 2). The reason for using a near infrared light is that the sealing resin is a composition composed of many substances and it is efficient to remove a target substance as a whole with selectivity-free thermal action. It is presumed that the lead-to-lead resin protrusion 54 becomes a resin burr as a result of radiation of the laser light and that the resin burrs can be removed efficiently by subsequent means effective for removing resin burrs such as electrolysis or water jet treatment (such subsequent steps are however not always essential).

As the wavelength of the laser light 61, a wavelength of 532 nm in the visible light region or a wavelength of 355 nm in the ultraviolet region is usable insofar as the same YAG laser is used. When a carbon dioxide gas laser is used, it is possible to utilize a wavelength of 10.6 micrometers (intermediate infrared region). The light of the intermediate infrared region is disadvantageous from the standpoint of energy so that power and treatment time must be taken into consideration. The light of the visible light region or ultraviolet light region costs high from the standpoint of power because it is harmonic. Besides, since the light itself has high energy, it removes resin effectively, but there is a possibility of it damaging the main body of the package. It is therefore important to manage the irradiation position accuracy.

At the time of completion of this laser resin removal step 104 (FIG. 7), a small amount of a residual resin (lead-to-lead resin protrusion 54 which has remained without being removed completely) may be present on the side surface of the outer lead 4 around the side surface 2d of the sealing body 2 of the leadframe 12. On the other hand, the thin resin burr becomes thin but is sometimes not removed completely. At this stage, hydraulic deburring or simple water washing or the like (including chemical washing) may be conducted, followed by a subsequent solder plating step 106 (FIG. 7).

However, for ensuring a still higher mounting reliability, it is preferred to perform an electrolytic deburring treatment. In the electrolytic deburring treatment, electrolysis of water is conducted in an electrolytic aqueous solution having soda ash (mainly anhydrous sodium carbonate) or the like dissolved therein, with the lead frame 12 as a cathode (for example, at a solution temperature of about 50° C., a treatment time of about 15 minutes, and a current density of about 10 A/dm2). In this treatment, hydrogen gas bubbles are produced between the outer leads 4 and the residual resin or the resin burr (they will hereinafter be called "residual resin piece", collectively), and with the power of the bubbles, the residual resin piece can be lifted off. At this stage, simple water washing or the like (including chemical washing) may be conducted, followed by the solder plating step 106 (FIG. 7).

Figure 22:
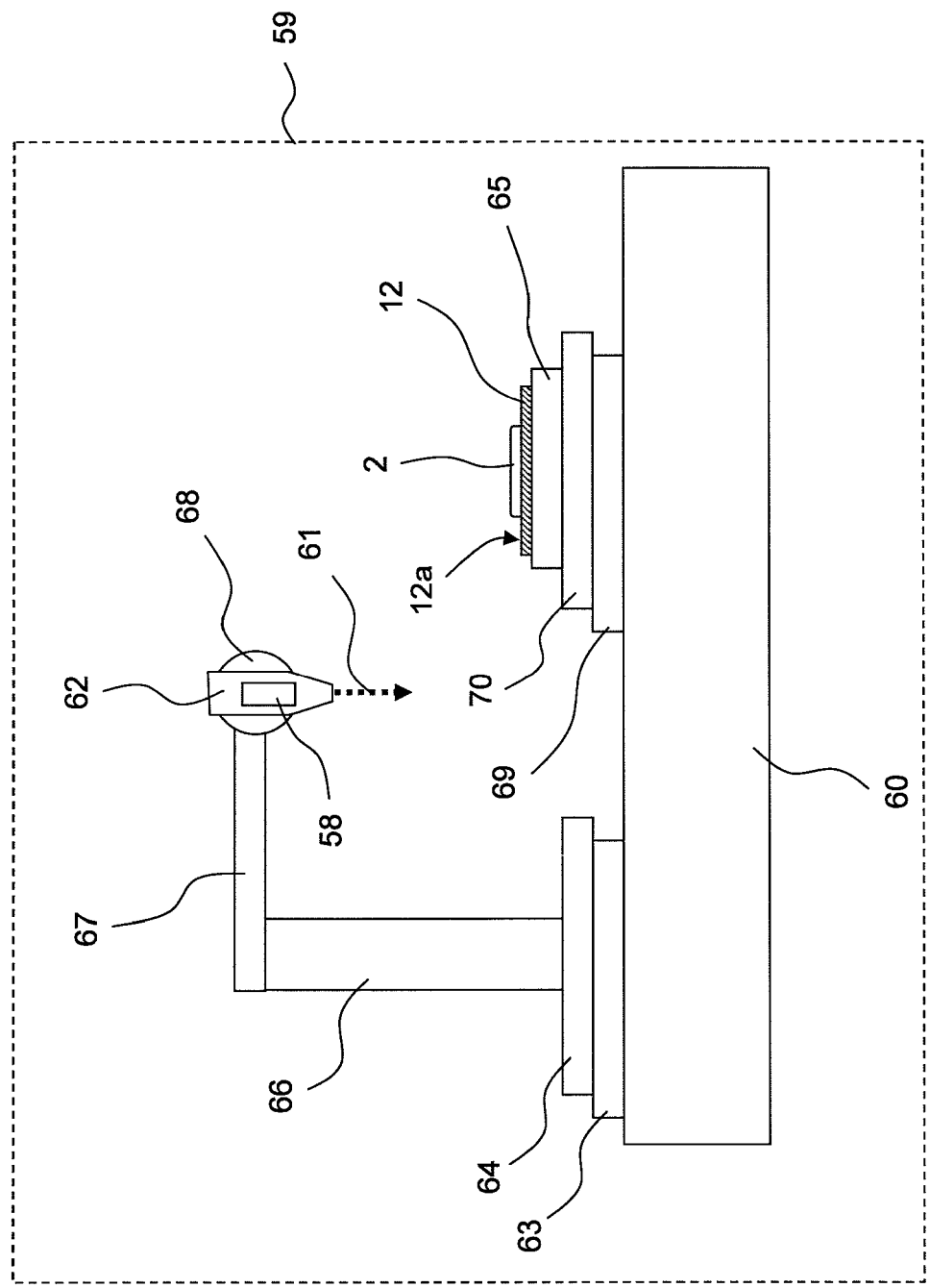
FIG. 22 is a schematic front view of a laser irradiation apparatus to be used in a laser resin removal step in the method for manufacturing semiconductor device according to the one embodiment of the invention.

In order to ensure a still higher mounting reliability, however, it is preferred to conduct a hydraulic deburring treatment 105 (FIG. 7). The hydraulic deburring treatment 105 is a final treatment for removal of the residual resin piece by, as shown in FIG. 22, feeding a liquid jet such as high-pressure washing water or washing liquid from a nozzle to the leadframe 12 (at this time, a liquid honing treatment may be performed with the washing water or liquid added with particles, or chemical treatment or blasting treatment may be performed instead of or in combination with the hydraulic deburring treatment).

As a result of the above treatments, the surface and the side surface of the outer lead 4 around the side surface 2d of the sealing body 2 of the leadframe 12 are clean. As shown in FIG. 15, the solder plating treatment 106 (surface treatment for improving the mounting performance, the solder plating step 106 of FIG. 7)) is carried out by electroplating or the like in an acidic tin (bismuth) plating solution (an alkaline plating solution may be used, but an acidic plating solution is advantageous because it provides high-purity plating). Non-electrolytic plating or solder dipping may also be employed, but electroplating is suited from the standpoint of economy and reliability. A tin-based lead-free solder or the like composed of, for example, 2% bismuth and the balance tin (melting point: 217° C.) is suited as the material of a solder layer 25 (a lead-based solder is also usable if using it does not environmentally cause a problem). Examples of other lead-free solders include tin-silver-based solder, tin-bismuth-silver-copper-based solder, and tin-bismuth-silver-antimony-based solder.

As illustrated in FIG. 16, a laser marking step 107 (FIG. 7) is performed for mainly the upper surface 2a of the resin sealing body 2 by using a marking laser light (laser beam) 71 from a marking laser beam delivery head 72. The laser light used here may be the same as the resin removal laser light, but as its output, that weaker than the resin removal laser light, for example, about 7 W is sufficient (a laser light having an equal power to that of a resin removal laser beam may destroy the underlying resin layer on the chip 1). The YAG laser may be replaced with a carbon dioxide gas laser or the like.

Next, as shown in FIG. 6 and FIG. 17, the lead frame 12 is cut from below by using a punching die 21 along the cutting surface 21 corresponding to the outer end portion of the lead 4 to separate the sealing body 2 from the tie bar 11. Subsequently, the remaining coupled portion is cut off by using a punching die 22, thereby separating the sealing body 2 (device) from the leadframe body 12 (frame portion 12c) (a cutting and separating step 108 in FIG. 7).

As described above, by cutting the outer end portion of the outer lead 4 from below by using the punching die 21, the solder layer on the lower surface of the lead 4 moves to the lead tip face and forms a lead tip face solder region (physically, the lower surface itself flows and becomes a lower half portion of the lead tip face). Thus, the solder layer (solder region) 25 are formed on the upper and lower surfaces, both side surfaces, and tip face of the outer lead 4, so when solder reflow mounting is performed on a land 46 on a wiring substrate 45 (a mounting step 109 in FIG. 7), a solder fillet 42 including the tip end portion of the outer lead 4 is formed in a normal manner as shown in FIGS. 19 and 20. In addition, since the cross-section of the outer lead 4 has an almost erected and substantially trapezoidal shape, the solder smoothly climbs the upper surface of the outer lead 4 and as a result, a firm solder fillet 42 (or re-solidified solder layer) is formed.

3. Detailed description on a resin removal step which is a principal process in the method for manufacturing semiconductor device according to the one embodiment of the application (mainly from FIG. 21 to FIG. 31)

In this section, a description will be made of the details of the laser resin removal step 104 (FIG. 7) described in Section 2 and an outer lead structure enabling efficient execution of the step.

Figure 23:
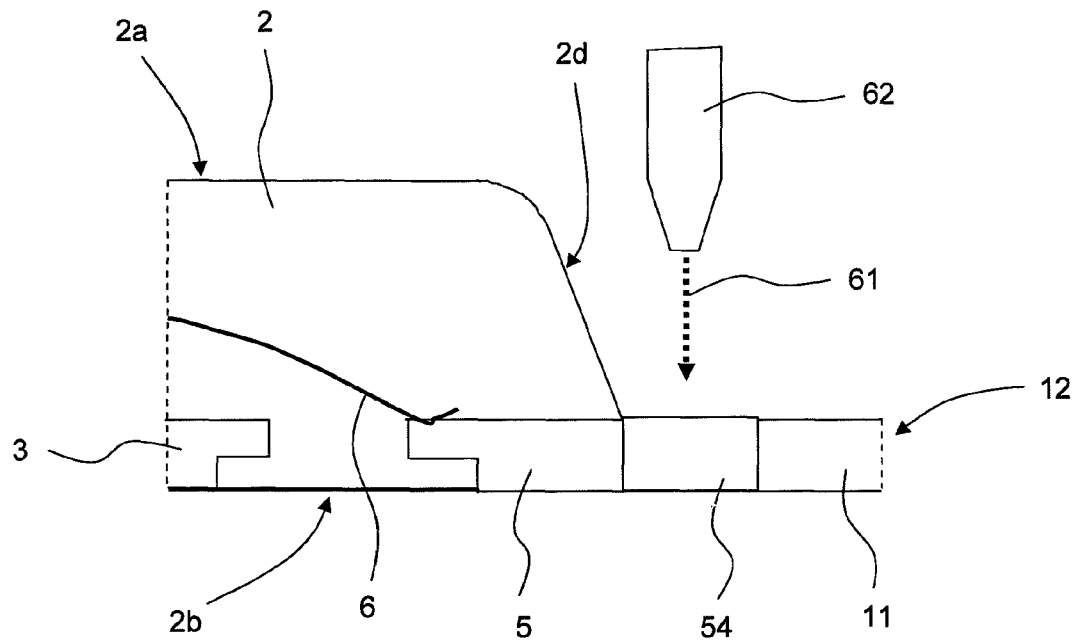
FIG. 23 is a fragmentary enlarged cross-sectional view of the sealing body peripheral portion corresponding to the cross-section P-P' of FIG. 21 (before removal of the lead-to-lead resin protrusion or just after the removal is started).
Figure 24:
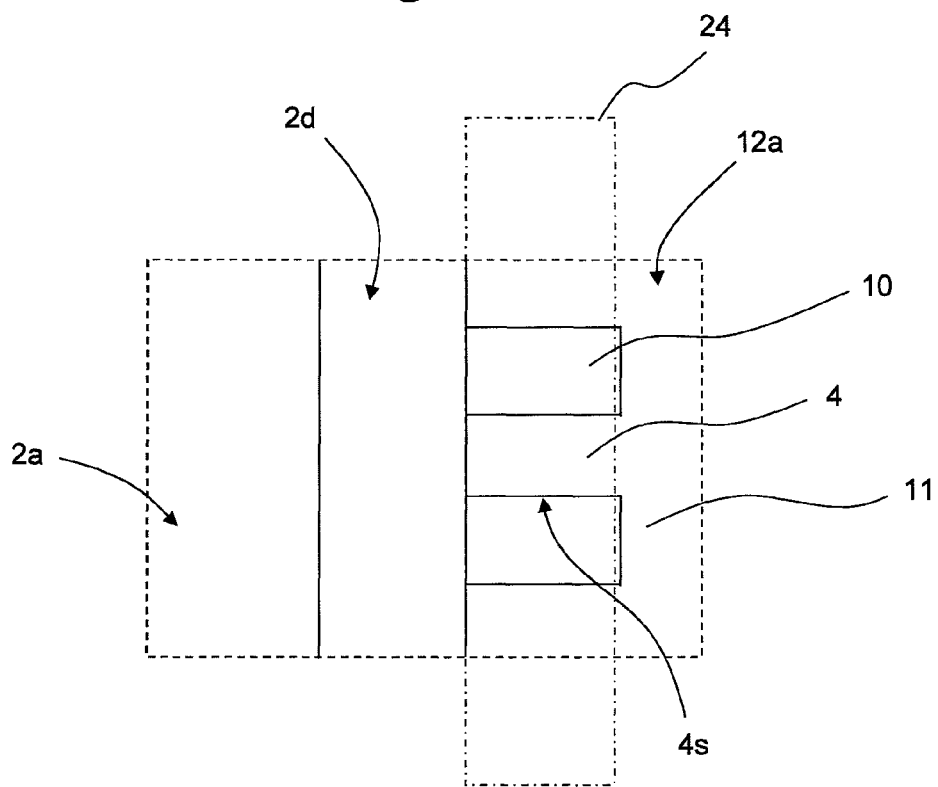
FIG. 24 is a fragmentary enlarged top view of the sealing body peripheral portion R3 shown in FIG. 14 (after removal of the lead-to-lead resin protrusion or just before completion of the removal).
Figure 25:
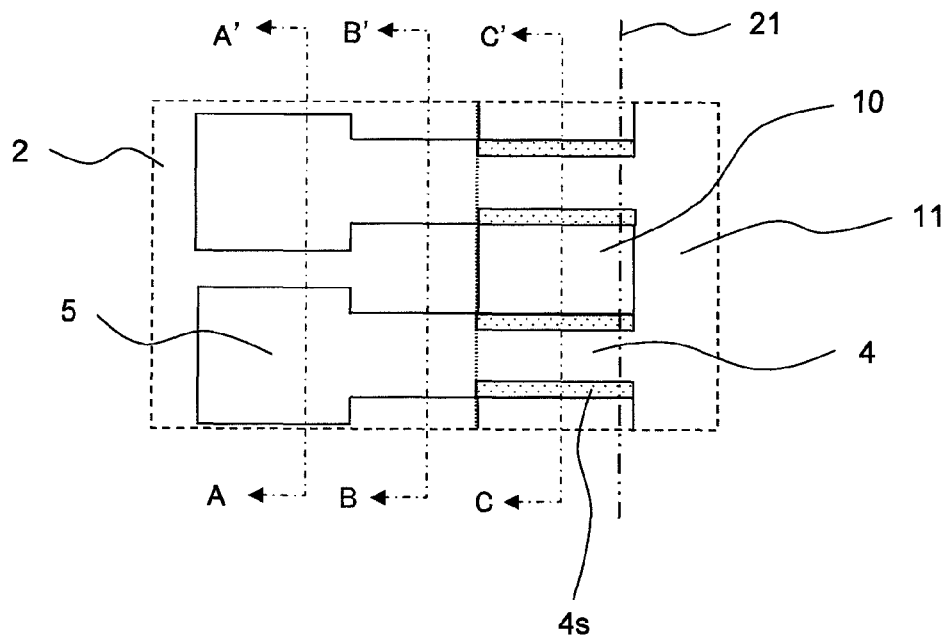
FIG. 25 is a fragmentary enlarged top view of the sealing body peripheral portion for describing the detailed cross-sectional structure of an outer lead and an inner lead in the method for manufacturing semiconductor device according to the one embodiment of the invention (after removal of the lead-to-lead resin protrusion or just before completion of the removal).
Figure 26:
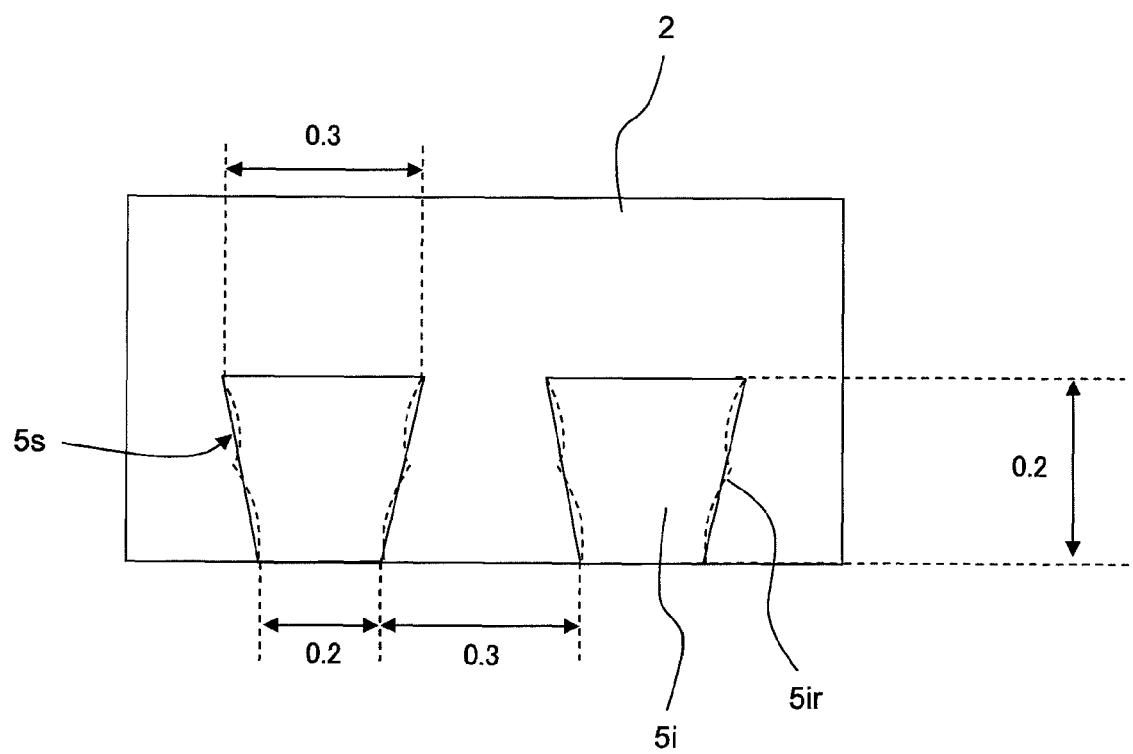
FIG. 26 is a cross-sectional view of the inner lead corresponding to the cross-section A-A' (inner end portion of the inner lead) shown in FIG. 25.
Figure 27:
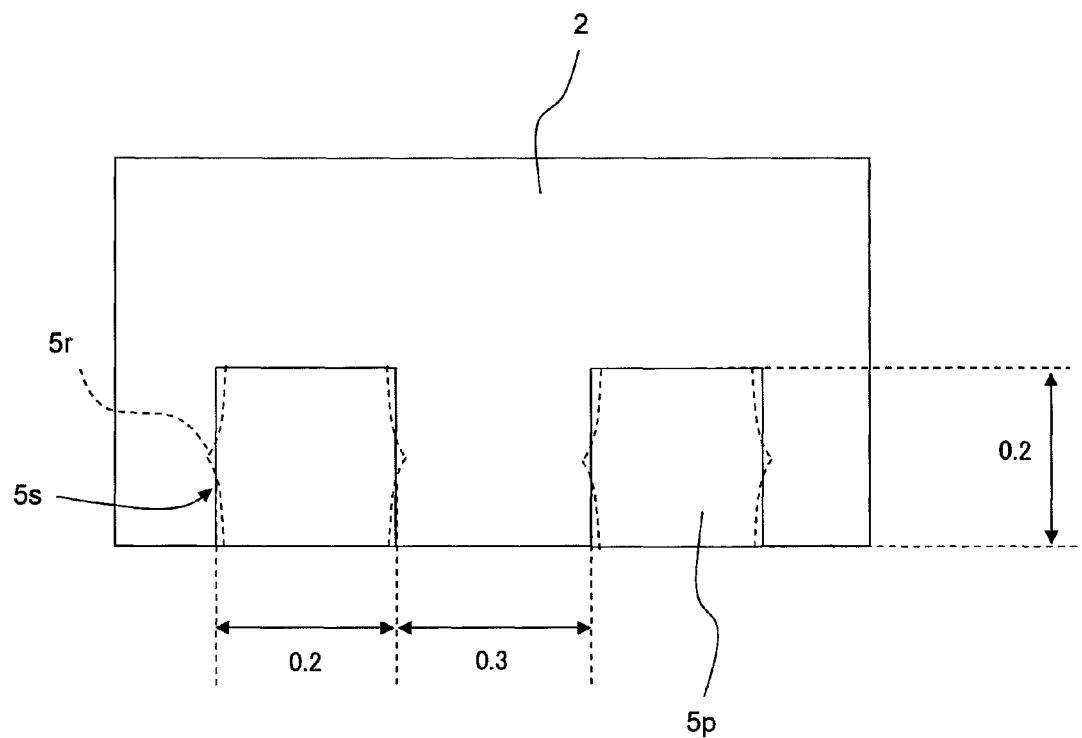
FIG. 27 is a cross-sectional view of the inner lead corresponding to the cross-section B-B' (main portion of the inner lead) shown in FIG. 25.
Figure 28:
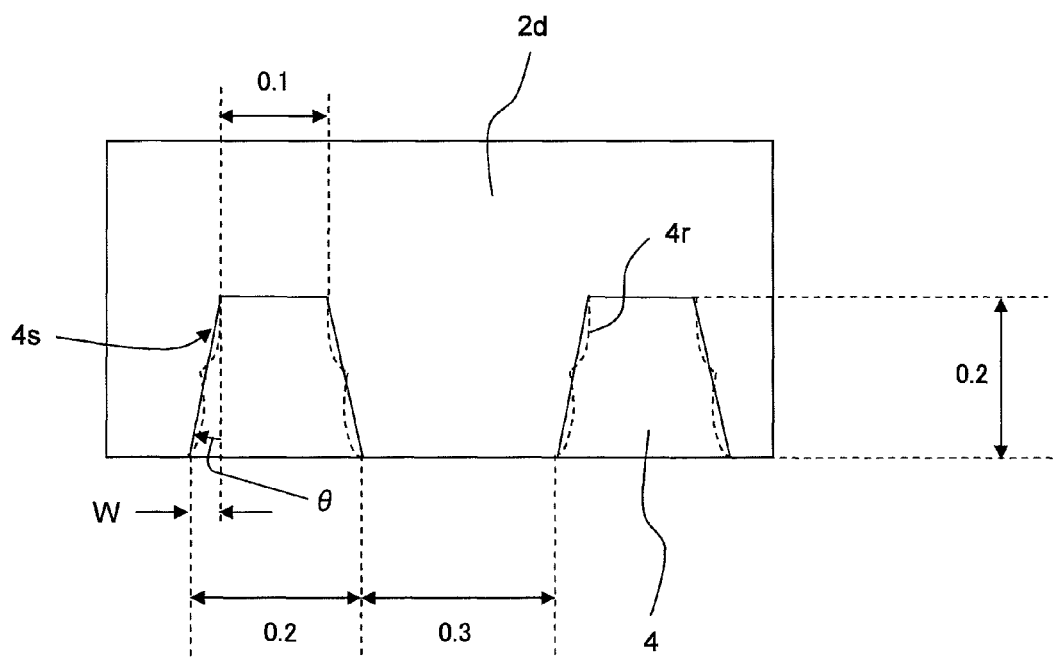
FIG. 28 is a cross-sectional view (with a resin sealing body on the background) of the outer lead corresponding to the cross-section C-C' (outer lead) of FIG. 25.
Figure 29:
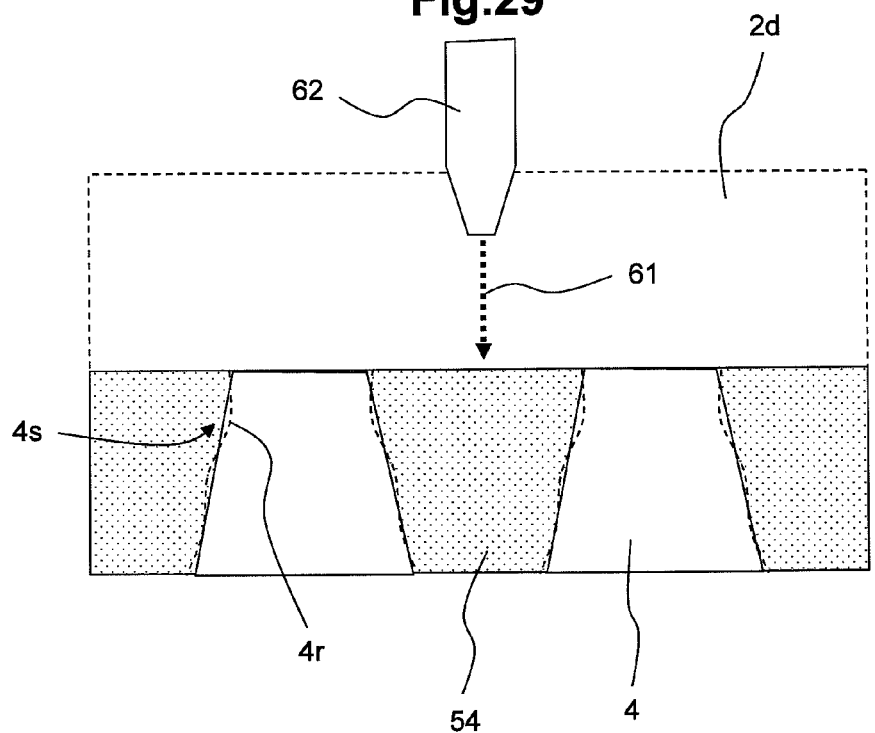
FIG. 29 is a cross-sectional view of the outer lead corresponding to the cross-section C-C' (outer lead) of FIG. 25 (for describing the initial stage of the removal of the lead-to-lead resin protrusion).
Figure 30:
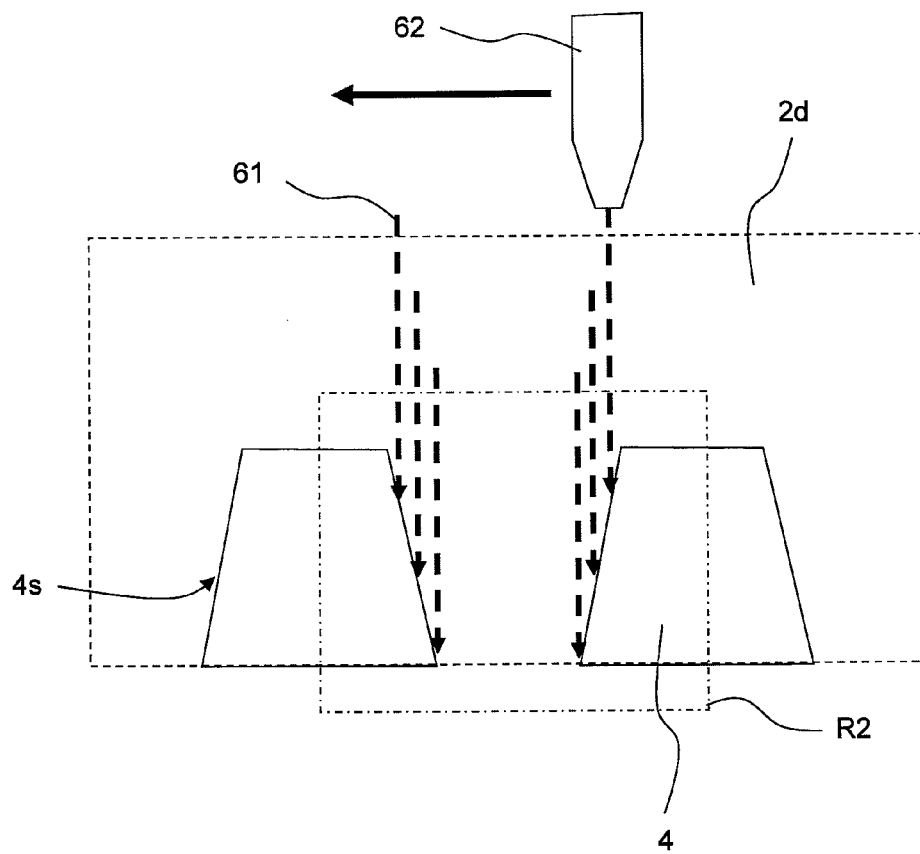
FIG. 30 is a cross-sectional view of the outer lead corresponding to the cross-section C-C' (outer lead) of FIG. 25 (for describing the final stage of the removal of the lead-to-lead resin protrusion).
Figure 31:
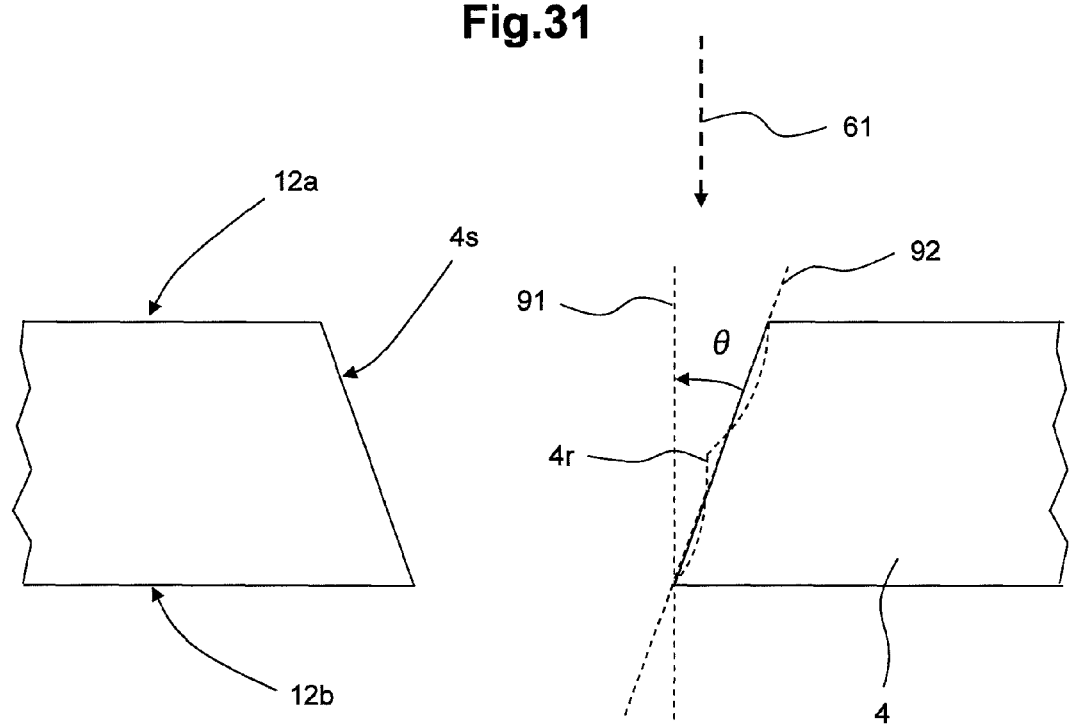
FIG. 31 is a cross-sectional view of the outer lead for describing a residual resin removal mechanism in the outer lead-to-outer lead region R2 of FIG. 30.
Figure 32:
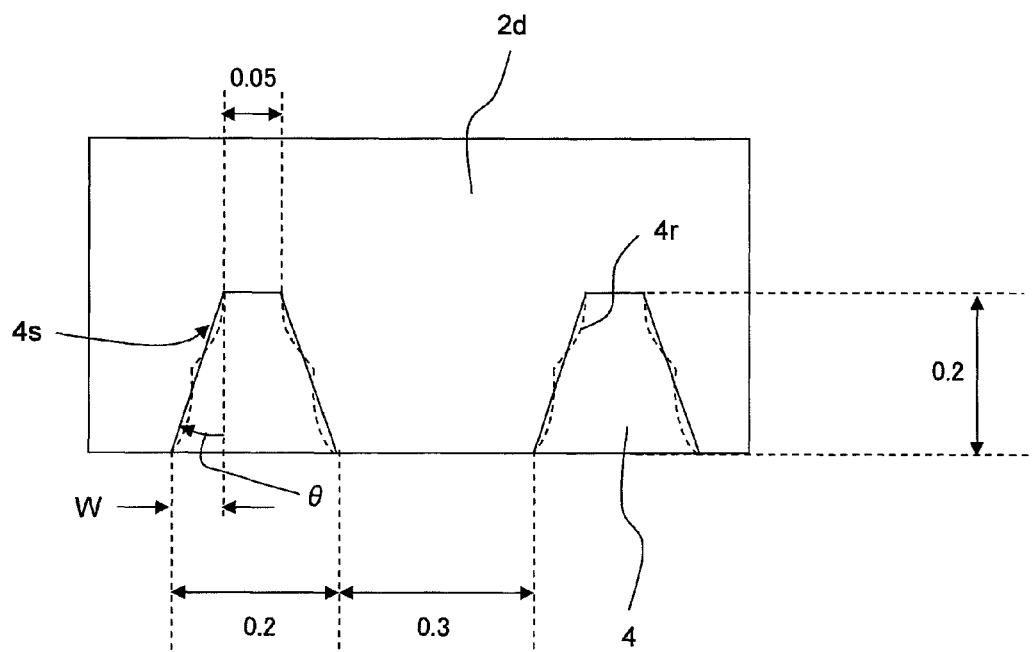
FIG. 32 shows a modification example of the outer lead corresponding to the cross-section C-C' (outer lead) of FIG. 25 (modification example of FIG. 28).

FIG. 21 is a fragmentary enlarged top view (before removal of a lead-to-lead resin protrusion) of the sealing-body peripheral portion R3 shown in FIG. 14. FIG. 22 is a schematic front view of a laser irradiation apparatus to be used in a laser resin removal step in the method for manufacturing semiconductor device according to the one embodiment of the invention. FIG. 23 is a fragmentary enlarged cross-sectional view of the sealing body peripheral portion corresponding to the cross-section P-P' of FIG. 21 (before removal of the lead-to-lead resin protrusion or just after the removal is started). FIG. 24 is a fragmentary enlarged top view of the sealing body peripheral portion R3 shown in FIG. 14 (after removal of the lead-to-lead resin protrusion or just before completion of the removal). FIG. 25 is a fragmentary enlarged top view of the sealing body peripheral portion for describing the detailed cross-sectional structure of an outer lead and an inner lead in the method for manufacturing semiconductor device according to the one embodiment of the invention (after removal of the lead-to-lead resin protrusion or just before completion of the removal). FIG. 26 is a cross-sectional view of the inner lead corresponding to the cross-section A-A' (inner end portion of the inner lead) shown in FIG. 25. FIG. 27 is a cross-sectional view of the inner lead corresponding to the cross-section B-B' (main portion of the inner lead) shown in FIG. 25. FIG. 28 is a cross-sectional view (with a resin sealing body on the background) of the outer lead corresponding to the cross-section C-C' (outer lead) of FIG. 25. FIG. 29 is a cross-sectional view of the outer lead corresponding to the cross-section C-C' (outer lead) of FIG. 25 (for describing the initial stage of the removal of the lead-to-lead resin protrusion). FIG. 30 is a cross-sectional view of the outer lead corresponding to the cross-section C-C' (outer lead) of FIG. 25 (for describing the final stage of the removal of the lead-to-lead resin protrusion). FIG. 31 is a cross-sectional view of the outer lead for describing a residual resin removal mechanism in the outer lead-to-outer lead region R2 of FIG. 30. FIG. 32 shows a modification example of the outer lead corresponding to the cross-section C-C' (outer lead) of FIG. 25 (modification example of FIG. 28).

First, the basic structure of a laser irradiation apparatus 59 to be used in the laser resin removal step 104 (FIG. 7) is described. As illustrated in FIG. 22, a laser X-table 63 and a laser Y-table (which will be called "laser XY tables", collectively) 64 are placed on a laser apparatus base 60 and a Z moving mechanism 66 is placed on these tables. A horizontally rotating φ moving mechanism 67 (horizontally rotating arm) is attached to the top of it. This horizontally rotating arm 67 has at the tip thereof a resin removal laser beam delivery head 62 (laser gun) retained through a θ moving mechanism 68 (a mechanism capable of changing the gradient relative to verticality) while directing a laser beam 61 to a vertically and directly downward direction. On another place on the laser apparatus base 60, an object-placing X-table 69 and an object-placing Y-table 70 (which will be called "object-placing XY tables", collectively). On these tables, a θ table 65 (which is a table capable of inclining an upper surface 12a or lower surface 12b of the leadframe 12 from a horizontal plane and in the embodiment described above in Section 2, this table is set horizontally. Incidentally, in the following sections, this table is set horizontally unless otherwise specified) is fixed. On this θ table 65, the leadframe 12 which is an object is retained with the upper surface 12a up. In this apparatus, a portion to be laser scanned is positioned after the outer circumference of the resin sealing body 2 is recognized by means of a location aware optical system 58 attached to the laser beam delivery head 62.

In the embodiment shown here, laser beam scanning is performed upon laser irradiation by horizontally holding the θ table 65 (the leadframe 12 is held horizontally with the upper surface thereof up), stopping the object-placing XY table, and moving the laser XY tables and the like, because such an operation simplifies the configuration and control of the apparatus. The laser XY tables however often have a laser transmitter so that the object-placing XY tables and the laser XY tables may be in charge of horizontal move and angle adjustment, respectively.

It is also possible to adjust the laser irradiation angle θ on the side of the leadframe 12 by inclining the table 65 and irradiating the laser beam 61 itself perpendicularly.

Next, details of the laser resin removal step 104 (FIG. 7) described in Section 2 will be described based on FIGS. 21 to 24. As shown in FIG. 21 (with regard to the entire view, refer to FIG. 14) and FIG. 23, when the lead-to-lead resin protrusion 54 is removed by irradiating the laser beam 61 from the resin removal laser beam delivery head 62 in the laser irradiation region 24, the outer lead-to-outer lead opening 10 appears again in a relatively early stage. At this stage, a resin member has remained on the outer lead side surface 4s. Here, the laser beam 61 is irradiated again to almost completely remove the residual resin member 54. In order to efficiently remove this residual resin member 54, it is effective to form a section (cross-section) of the outer lead 4 perpendicular to the longitudinal direction thereof as an almost erected and substantially trapezoidal shape as shown in FIGS. 25 and 28.

First, a description will be made of details of the cross-sectional structure of the lead portions (outer lead 4 and inner lead 5) of the leadframe 12 in the one embodiment of the present application described in Section 2. FIG. 25 is an enlarged top view of a region almost similar to the sealing body peripheral portion R3 of FIG. 14. The A-A' cross-section of this diagram is shown in FIG. 26 (an example of the dimension is shown in this diagram and the dimension is indicated by mm, which will equally apply to FIGS. 27 and 28). FIG. 26 shows that the inner-lead inner end portion 5i (bonding portion) has a cross-sectional view which has an almost inverted and substantially trapezoidal shape. When the leadframe 12 is patterned using wet etching, however, an actual shape Sir of the side surface of the inner lead inner end portion is curved as indicated by a broken line. In addition, from the B-B' cross-section of FIG. 25 shown in FIG. 27, it is apparent that the inner lead main portion 5p has almost a quadrangular cross-section. Also in this case, when the leadframe 12 is formed by patterning using wet etching, the actual shape 5r of the side surface of the inner lead main portion is curved as indicated by a broken line. On the other hand, it is apparent from the cross-section C-C' of FIG. 25 shown in FIG. 28 that the outer lead 4 has an almost erected and substantially trapezoidal cross-section. Also in this case, when the leadframe 12 is formed by patterning through wet etching, the actual shape 4r of the outer-lead side surface is curved (having a small prominence at the center) as indicated by a broken line. Supposing a flared amount W is about 50 micrometers, the outer-lead side-surface inclination angle θ is about 14 degrees. Thus, the outer lead 4 having an almost erected and substantially trapezoidal cross-section facilitates climbing of a solder at the time of solder reflow mounting and has an effect of accelerating good formation of a solder fillet reaching the upper surface of the outer lead 4. In addition, the shape of the outer lead described above is also effective for releasing the stress upon mounting.

The cross-section C-C' of FIG. 25 in the initial stage of the laser resin removal step 104 (FIG. 7) is shown in FIG. 29. In this stage, the lead-to-lead resin protrusion 54 rapidly disappears and a relatively thin resin layer or dispersive resin piece has remained on the outer-lead side surface 4s. In this state, as shown in FIG. 30, the outer lead 4 has an almost erected and substantially trapezoidal cross-section so that even if scanning irradiation of the laser beam 61 is applied perpendicularly, the laser beam is irradiated almost equally to the entire side surface, leading to a marked improvement in the efficiency of removing the residual resin member. Incidentally, as shown in FIGS. 28 and 29, it is possible to irradiate laser to all the side surfaces of the outer lead 4 formed by wet etching when the width of one of the surfaces of the outer lead 4 (surface on the side exposed to laser and in this embodiment, the upper surface) is made smaller than the width of the other surface (the lower surface in the present embodiment). Moreover, by patterning the leadframe 12 through wet etching so as to make the width of one of the surfaces (upper surface) smaller than half of the width of the other surface (lower surface) as shown in FIG. 32, it is possible to irradiate laser to all the side surfaces of the outer lead 4 more reliably. In the example shown in FIG. 32, the width of the upper surface of the outer lead 4 in FIG. 28 is decreased to about 0.05 mm. In this example, the flared amount W is about 0.075 mm and the inclination angle θ is about 20.6 degrees.

The outer lead-to-outer lead region R2 shown in FIG. 30 is enlarged in FIG. 31. Here, the angle formed between a line 91 (a perpendicular line in this example) parallel to the laser beam and a plane 92 (statistically, a regression plane of an actual curve) substantially parallel to the side surface of the outer lead (of the cross-section C-C' of FIG. 25) (that is, an angle between the line 91 parallel to the laser beam 61 and an orthogonal projection to the side surface of the outer lead) is designated as an inclination angle θ. This inclination angle θ is a slope angle of the outer-lead side surface 4s from the perpendicular plane when as in the embodiment described above, the laser beam 61 is irradiated almost perpendicularly from the upper surface 12a of the leadframe 12. In the embodiment described above, the outer-lead side-surface inclination angle θ is set at, for example, about 14 degrees. In this case, supposing that the light intensity when the laser beam 61 is perpendicularly incident to a target surface (outer-lead side surface 4s) is 1 (reference light intensity), the light intensity is about 0.25 so that practically usable intensity can be secured. The preferable lower limit of the outer-lead side-surface inclination angle θ is, for example, about 6 degrees in order to secure light intensity corresponding to 10% or more of the reference light intensity. The preferable upper limit of the outer-lead side-surface inclination angle θ is about 30 degrees under typical conditions due to limitations in the pitch, thickness, and width of the outer lead 4.

However, the lower limit of the outer-lead side-surface inclination angle θ is preferably about 10 (roughly, the light intensity becomes about twice as much as that when the angle is 6 degrees) from the standpoint of mass production. On the other hand, the upper limit of the outer-lead side-surface inclination angle θ is preferably about 25 degrees from the standpoint of mass production when narrowing and reliability of a lead pitch are taken into consideration (further, the upper limit of the outer-lead side-surface inclination angle θ is particularly preferably about 20 in consideration of the efficiency of mass production).

4. Consideration on the embodiments described above (including embodiments described later) and description on various modification examples In the embodiment (main embodiment) described in Sections 2 and 3, an example of irradiating a laser beam downwardly and almost perpendicularly to the upper surface or lower surface of the leadframe while keeping it almost horizontal (perpendicular irradiation system) is shown because it is most practical judging from the present state of the laser irradiation apparatuses. Described specifically, an inclination of the outer lead enables a horizontal operation which facilitates control of XY tables and the like. In addition, due to a perpendicular irradiation of a laser beam, it is not necessary to change the direction of the laser beam during irradiation and a scanning efficiency is excellent. Since the laser beam is irradiated downward from above the leadframe, a conventional general apparatus can be utilized. The irradiation of a laser beam from the upper side of the leadframe is advantageous because it facilitates recognition of the end portion of the sealing body.

When, for example, an apparatus capable of irradiating a laser beam from below the leadframe is used, however, the outer lead having an inverted and substantially trapezoidal cross-section can be treated similarly to the main embodiment.

Irrespective of whether the inclination angle is provided on the outer-lead side surface or not, the laser beam may be made incident directly to the outer-lead side surface by inclining the direction of a laser beam from a perpendicular direction (non-perpendicular irradiation system). In the non-perpendicular irradiation system, it is effective to carry out, for example when scanning is performed three times, first irradiation perpendicularly and second and third irradiations with a laser beam inclined on the opposite sides to each other so as to efficiently remove the initial firm resin piece and so as to make the laser beam directly incident on both side surfaces of the outer lead.

The upper limit of the inclination angle θ of the laser beam to the outer-lead side surface laser in the non-perpendicular irradiation system, that is, the upper limit of the outer-lead side-surface laser beam inclination angle is theoretically about 120 degrees when the upper limit of the outer-lead side-surface inclination angle θ described above is taken into consideration. The inclination angle exceeding 90 degrees however decreases the irradiation efficiency (irradiation at an acute angle is practically effective) so that the upper limit is preferably about 100 degrees from the standpoint of practical usefulness. When mass productivity is taken into account, the preferable upper limit is, for example, about 60 degrees. The lower limit of the outer-lead side-surface laser beam inclination angle is, on the other hand, equal to the outer-lead side-surface inclination angle described above.

In the non-perpendicular irradiation system, when the outer lead has an almost perpendicular side surface, the upper surface and the lower surface of the outer lead can be made to have an almost equal width, making it possible to keep the rigidity of the outer lead high.

An example of the inner lead 5 having partially an inverted trapezoidal shape was shown above. Irrespective of whether the irradiation system is a perpendicular irradiation system or a non-perpendicular irradiation system, the inner lead 5 may have a quadrangular cross-section over the whole length thereof when it has no problem in the adhesion with the resin.

Incidentally, the description in this section will almost equally apply to the sections described below.

5. Description on the Technical Problems in the Afore-Mentioned Embodiments in the Present Application The present inventors have revealed that the processes described in from Section 1 to Section 4 have the following problems. Described specifically, when a laser light is irradiated to leads (primary laser irradiation), metal foreign matters (elements) scatter around from the leads. The metal foreign matters thus scattered attach to the surface (end portion) of the resin exposed by the lead-lead resin protrusion removal step (the dam resin removal step 104 in FIG. 7). This means that by carrying out the lead-to-lead resin protrusion removal step (the dam resin removal step 104 in FIG. 7), metal foreign matters thus scattered attach to the surrounding resin surface in the vicinity of a portion removed in this removal step. When the plating step 106 (FIG. 7) is performed in such a state, a metal film (plating layer) 25 is formed also on the metal foreign matters which have attached to the resin surface and causes shorting between two adjacent outer leads. Incidentally, another reason for the formation of the metal film (plating layer) 25 (FIG. 15) on the resin surface is that concentration of an electric field to the end portion easily occurs so that even when an amount of the metal foreign matters which have attached to the resin surface (end portion) is small (thin), the metal film 25 is formed inevitably in the plating step.

In the example using an outer lead with an equilateral trapezoidal cross-section among the examples described in Section 3, a projection cross-sectional area of a laser beam to the lead side surface becomes large, which is presumed to increase scattering of leadframe constituent metals. This phenomenon occurs not only when an outer lead with an equilateral trapezoidal cross-section is used but commonly occurs when a laser beam is obliquely irradiated to the side surface of the outer lead.

Also in the case where the outer lead has a quadrangular cross-section and a laser beam is perpendicularly irradiated to the main surface (upper main surface or lower main surface) of the leadframe, scattering of a lead member due to primary laser irradiation still remains as a problem because in order to remove the resin attached to the side surface of the outer lead, it is necessary to irradiate the laser beam so as to stride over the outer lead-to-outer lead opening 10, the lead-to-lead resin protrusion 54 and the outer lead 4 therearound (FIG. 39), or the tie bar 11.

Figure 44:
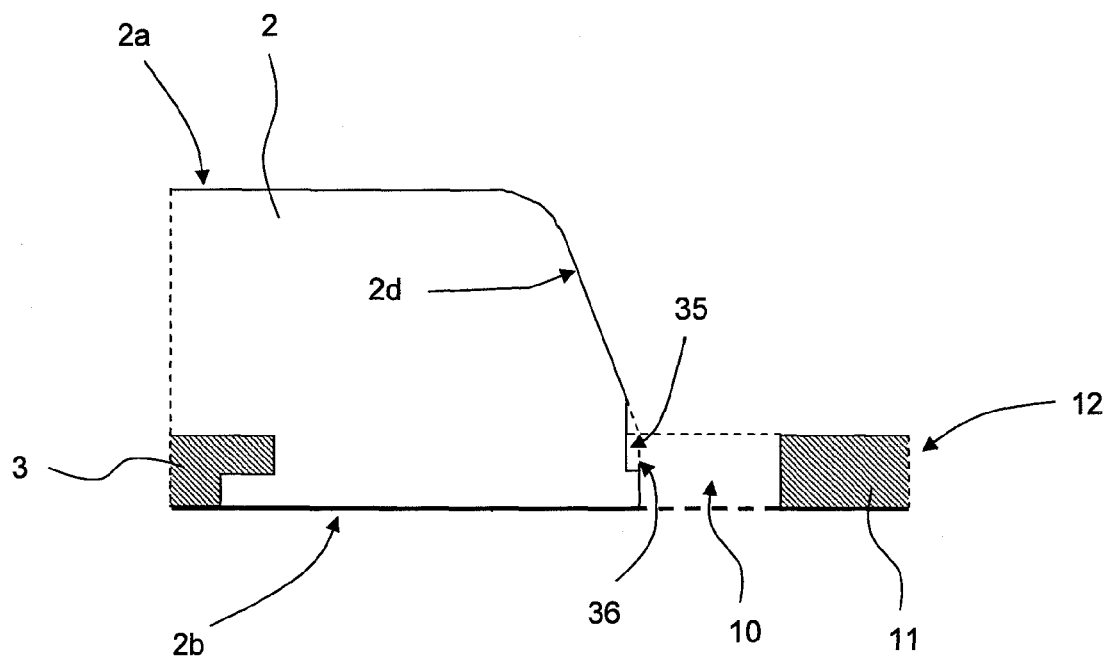
FIG. 44 is a fragmentary enlarged cross-sectional view (at the time of completion of secondary laser beam irradiation) of the sealing body peripheral portion corresponding to the cross-section P-P' of FIG. 43.
Figure 57:
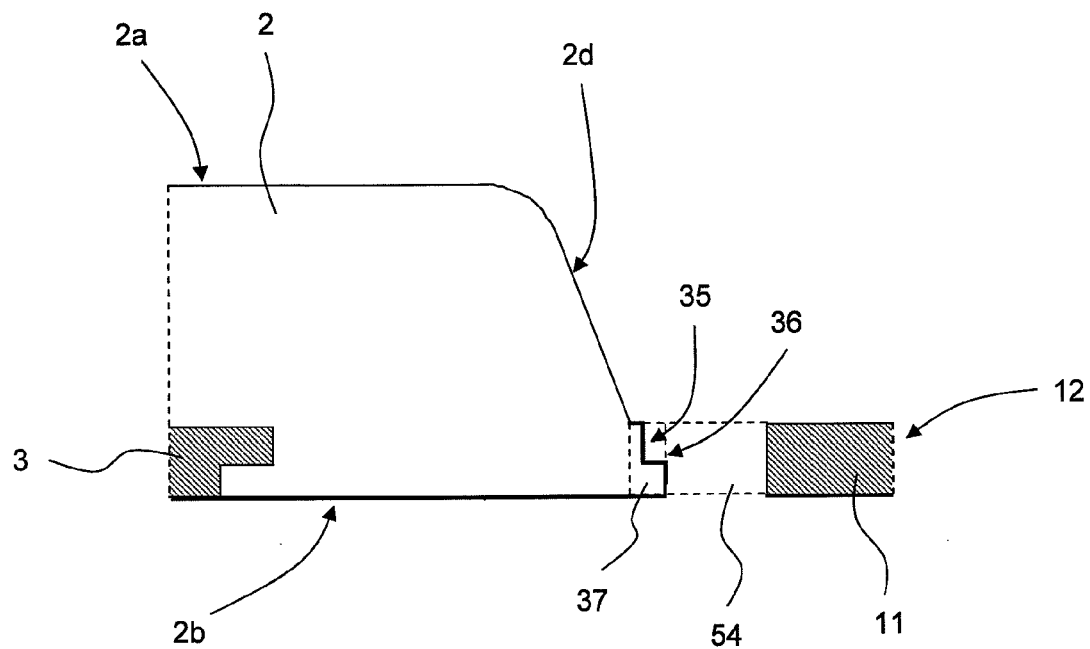
FIG. 57 is a fragmentary enlarged cross-sectional view (at the time of completion of secondary laser beam irradiation) of the sealing body peripheral portion corresponding to the cross-section P-P' of FIG. 56.

6. Description on the Summary of the Invention Relating to the Another Embodiment of the Present Application The following methods can be proposed in order to solve such problems. Described specifically, one of the effective methods is to remove a portion of the resin (a portion of the resin surface to which metal foreign matters have attached) by carrying out, after the primary laser irradiation step, a step (secondary laser irradiation step) of irradiating (spot irradiating) a laser light to a portion (a first portion) around the boundary between the resin surface exposed by the primary laser irradiation step and the remaining resin surface. At this time, as in the embodiment described above, when a laser light is irradiated from the upper surface side of the leadframe, only a portion of the resin on the upper surface side can be removed as shown in FIG. 44 or FIG. 57. This is because, as described above, when a laser light is irradiated from the upper surface side of the leadframe in the primary laser irradiation step, scattered metal foreign matters attach mainly to the upper surface side of the leadframe and the resin (surface exposed to the laser light). This process enables to decrease the time of the secondary laser irradiation step.

Figure 47:
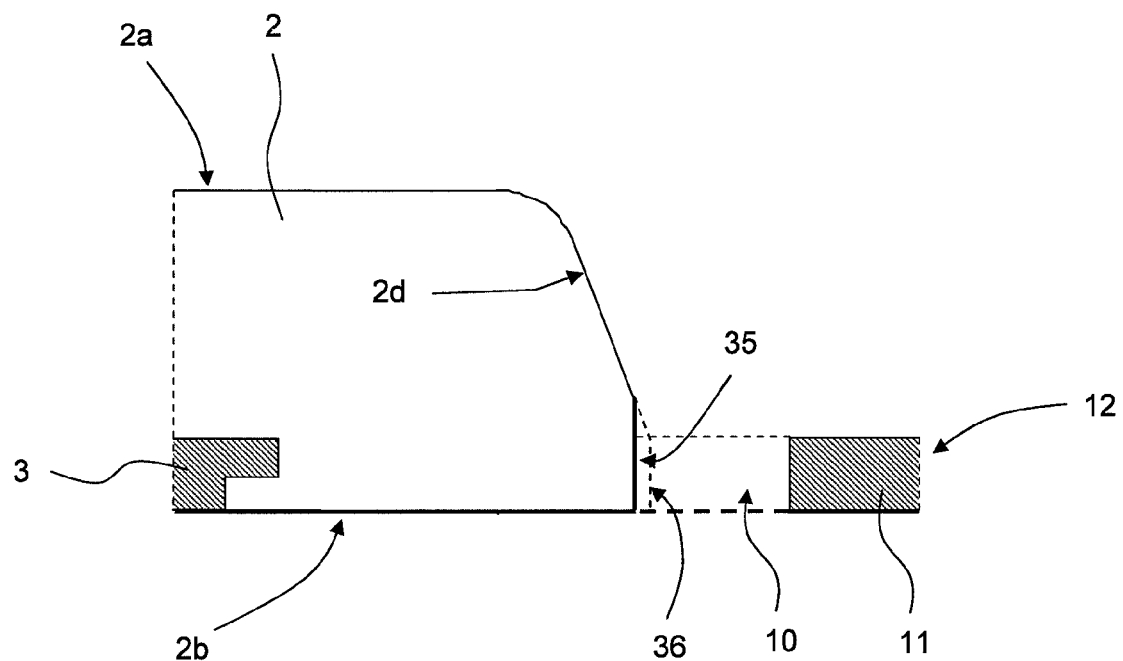
FIG. 47 is a fragmentary enlarged cross-sectional view (at the time of completion of secondary laser beam irradiation) of the sealing body peripheral portion corresponding to the cross-section P-P' of FIG. 46.
Figure 59:
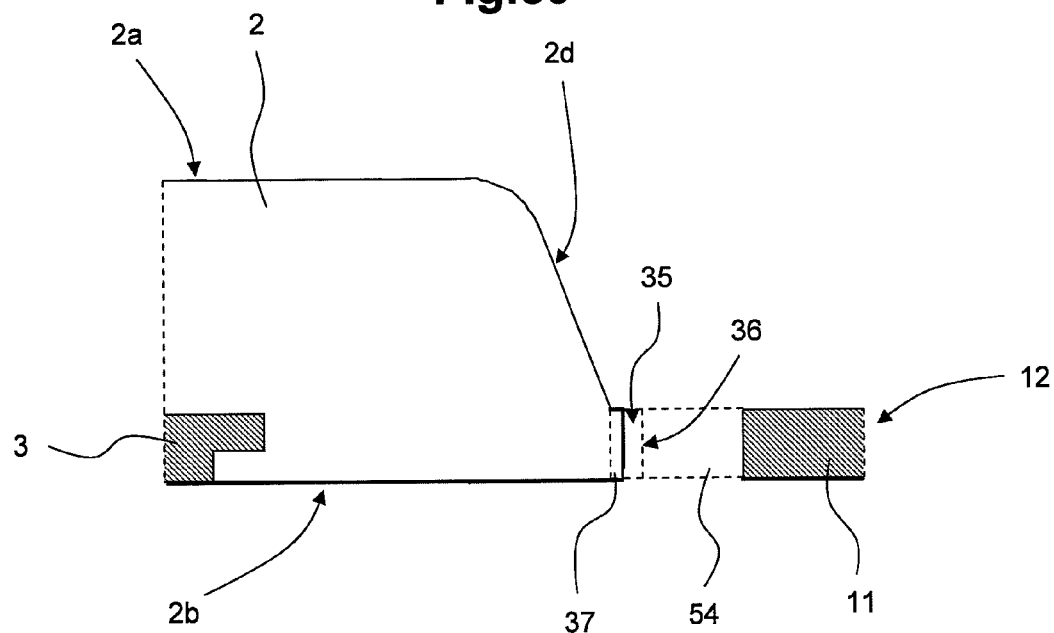
FIG. 59 is a fragmentary enlarged cross-sectional view (at the time of completion of secondary laser beam irradiation) of the sealing body peripheral portion corresponding to the cross-section P-P' of FIG. 58.

Incidentally, in this secondary laser irradiation step, as shown in FIG. 47 or 59, it is also possible to irradiate a laser light so as to cause it to penetrate from the upper surface side to the lower surface side of the resin and thereby remove a portion (first portion) of the resin exposed by the first laser irradiation step. Such a method can more reliably suppress the problem described above, that is, formation of the metal film (plating layer) 25 so as to stride over two adjacent outer leads.

Figure 54:
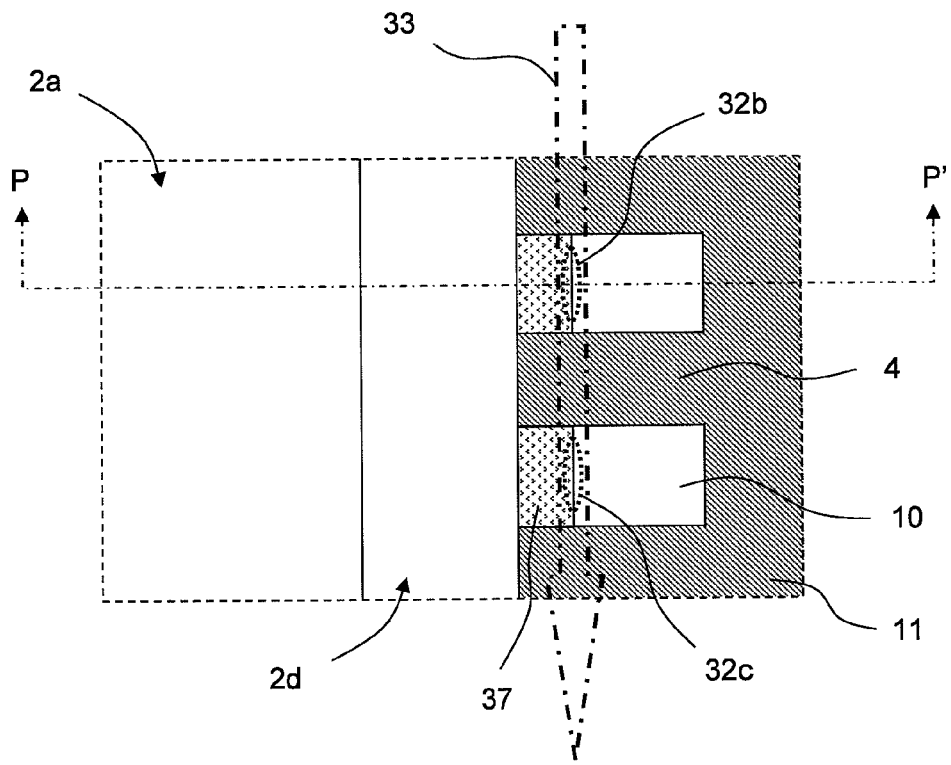
FIG. 54 is a fragmentary enlarged top view (during secondary laser beam irradiation) of the sealing body peripheral portion R3 shown in FIG. 34 relating to the package shown in FIGS. 49 and 50.

The resin member to be removed by the secondary laser irradiation step may be the resin sealing body 2 (FIG. 40) itself or a resin remaining portion 37 (FIG. 54).

In the example described below, employed is a system in which the primary laser irradiation step is performed by continuously scanning (for example, in a pulse mode) a plurality of the outer lead-to-outer lead openings 10 (FIG. 39) and the secondary laser irradiation step is performed by repeating spot irradiation for each of the outer lead-to-outer lead openings 10 while moving it. This system can satisfy a request for shortening the primary laser irradiation step which otherwise takes much time and preventing laser irradiation on leads as much as possible. It is needless to say that in the primary laser irradiation step and the secondary laser irradiation step, various changes can be made instead of using continuous scanning and spot irradiation.

7. Description on the Technical Effects of the Another Embodiment of the Present Application By selecting any one of the methods described above or described below, it is possible to provide a highly reliable semiconductor device because a metal film (plating layer) striding over two adjacent outer leads is not formed on the surface (end portion) of the resin.

8. Description on One Example of the Leadframe and Package Shape in the Method for Manufacturing Semiconductor Device According to the Another Embodiment of the Present Application (Mainly from FIG. 33 to FIG. 35)

Examples described below are basically similar to those described in Sections 1 to 3 so that the following description will be made in principle on portions which are different or are not referred to (which will equally apply to the sections described later).

The leadframe and the package shape described here are utterly same as those described in FIGS. 1 to 4 except for the periphery of a bumper portion.

Figure 33:
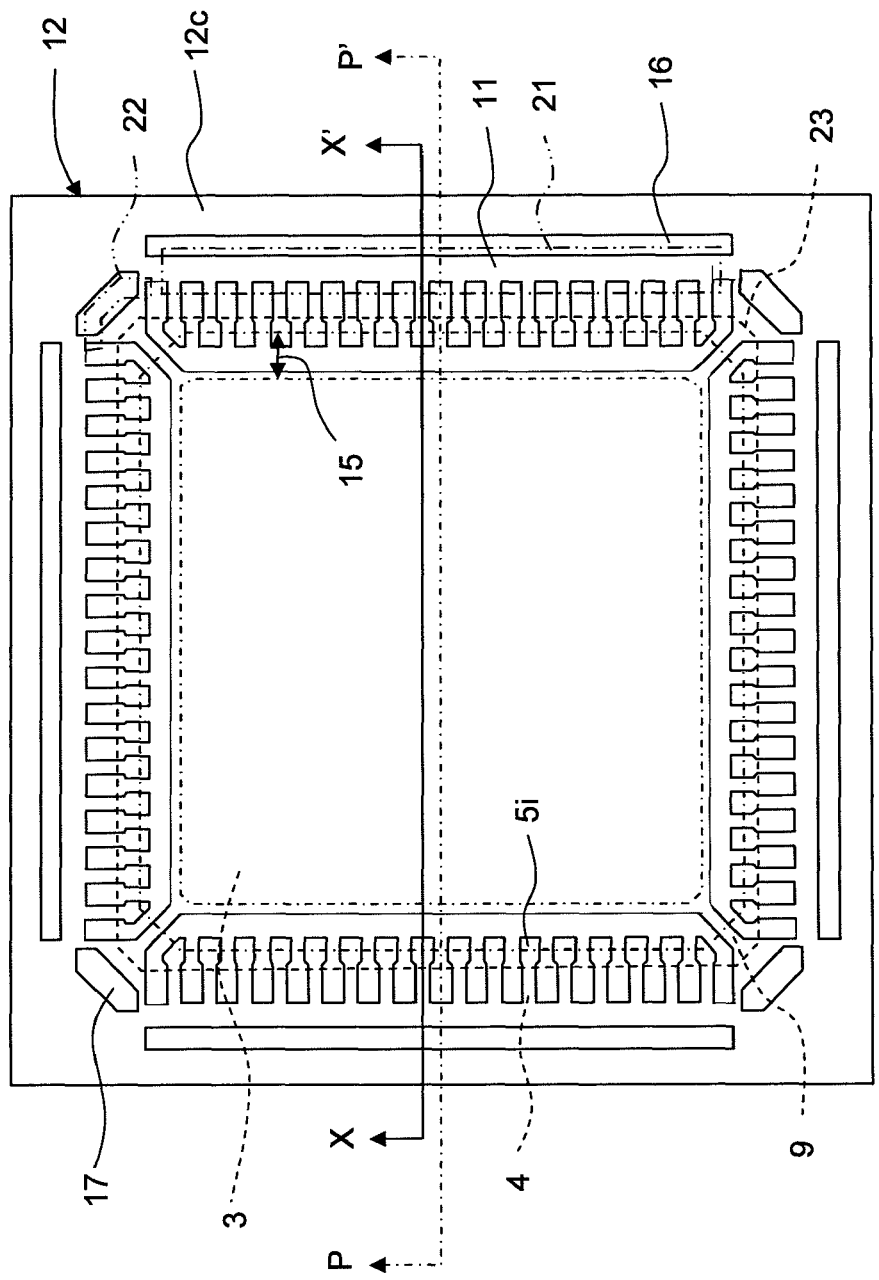
FIG. 33 is a top view (corresponding to FIG. 6 described in Section 2) of the lead frame for describing the relationship between each portion of the lead frame and the sealing body, half etch region, portion to be cut finally, and the like, in the method for manufacturing semiconductor device according to another embodiment of the present application.
Figure 34:
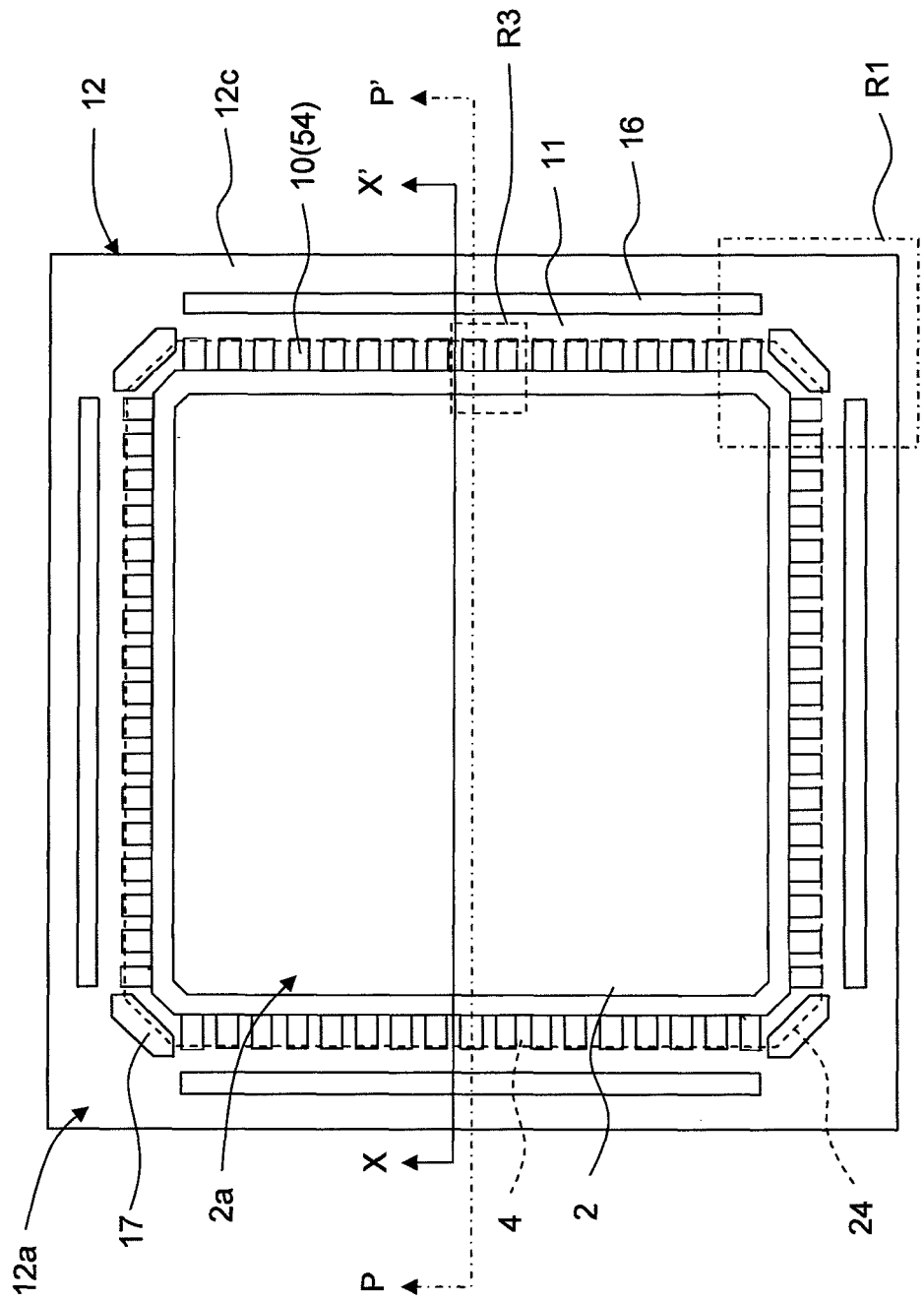
FIG. 34 is a lead frame top view (corresponding to FIG. 14 described in Section 2) for describing a laser primary removal process in the method for manufacturing semiconductor device according to the another embodiment of the present application.
Figure 35:
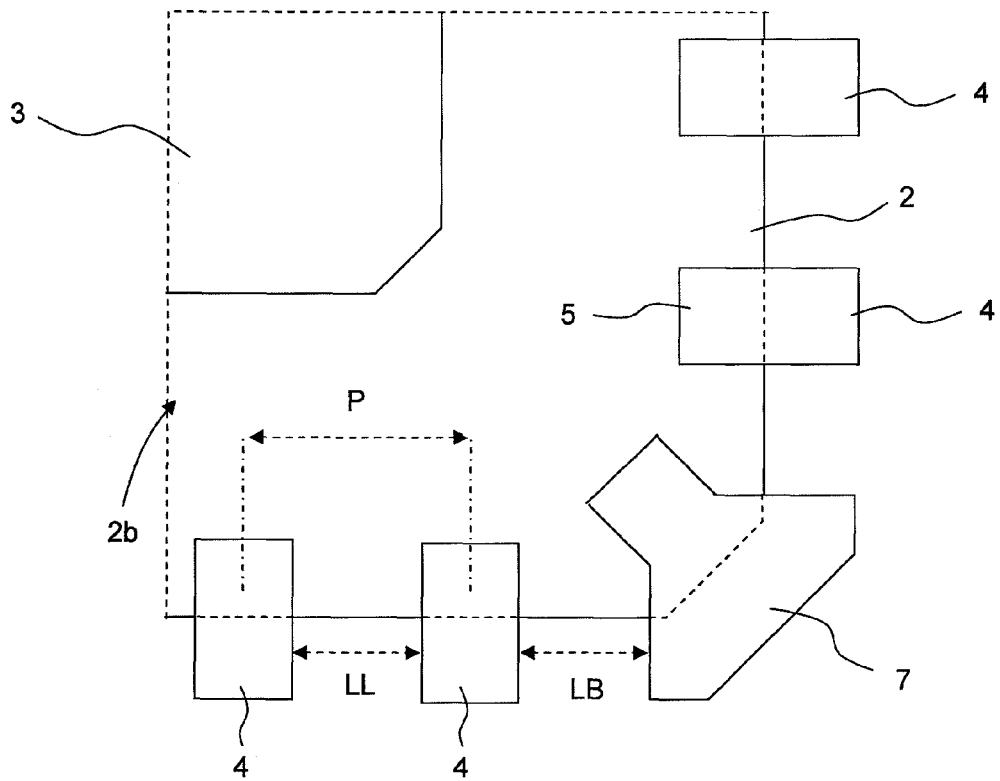
FIG. 35 is a back surface view (corresponding to FIG. 3 of Section 1) of a package corner portion for describing a package shape (spacing between outer leads, bumpers, etc.) in the method for manufacturing semiconductor device according to the another embodiment of the invention.

FIG. 33 is a top view (corresponding to FIG. 6 described in Section 2) of the lead frame for describing the relationship between each portion of the lead frame and the sealing body, half etch region, portion to be cut finally, and the like, in the method for manufacturing semiconductor device according to another embodiment of the present application. FIG. 34 is a lead frame top view (corresponding to FIG. 14 described in Section 2) for describing a laser primary removal process in the method for manufacturing semiconductor device according to the another embodiment of the present application. FIG. 35 is a back surface view (corresponding to FIG. 3 of Section 1) of a package corner portion for describing a package shape (outer leads, bumpers, etc.) in the method for manufacturing semiconductor device according to the another embodiment of the invention. Based on these drawings, one example of the leadframe and package shape in the method for manufacturing semiconductor device according to the another embodiment of the present application will be described.

Similar to Section 1, as shown in FIGS. 33, 34, and 35 (see this diagram attentively), the pitch P of the outer leads 4 are fixed in this package so that the lead distance LL is also fixed. In Section 1, since the bumper 7 and the outer lead 4 at the most end portion are not in an aligned (or not regular) positional relationship, it is not clear whether the distance between the bumper 7 and the outer lead 4 at the most end portion (also influenced by a difference in shape) is equal or not. On the other hand, the bumper 7 and the outer lead 4 at the most end portion, shown in FIGS. 33, 34, and 35, are laid out to have a relatively aligned (or regular) positional relationship so that the distance LB between the bumper 7 and the outer lead 4 at the most end portion and the lead distance LL are the same. Incidentally, in the present application, this distance is also called "lead distance" unless otherwise distinguished. When such a positional relationship is employed, in the laser irradiation step (corresponding to "primary laser irradiation step" in the present embodiment) as described in FIGS. 13 and 14 of Section 2, the lead distances LL and LB are all fixed even if laser scanning is performed in a continuous pulse mode (an output beam itself is not made ON or OFF by keeping a predetermined pulse generation) when the laser beam turns around the periphery of the resin sealing body 2 at a fixed speed (scanning speed), which makes it possible to fix the energy of a laser beam irradiated to one outer lead-to-outer lead opening 10 (including the space between the bumper 7 and the outer lead 4 at the most end portion), that is, the lead-to-lead resin protrusion 54. This is a merit available by any embodiment of the present application insofar as a leadframe having such a planar shape is used.

9. Description on a Laser Processing Process in the Method for Manufacturing Semiconductor Device According to the another embodiment of the present application (mainly, from FIG. 36 to FIG. 48)

The laser processing process (resin member processing) which will be described in this section is basically similar to Section 3 so that only portions which are different (added or substituted portion) or are not referred to will be described in principle.

The resin member removal process using laser irradiation, which will be described in this section, is characterized by that it has mainly a primary laser irradiation step for removing the lead-to-lead resin protrusion 54 and a secondary laser irradiation step for removing metal deposition scattered during this primary laser irradiation step.

Figure 36:
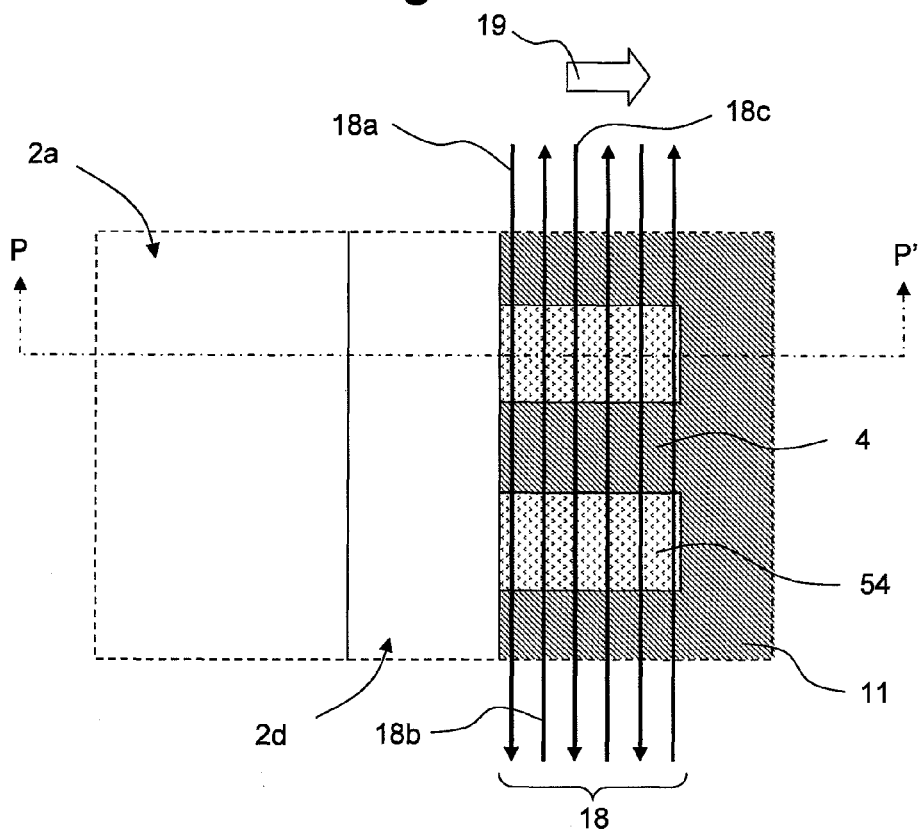
FIG. 36 is a fragmentary enlarged top view (during primary laser beam irradiation) of the sealing body peripheral portion R3 of FIG. 34 for describing a laser primary removal process in the method for manufacturing semiconductor device according to the another embodiment of the present application.
Figure 37:
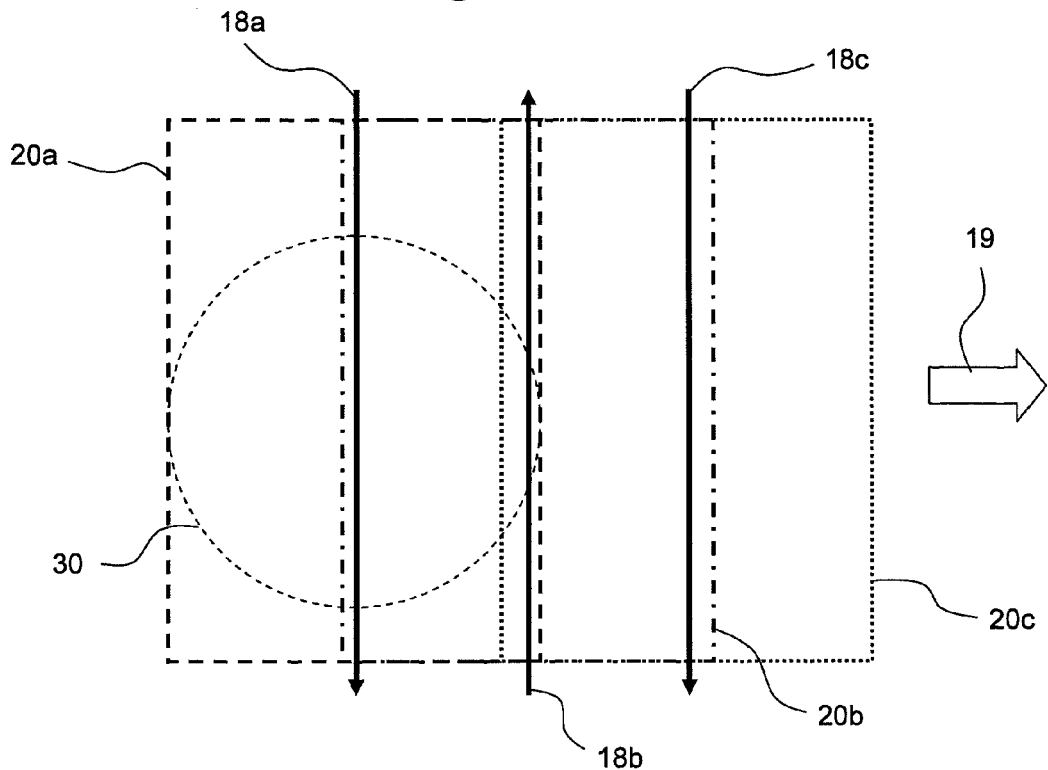
FIG. 37 is a detailed plan view of the layout of the primary laser beam irradiation sub-region shown in FIG. 36.
Figure 38:
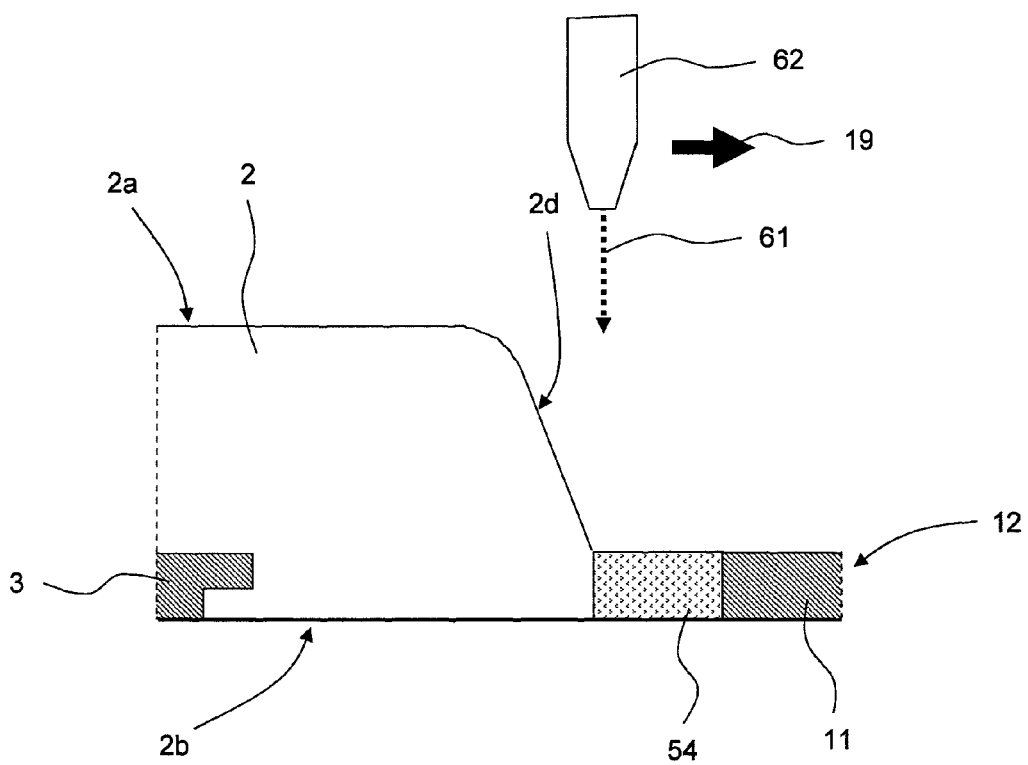
FIG. 38 is a fragmentary enlarged cross-sectional view (during irradiation of a primary laser beam) of the sealing body peripheral portion corresponding to the cross-section P-P' of FIG. 36.
Figure 39:
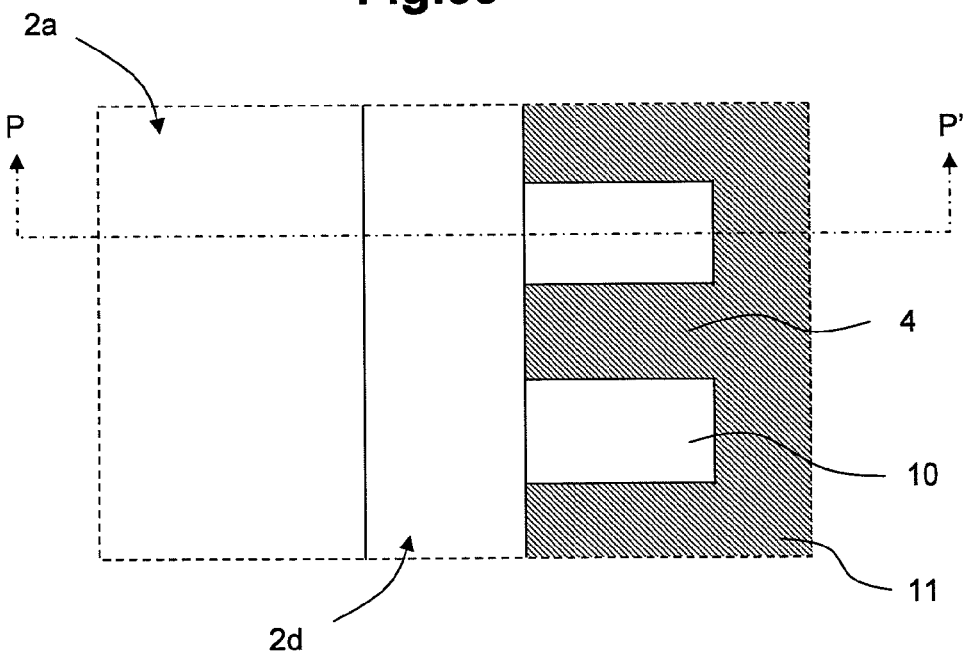
FIG. 39 is a fragmentary enlarged top view (at the time of completion of the primary laser beam irradiation) of the sealing body peripheral portion R3 shown in FIG. 34.
Figure 40:
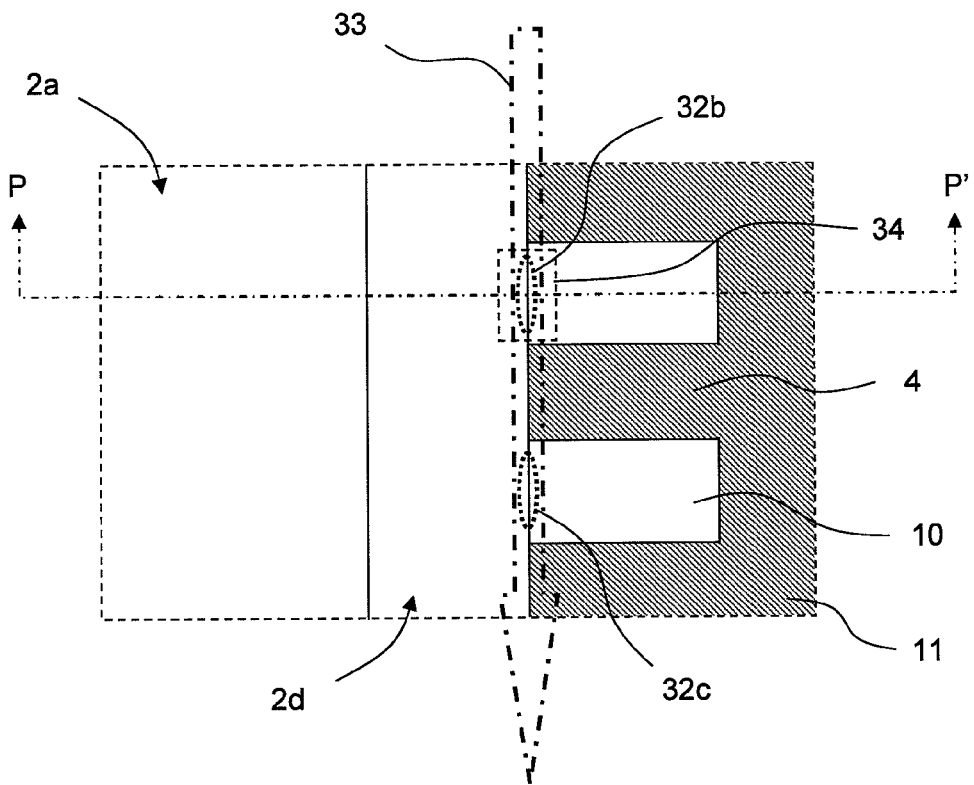
FIG. 40 is a fragmentary enlarged top view (during irradiation of a secondary laser beam) of the sealing body peripheral portion R3 shown in FIG. 34.
Figure 41:
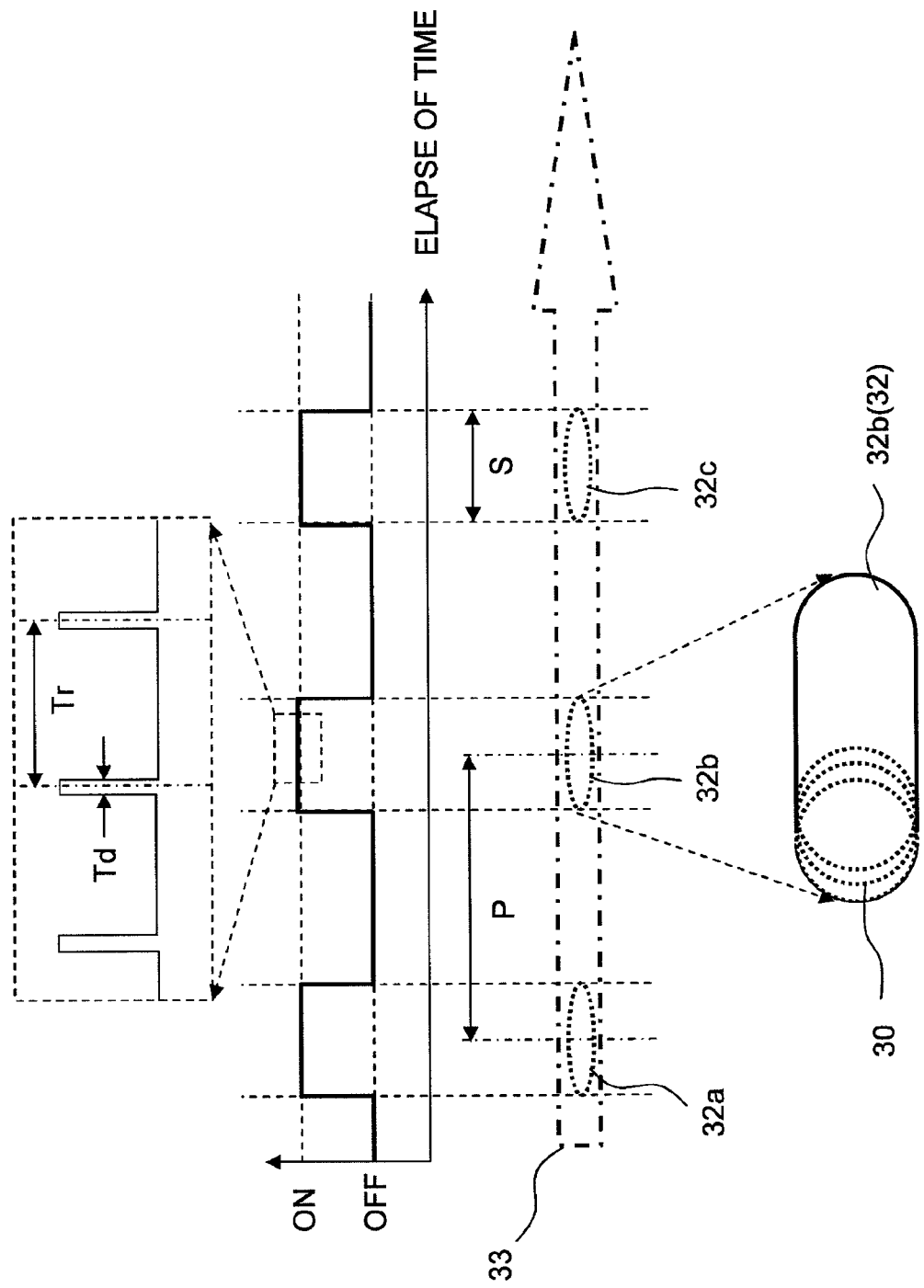
FIG. 41 is an explanatory view of an irradiation state in which only a beam irradiated portion in FIG. 40 is enlarged.
Figure 42:
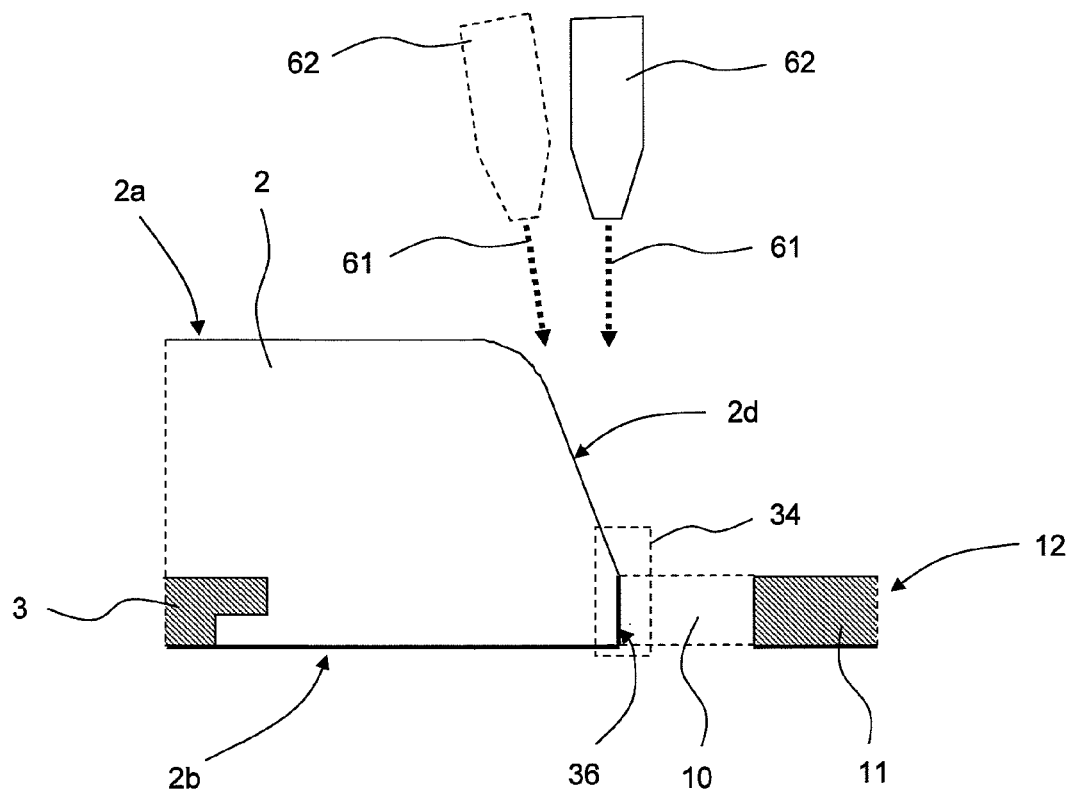
FIG. 42 is a fragmentary enlarged cross-sectional view (during irradiation of a secondary laser beam) of the sealing body peripheral portion corresponding to the cross-section P-P' of FIG. 40.
Figure 43:
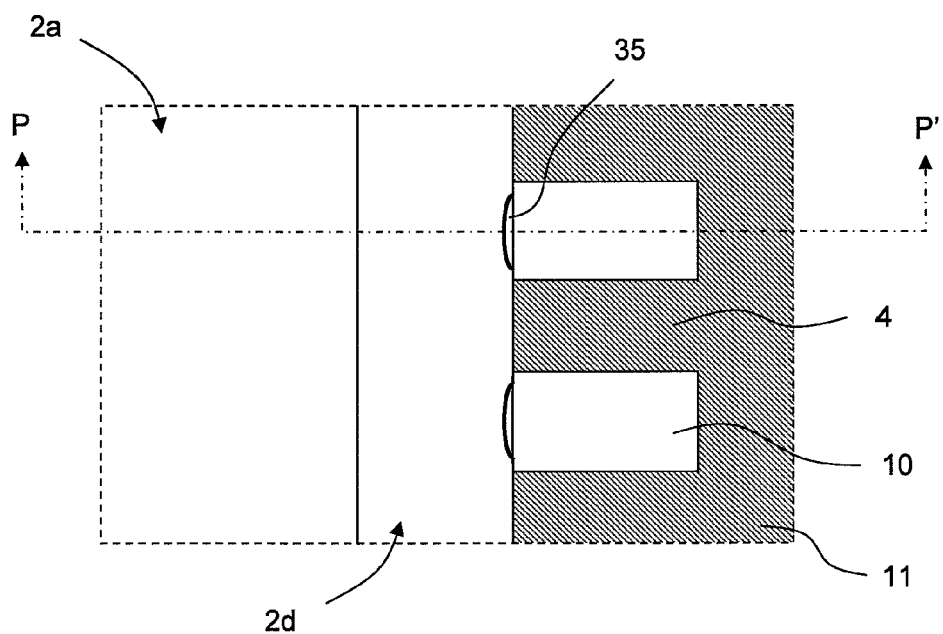
FIG. 43 is a fragmentary enlarged top view (at the time of completion of secondary laser beam irradiation) of the sealing body peripheral portion R3 shown in FIG. 34.
Figure 45:
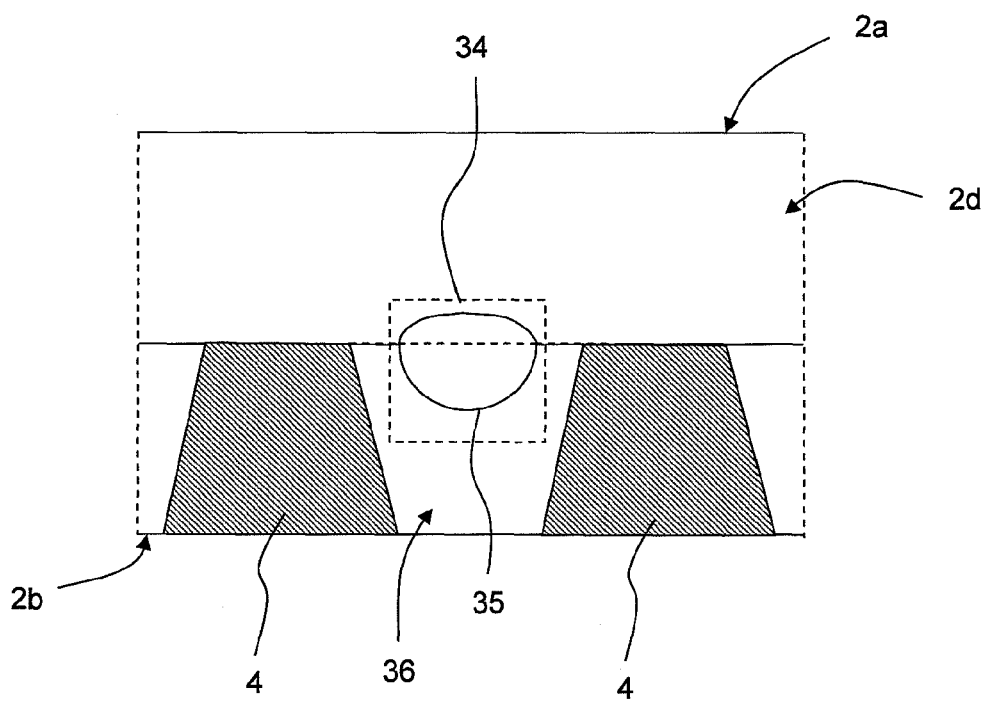
FIG. 45 is a partial enlarged view of the side surface of the package at the periphery of the secondary resin removal portion shown in FIG. 44.
Figure 46:
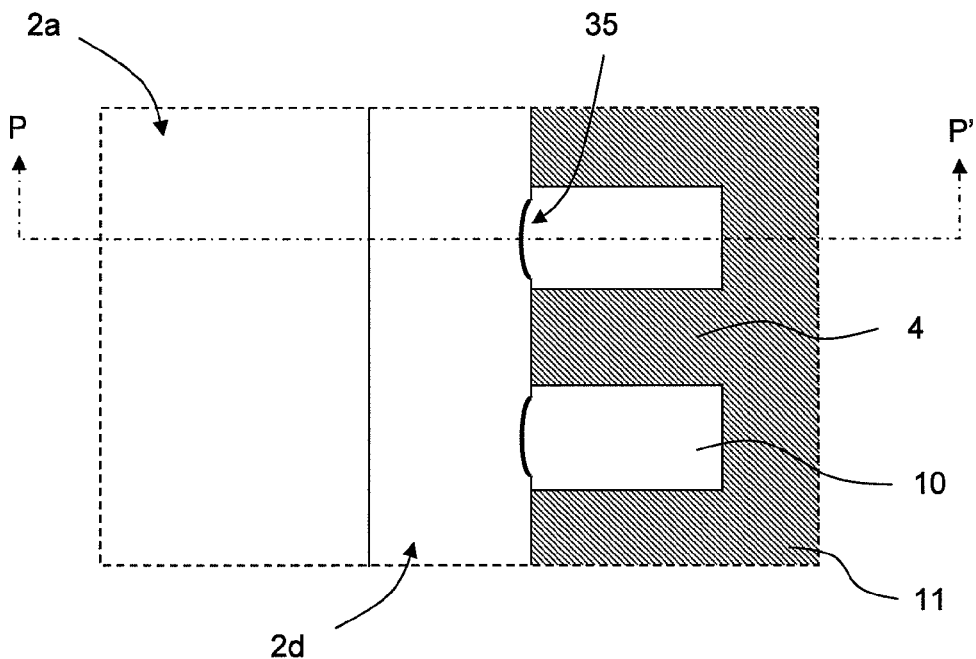
FIG. 46 is a fragmentary enlarged top view (at the time of completion of secondary laser beam irradiation) of the sealing body peripheral portion R3 shown in FIG. 34 in a secondary resin removal modification example (penetrating removal) corresponding to FIG. 43.
Figure 48:
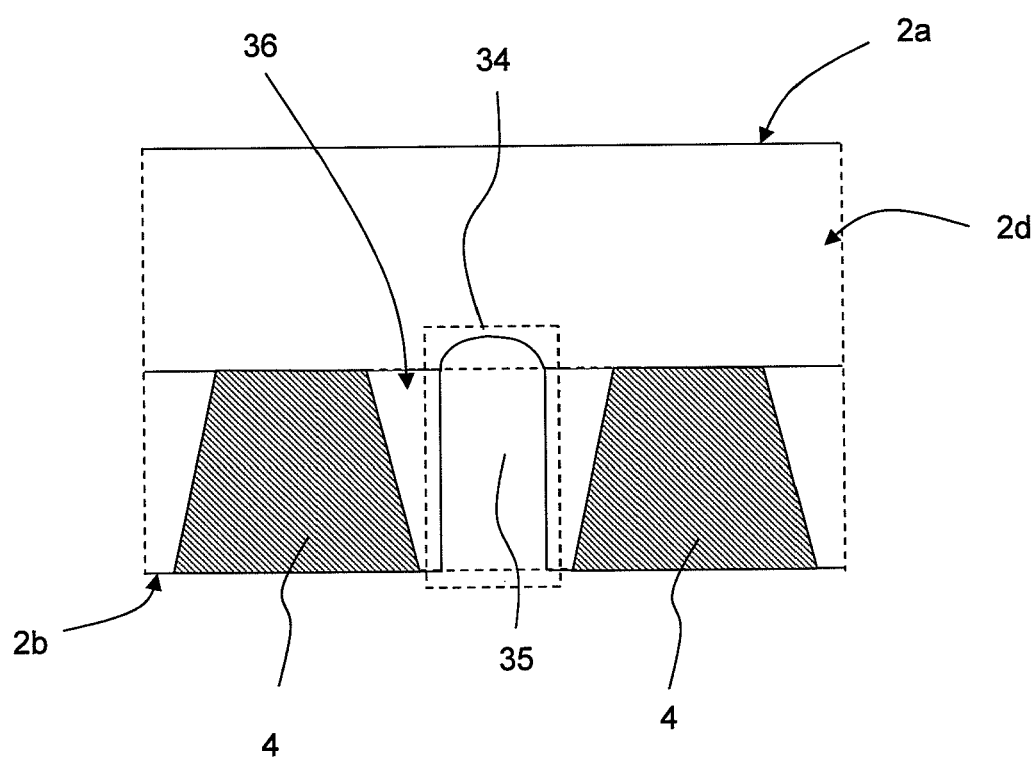
FIG. 48 is a partial enlarged view of the side surface of the package at the periphery of the secondary resin removal portion shown in FIG. 47.

FIG. 36 is a fragmentary enlarged top view (during primary laser beam irradiation) of the sealing body peripheral portion R3 of FIG. 34 for describing a laser primary removal process in the method for manufacturing semiconductor device according to the another embodiment of the present application. FIG. 37 is a detailed plan view of the layout of the primary laser beam irradiation sub-region shown in FIG. 36. FIG. 38 is a fragmentary enlarged cross-sectional view (during primary laser beam irradiation) of the sealing body peripheral portion corresponding to the cross-section P-P' of FIG. 36 (incidentally, FIG. 23 schematically shows the structure inside the resin sealing body, but in this drawing or similar drawings shown below, the structure is shown in line with the actual condition in consideration of necessity). FIG. 39 is a fragmentary enlarged top view (at the time of completion of the primary laser beam irradiation) of the sealing body peripheral portion R3 shown in FIG. 34. FIG. 40 is a fragmentary enlarged top view (during secondary laser beam irradiation) of the sealing body peripheral portion R3 shown in FIG. 34. FIG. 41 is an explanatory view of an irradiation state in which only a beam irradiated portion in FIG. 40 is enlarged. FIG. 42 is a fragmentary enlarged cross-sectional view (during secondary laser beam irradiation) of the sealing body peripheral portion corresponding to the cross-section P-P' of FIG. 40. FIG. 43 is a fragmentary enlarged top view (at the time of completion of secondary laser beam irradiation) of the sealing body peripheral portion R3 shown in FIG. 34. FIG. 44 is a fragmentary enlarged cross-sectional view (at the time of completion of secondary laser beam irradiation) of the sealing body peripheral portion corresponding to the cross-section P-P' of FIG. 43. FIG. 45 is a partial enlarged view of the side surface of the package at the periphery of the secondary resin removal portion shown in FIG. 44. FIG. 46 is a fragmentary enlarged top view (at the time of completion of secondary laser beam irradiation) of the sealing body peripheral portion R3 shown in FIG. 34 in a secondary resin removal modification example (penetrating removal) corresponding to FIG. 43. FIG. 47 is a fragmentary enlarged cross-sectional view (at the time of completion of secondary laser beam irradiation) of the sealing body peripheral portion corresponding to the cross-section P-P' of FIG. 46. FIG. 48 is a partial enlarged view of the side surface of the package at the periphery of the secondary resin removal portion shown in FIG. 47. Based on these drawings, the laser processing process (the dam resin removal step 104 using laser in FIG. 7) in the method for manufacturing semiconductor device according to the another embodiment of the present application will next be described.

The primary laser beam irradiation step is similar to that described above in Section 3, but it will next be described more specifically in order to compare it with the secondary laser beam irradiation step which will be described later. As shown in FIGS. 36 and 38, the laser irradiation region 24 described in FIGS. 13, 21, and 24 is composed of, for example, a plurality of primary laser beam scanning paths 18 (18a, 18b, 18c) having the same width. In this example, the laser irradiation range 24 is wholly covered by shifting a scanning path as in a primary laser beam scanning path shifting direction 19 from the inside to the outside. In this example, the primary laser beam scanning paths adjacent to each other are opposite in direction each other, but they may have the same direction. The number of foreign matters or dusts such as metals and resins attached to the body of the resin sealing body 2 can be reduced by shifting the scanning path to the outside as in the primary laser beam scanning path shifting direction 19 from the inside to the outside. The scanning path may also be shifted from the outside to the inside. Or the scanning paths may be arranged at random to cover the entirety of the laser irradiation region 24 therewith. In general, shifting to one direction continuously or intermittently is easier to control.

As shown in FIG. 37, the primary laser beam scanning paths 18a, 18b, and 18c correspond to primary laser beam irradiation sub-regions 20 (20a, 20b, 20c) having the same diameter as that of the laser beam cross-section 30 (the term "diameter of the laser beam" means the diameter of a beam having a circular cross-section where intensity of amplitude falls to 1/e at the center of the beam, wherein e represents a base of natural logarithm) and any two of the primary laser beam irradiation sub-regions 20a, 20b, and 20c overlap each other by about 50%.

In this example, as shown in FIG. 38, the resin removal laser light 61 (laser beam) is perpendicularly incident to the upper surface 12a of the leadframe 12. This incident angle can be changed in various ways as described in Sections 1 to 4 (it will be described collectively later).

The following is one example of laser irradiation conditions in the primary laser beam irradiation step. Described specifically, kind of laser: for example, YAG laser (Nd:YAG, etc.), wavelength of laser light: for example, 1064 nm (near infrared ray) which is a fundamental wavelength, beam diameter on the leadframe top surface (focal plane): for example, about 100 micrometers, laser output: for example, about 20 W, pulse repeating frequency (for example, pulse operation with Q switching): for example, 20 kHz, pulse duration time, that is, pulse length: for example, about 40 ns (accordingly, energy per pulse is, for example, about 1 mJ), scanning speed: for example, 300 mm/sec, number of cycles of the sealing body 2, that is, the number of primary laser beam irradiation sub-regions 20: for example, from about 8 to 12, and irradiation system: for example, continuous scanning system in a continuous pulse mode (not accompanied with ON/OFF of beam other than Q switching).

The upper surface of the leadframe just after completion of this primary laser beam irradiation step is shown in FIG. 39. In this drawing, the lead-to-lead resin protrusion 54 is removed and this portion becomes the outer lead-to-outer lead opening 10. In this state, on the other hand, metal members (such as copper) configuring the lead frame which were scattered during the primary laser beam irradiation step have attached to the surface of the resin member so that a secondary laser beam irradiation step should be performed after the primary laser beam irradiation step but prior to the lead solder plating step 106 (FIG. 7) (when the lead solder plating step 106 has therebefore a washing step such as water jet step, the secondary laser beam irradiation step is conducted preferably before the washing step).

As shown in FIGS. 40, 41, and 42, the secondary laser beam irradiation step is performed in a similar manner to the primary laser beam irradiation step by scanning with a laser beam, but they are a little different in scanning method. The scanning method may be the same, but a spot system which will be described later can remove undesired metal deposits definitely. Described specifically, a secondary laser beam scanning path 33 corresponding to the secondary laser beam irradiation step is, similar to that of the primary laser beam irradiation step, a linear path, but different from that of the primary laser beam irradiation step, the number of the paths is only one. This is because the metal deposits mainly become a problem only at the lower end portion of the side surface 2d of the resin sealing body 2 (package) and a periphery thereof. In addition, by using the spot system and irradiating only to laser beam spot irradiation regions 32 (32a, 32b, and 32c) which are separated from each other, repetition of metal deposit formation is prevented. The laser beam is therefore made ON/OFF with a liquid crystal mask, mechanical shutter, or the like. Thus, it is possible to completely remove undesirable metal deposits by allowing the laser beam to make, for example, a circuit of the outer periphery of the resin sealing body 2 and removing the metal deposits together with the surrounding resin having metal deposits thereon.

As shown in FIGS. 40 and 42, the position of the laser beam spot irradiation regions 32 (32a, 32b, 32c), that is, portions exposed to a laser light in the secondary laser beam irradiation step is a first portion 34 of the side surface 2d of the package 2 and it includes a portion of the resin surface exposed newly by the primary laser beam irradiation step, that is, a resin exposed portion 36. Incidentally, a portion to be exposed in practice is mainly the first portion 34 on the laser source side. This means that a secondary laser beam is spot-irradiated from the upper surface side of the lead frame to the first portion 34 near the boundary between the resin surface exposed by the removal of the lead-to-lead resin protrusion 54 and the remaining resin surface.

This irradiation system is shown in FIG. 41. As shown in FIG. 41, each laser beam spot irradiation region 32 has an elliptical planar shape (to be exact, an OR figure obtained by overlapping many circles with the same diameter) and the spot irradiation length S is preferably a little less than the lead spacing LL or LB (for preventing repetition of the formation of metal deposits). On the other hand, the pitch of each laser beam spot irradiation region 32 is equal to the lead pitch P.

The following is one example of laser irradiation conditions in the secondary laser beam irradiation step. Described specifically, kind of laser: for example, YAG laser (Nd:YAG, etc.), wavelength of laser light: for example, 1064 nm (near infrared ray) which is a fundamental wavelength, beam diameter in the leadframe top surface (focal plane): for example, about 100 micrometers, laser output: for example, about 20 W, pulse repeating frequency (pulse repeating interval Tr: for example, about 50 microseconds): for example, 20 kHz (for example, pulse operation with Q switching), pulse duration time, that is, pulse length: for example, about 40 ns (energy per pulse is, for example, about 1 mJ), scanning speed: for example, 300 mm/sec, number of cycles of the sealing body 2, that is, the number of primary laser beam irradiation sub-regions 20: for example, about 1 (which may be conducted in two or more times), and irradiation system: for example, spot irradiation system in an intermittent pulse mode (accompanied with ON/OFF of beam other than Q switching).

Laser irradiation in the secondary laser beam irradiation step may be conducted by inclining the laser beam 61 to the center side of the resin sealing body 2 as shown in a broken line in FIG. 42. This enables to reduce an irradiation damage to the main body of the resin sealing body 2.

The package just after completion of this secondary laser beam irradiation step is shown in FIGS. 43, 44, 45. As shown in FIGS. 43, 44, and 45, by the secondary laser beam irradiation step, the metal deposits on the surface and also the resin surface are scraped off and a secondary resin removal portion 35 is formed. Since such a secondary resin removal portion 35 is formed, it becomes possible to effectively prevent formation of a conductor bridge between two adjacent outer leads 4 upon plating of the lead, because if there are metal deposits near the boundary between the lower end of the sealing body side-surface upper portion 2*d* and the resin exposed portion 36, a conductor bridge is easily formed, due to electric field concentration upon plating, on both sides of the metal deposit, with the deposit as a starting point. In addition, metal deposits are likely to adhere mainly to portions above the vicinity of the upper end of the resin exposed portion 36. Thus, it is possible to minimize the damage to the main body of the resin sealing body 2 by carrying out spot irradiation and thereby forming only the upper half side of the secondary resin removal portion 35 (upper-half secondary resin removal portion).

The secondary resin removal portion 35 can also be formed as shown in FIG. 46, 47, or 48. This means that by causing the secondary resin removal portion 35 to penetrate to the lower surface 2*b* of the package (penetration type secondary resin removal portion), a shorting path between two adjacent outer leads 4 can be blocked almost completely.

10. Description on a Modification Example (Peripheral Dam Resin Remaining Type) of the Package Shape in the Method for Manufacturing Semiconductor Device According to the Another Embodiment of the Present Application (Mainly, FIGS. 49 and 50)

Figure 49:
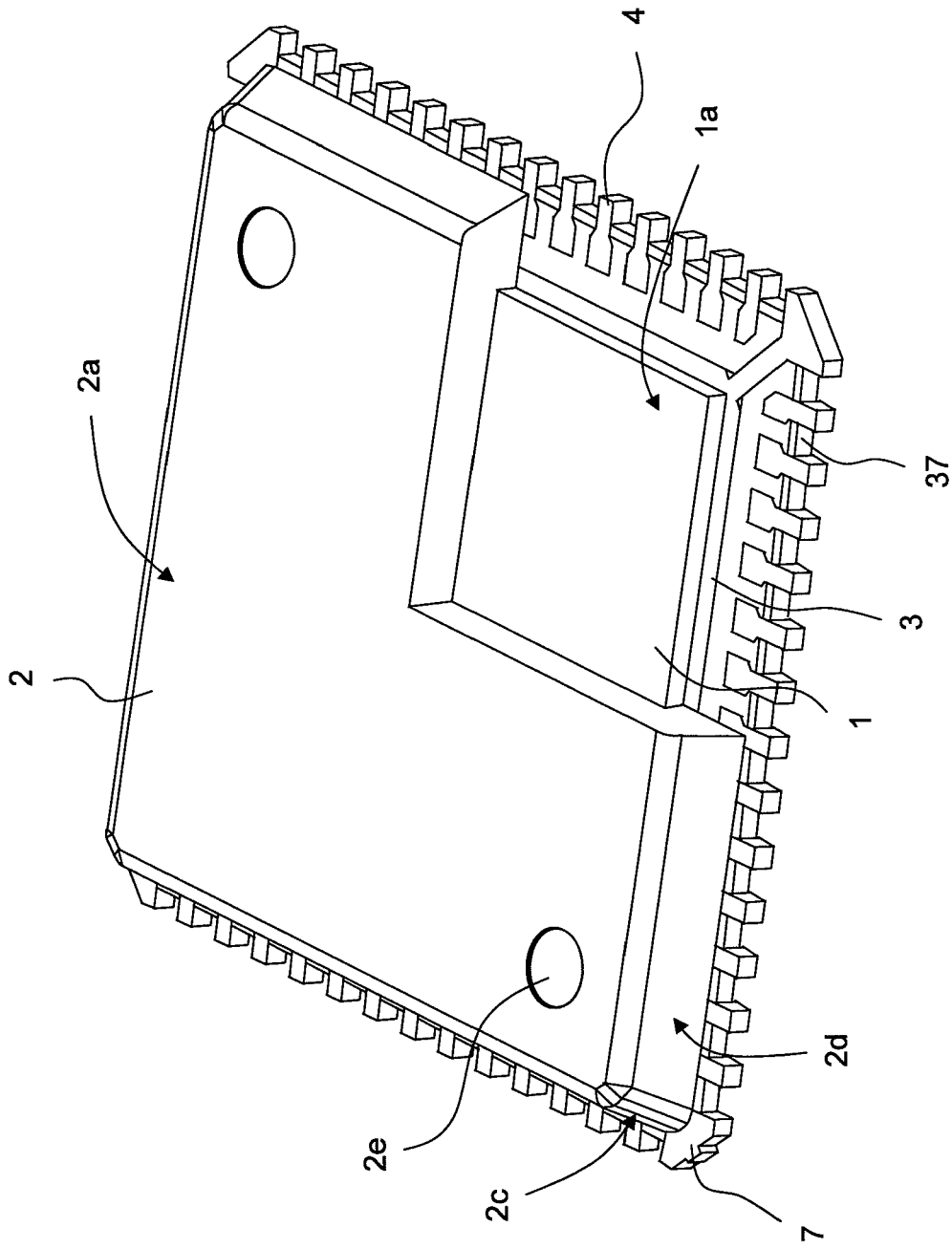
FIG. 49 is a top perspective view of a modification example (peripheral dam resin remaining type) of a package shape in the method for manufacturing semiconductor device according to the another embodiment of the present application.
Figure 50:
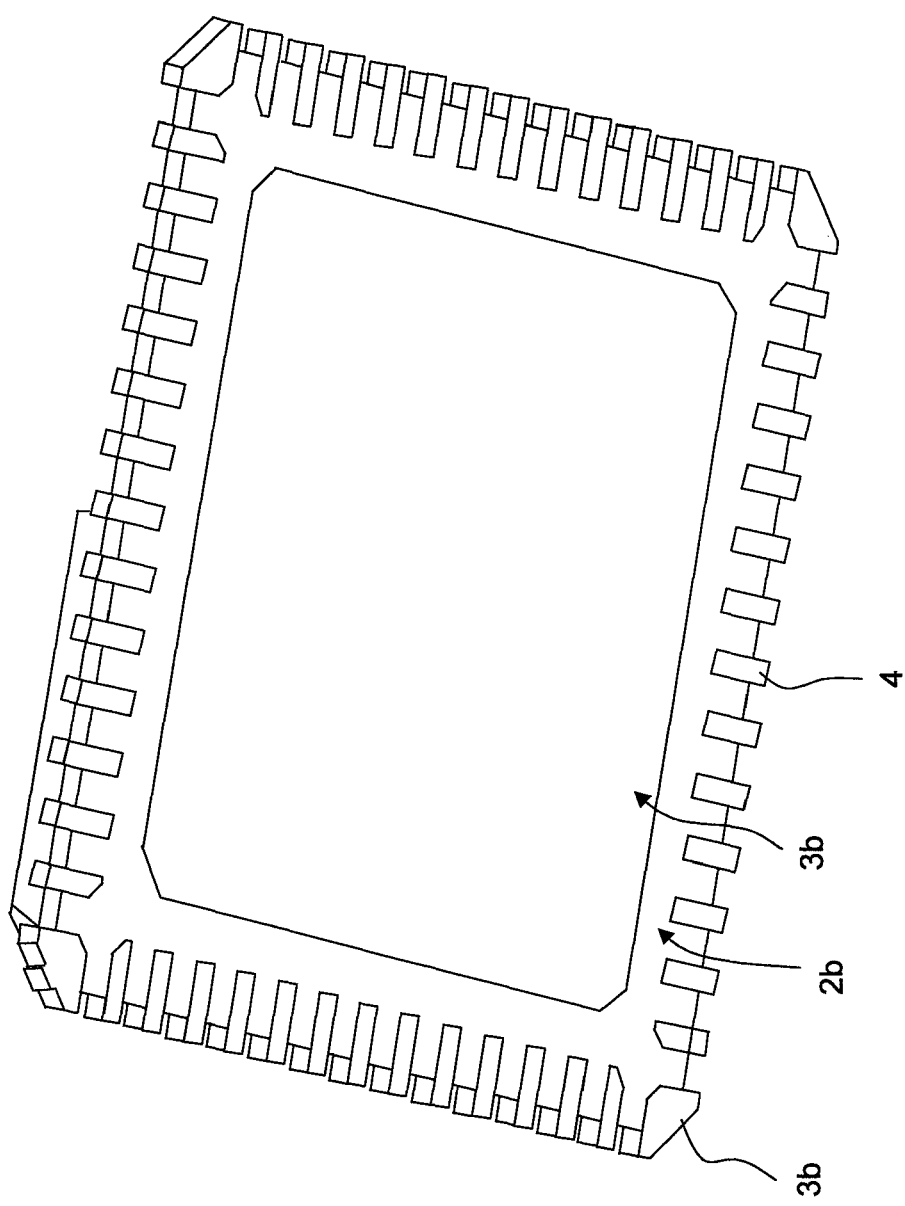
FIG. 50 is a bottom perspective view of a modification example (peripheral dam resin remaining type) of a package shape in the method for manufacturing semiconductor device according to the another embodiment of the present application.

FIG. 49 is a top perspective view of a modification example (peripheral dam resin remaining type) of a package shape in the method for manufacturing semiconductor device according to the another embodiment of the present application. FIG. 50 is a bottom perspective view of a modification example (peripheral dam resin remaining type) of a package shape in the method for manufacturing semiconductor device according to the another embodiment of the present application. Based on these drawings, a modification example (peripheral dam resin remaining type) of a package shape in the method for manufacturing semiconductor device according to the another embodiment of the present application will next be described.

This package shape is basically similar to that described in Section 8 (typical package) but is different in that it has a resin terrace 37 (FIGS. 49 and 50) between outer leads 4 at the peripheral lower end portions (package with resin terrace). The package with the resin terrace 37 (resin remaining portion) is suited to the laser irradiation resin removal process described above in Sections 3 and 9. In the next section, a laser dam resin removal step 104 (FIG. 7) corresponding to this package structure will be described.

11. Description on a laser processing process corresponding to the modification example (peripheral dam resin remaining type) of the package shape in the method for manufacturing semiconductor device according to the another embodiment of the present application (mainly from FIG. 51 to FIG. 59)

The laser processing process is basically similar to the one described in Section 9 and is a modification example thereof, so that only portions which are different will be described in principle.

Figure 51:
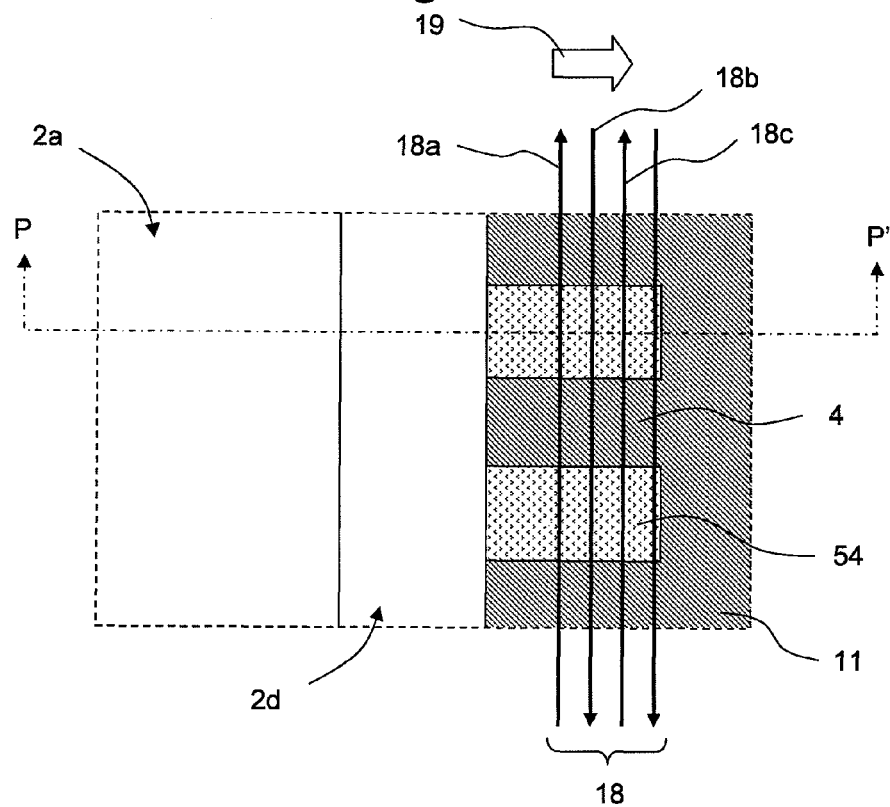
FIG. 51 is a fragmentary enlarged top view (during primary laser beam irradiation) of the sealing body peripheral portion R3 shown in FIG. 34, for describing a laser primary removal process relating to the package shown in FIGS. 49 and 50.
Figure 52:
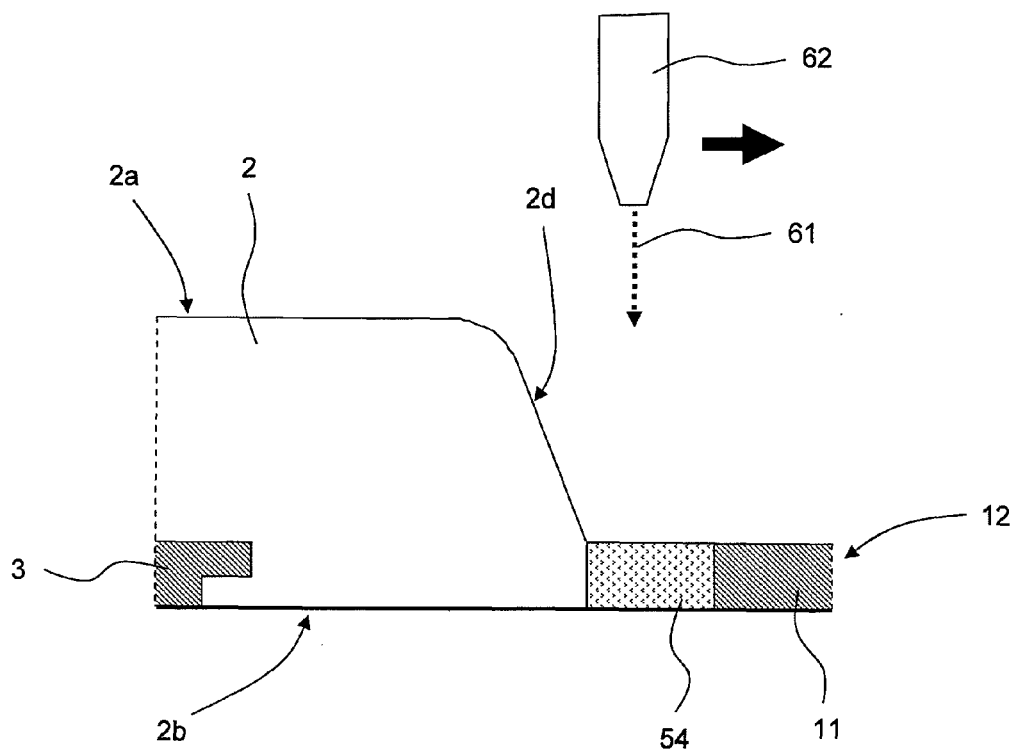
FIG. 52 is a fragmentary enlarged cross-sectional view (during primary laser beam irradiation) of a sealing body peripheral portion corresponding to the cross-section P-P' of FIG. 51 relating to the package shown in FIGS. 49 and 50.
Figure 53:
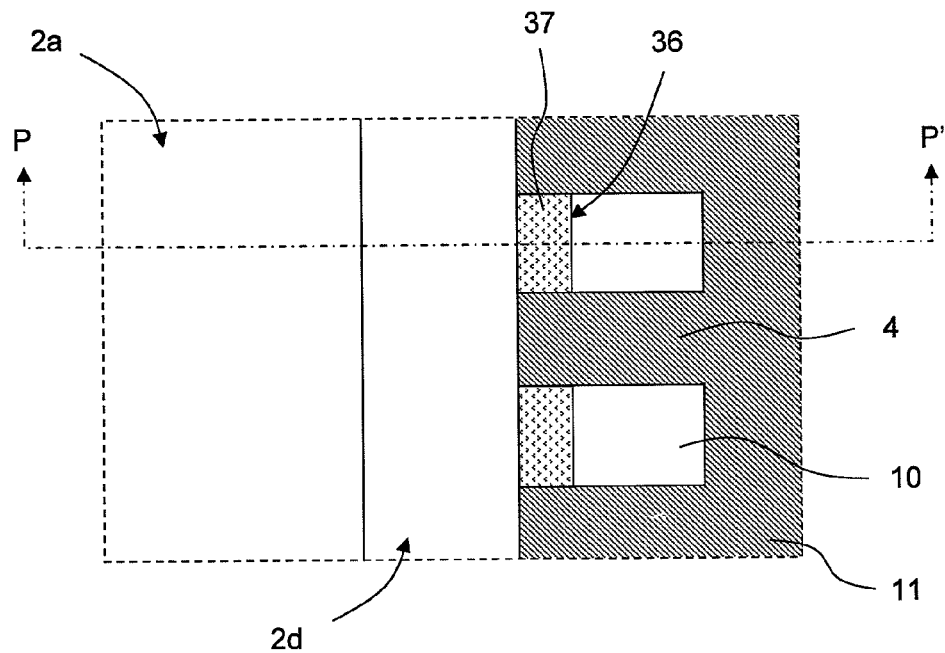
FIG. 53 is a fragmentary enlarged top view (at the time of completion of primary laser beam irradiation) of the sealing body peripheral portion R3 shown in FIG. 34 relating to the package shown in FIGS. 49 and 50.
Figure 55:
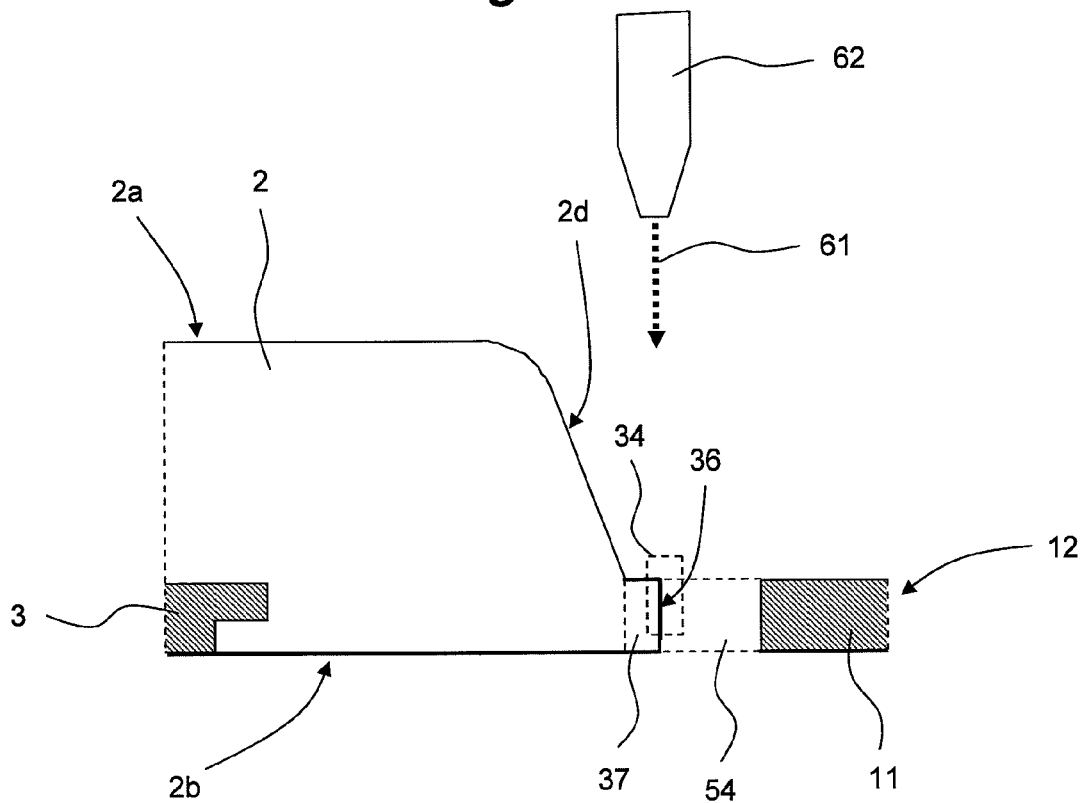
FIG. 55 is a fragmentary enlarged cross-sectional view (during secondary laser beam irradiation) of the peripheral portion of a sealing body, corresponding to the cross-section P-P' of FIG. 54.
Figure 56:
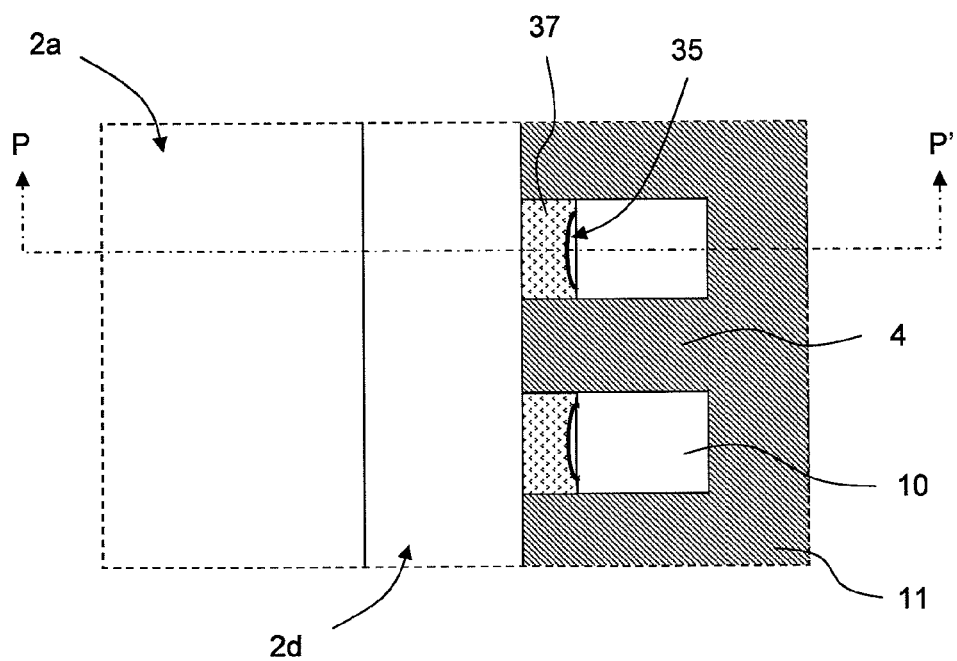
FIG. 56 is a fragmentary enlarged top view (at the time of completion of secondary laser beam irradiation) of the sealing body peripheral portion R3 shown in FIG. 34 relating to the package shown in FIGS. 49 and 50.
Figure 58:
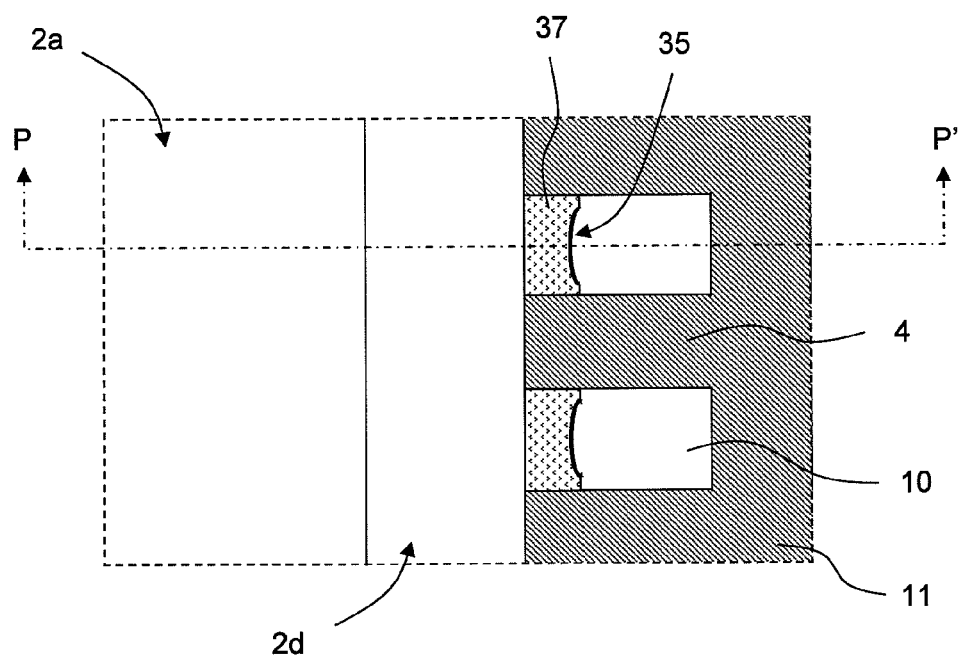
FIG. 58 is a fragmentary enlarged top view (at the time of completion of secondary laser beam irradiation) of the sealing body peripheral portion R3 of FIG. 34 in a secondary resin removal modification example (penetrating removal) corresponding to FIG. 46.

FIG. 51 is a fragmentary enlarged top view (during primary laser beam irradiation) of the sealing body peripheral portion R3 shown in FIG. 34, for describing a laser primary removal process relating to the package shown in FIGS. 49 and 50. FIG. 52 is a fragmentary enlarged cross-sectional view (during primary laser beam irradiation) of a sealing body peripheral portion corresponding to the cross-section P-P' of FIG. 51 relating to the package shown in FIGS. 49 and 50. FIG. 53 is a fragmentary enlarged top view (at the time of completion of primary laser beam irradiation) of the sealing body peripheral portion R3 shown in FIG. 34 relating to the package shown in FIGS. 49 and 50. FIG. 54 is a fragmentary enlarged top view (during secondary laser beam irradiation) of the sealing body peripheral portion R3 shown in FIG. 34 relating to the package shown in FIGS. 49 and 50. FIG. 55 is a fragmentary enlarged cross-sectional view (during secondary laser beam irradiation) of the sealing body peripheral portion, corresponding to the cross-section P-P' of FIG. 54. FIG. 56 is a fragmentary enlarged top view (at the time of completion of secondary laser beam irradiation) of the sealing body peripheral portion R3 shown in FIG. 34 relating to the package shown in FIGS. 49 and 50. FIG. 57 is a fragmentary enlarged cross-sectional view (at the time of completion of secondary laser beam irradiation) of the sealing body peripheral portion corresponding to the cross-section P-P' of FIG. 56. FIG. 58 is a fragmentary enlarged top view (at the time of completion of secondary laser beam irradiation) of the sealing body peripheral portion R3 of FIG. 34 in a secondary resin removal modification example (penetrating removal) corresponding to FIG. 46. FIG. 59 is a fragmentary enlarged cross-sectional view (at the time of completion of secondary laser beam irradiation) of the sealing body peripheral portion corresponding to the cross-section P-P' of FIG. 58. Based on these drawings, a laser processing process corresponding to the modification example (peripheral dam resin remaining type) of the package shape in the method for manufacturing semiconductor device according to the another embodiment of the present application will next be described.

As shown in FIGS. 51 and 52, different from FIG. 38, damage to the resin sealing body 2 due to misalignment of laser is reduced by placing the first primary laser beam scan path 18*a* at a position distant from the resin sealing body 2.

Next, the upper surface of the package just after completion of the primary laser beam irradiation is shown in FIG. 53. As shown in FIG. 53, it is apparent that a resin terrace 37 (resin remaining portion) is formed at the end portion having no outer lead-to-outer lead opening 10. For example, supposing that based on the dimension of the leadframe shown in Section 1, a distance from the resin sealing body side surface 2*d* to the tie bar 11 is, for example, about 0.5 mm, the width of this terrace is from about ⅕ to ⅓, more specifically, from about 0.1 mm to about 0.15 mm.

Next, the secondary laser beam irradiation step is shown in FIGS. 54 and 55. As shown in FIGS. 54 and 55, by placing the secondary laser beam scanning path 33 not at the end portion of the resin sealing body 2 but at the end portion (for example, the center of the laser beam is positioned with the end portion) of the resin terrace 37 (resin remaining portion) different from FIGS. 40 and 42, attached metal foreign matters can be removed without substantially giving a damage of laser irradiation to the resin sealing body 2, that is, the main body of the package. Incidentally, a large amount of metal foreign matters tend to adhere mainly to the upper surface near the outer end of the resin terrace 37 (resin remaining portion) so that concentration of laser energy to this portion is effective.

Next, the state of the package just after completion of the secondary laser beam irradiation step is shown in FIGS. 56 and 57. As shown in FIGS. 56 and 57, the secondary resin removal portion 35 is formed not on the resin sealing body 2 but on the resin terrace 37 (resin remaining portion) in this case.

Similar to Section 9, the secondary resin removal portion 35 can also be formed as shown in FIGS. 58 and 59. In this case, similar to the case as shown in from FIG. 46 to FIG. 48, a shorting path between two adjacent outer leads 4 can be blocked almost completely by causing the secondary resin removal portion 35 to penetrate to the package lower surface 2b (the lower surface of the resin terrace 37).

Recently, the outer dimensions of semiconductor devices tend to be smaller with the miniaturization of electronic apparatuses (electronics), which leads to shortening of the length of the inner lead 5. Due to such a tendency, a wire 6 to be coupled to this inner lead 5 is formed in the vicinity of the side surface 2d of the package (resin sealing body) 2. When the external dimensions of a semiconductor device are small, the length of the inner lead 5 is short, or the wire 6 is coupled to the vicinity of the side surface 2d of the package 2, irradiation of a laser light to the side surface 2d of the package 2 in the secondary laser beam irradiation step as described in Section 2, there is a possibility of a portion of the wire 6 being exposed from the package 2. It is therefore preferred to form the resin terrace (resin remaining portion) 37 as the semiconductor device described in Sections 10 and 11 in order to further improve the reliability of a semiconductor device.

12. Supplementary description of the cross-sectional shape of outer lead and laser irradiation method in each embodiment of the present application (mainly, FIGS. 60 and 61)

In this section, a description will collectively be made of the shape of leads and a laser irradiation angle or scanning method with respect to mainly the primary laser irradiation step (in Sections 1 to 4, the laser dam resin removal step in FIG. 7) described above.

Figure 60:
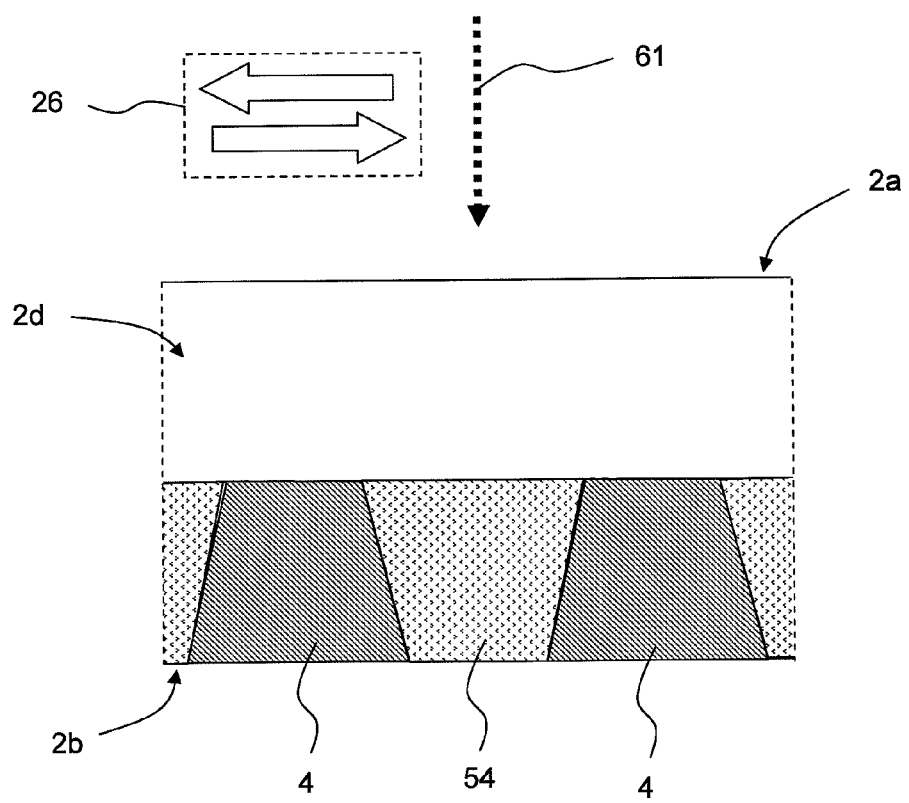
FIG. 60 is a partial side view of a package for describing the relationship between the cross-sectional shape (equilateral trapezoidal cross-section) of outer leads and a laser irradiation method in each embodiment of the present application.
Figure 61:
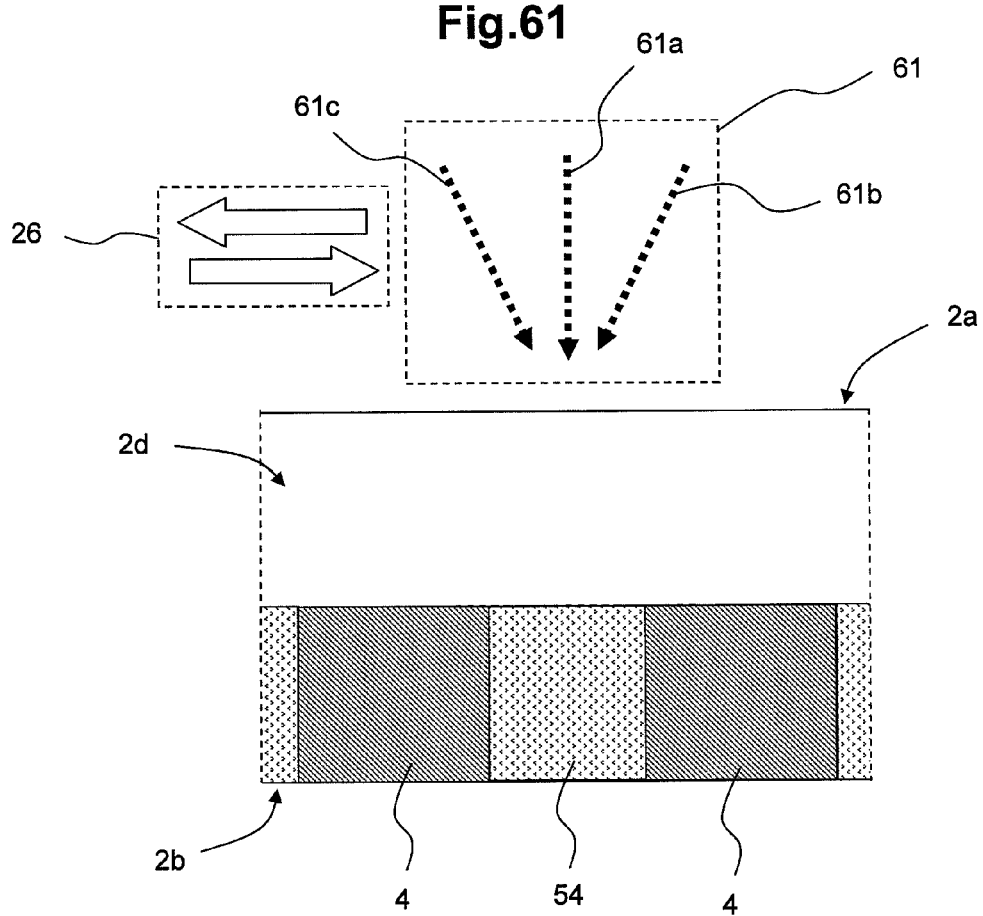
FIG. 61 is a partial side view of a package for describing the relationship between the cross-sectional shape (quadrangular cross-section) and a laser irradiation method in each embodiment of the present application.

FIG. 60 is a partial side view of a package for describing the relationship between the cross-sectional shape (equilateral trapezoidal cross-section) of outer leads and a laser irradiation method in each embodiment of the present application. FIG. 61 is a partial side view of a package for describing the relationship between the cross-sectional shape (quadrangular cross-section) of outer leads and a laser irradiation method in each embodiment of the present application. Based on these drawings, a supplementary description relating to the cross-sectional shape of outer leads and a laser irradiation method in each embodiment of the present application will be described.

For example, in the case of the outer lead 4 having an erected trapezoidal cross-section as described mainly in Sections 1 to 4, when the laser beam 61 is made incident on the upper surface 12a of the leadframe 12 perpendicularly as shown in FIG. 60, it simplifies the process most. When the outer lead 4 has a quadrangular cross-section, on the other hand, oblique radiation sometimes becomes necessary to ensure the laser irradiation to the side surface. In such a case, it is also possible to completely remove the residual resin by conducting perpendicular radiation 61a multiple times or by conducting it with a slightly increased laser power. When a laser light is irradiated to the same portion multiple times, the residual resin can be removed effectively by carrying out first radiation as perpendicular radiation 61a, second radiation as oblique radiation 61b, and third radiation as oblique radiation 61c in a direction opposite to the second one with respect to the first one, as shown in FIG. 61.

13. Description on the modification example with respect to the shape and formation method of outer leads in each embodiment of the present application (mainly, FIGS. 62 and 63).

In the embodiments described above, an assembly process using mainly a leadframe formed by patterning through wet etching was described specifically. The invention is not limited to it, but needless to say, can be applied to an assembly process using a leadframe formed using press processing (punching processing) with a cutting die or a leadframe formed using press processing and wet etching in combination. One example of it will next be described.

Figure 62:
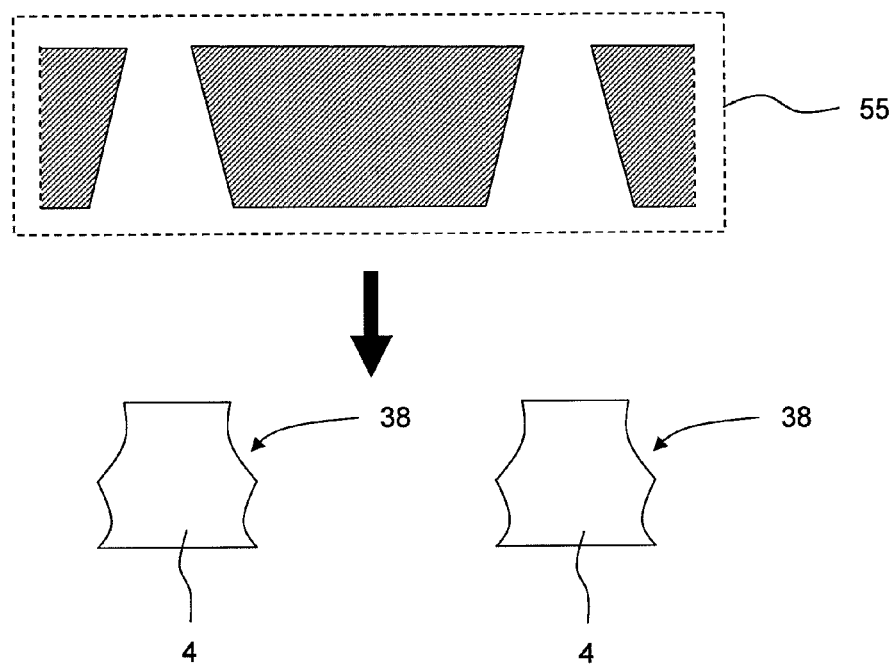
FIG. 62 shows cross-sectional views (before molding) of an outer lead and a molding die for describing a modification example (example using both etching and a molding die in combination) with respect to the shape or formation method of the outer lead in each embodiment of the present application.
Figure 63:
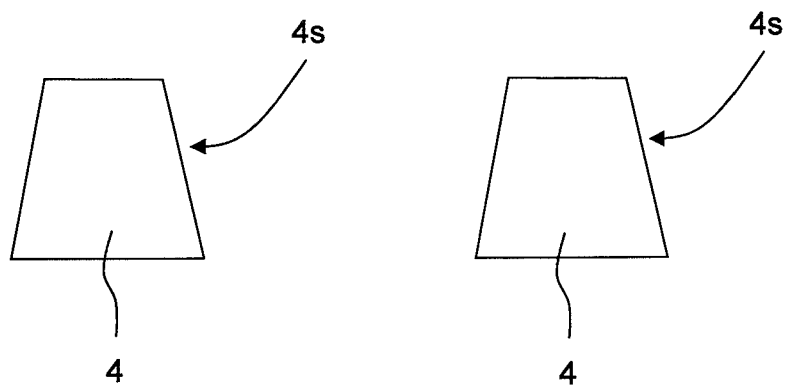
FIG. 63 is a cross-sectional view (after molding) of an outer lead for describing a modification example (example using both etching and a molding die in combination) with respect to the shape of formation method of the outer lead in each embodiment of the present application.

FIG. 62 are cross-sectional views (before molding) of an outer lead and a molding die for describing a modification example (example using both etching and a molding die in combination) with respect to the shape or formation method of the outer lead in each embodiment of the present application. FIG. 63 is a cross-sectional view (after molding) of an outer lead for describing a modification example (example using both etching and a molding die in combination) with respect to the shape or formation method of the outer lead, in each embodiment of the present application. Based on these drawings, the modification example with respect to the shape or formation method of the outer lead in each embodiment of the present application will next be described.

As described above, although the lead frame formed using an etching system is superior to miniaturization accuracy to that formed using press processing, leads have, on the side surface thereof (at the center portion of the side surface) an irregularity 38 due to etching, that is, a small prominence (protrusion) as shown in FIG. 62. According to the embodiments described above, even if such a small prominence is formed, a laser light can be applied efficiently to the side surface of the outer lead 4, enabling removal of the residual resin member 54. When a large prominence (protrusion) is formed during press molding of a leadframe, there is a possibility of failing to completely remove the residual resin member 54. As shown in FIGS. 62 and 63, the side surface 4s of the outer lead 4 is planarized by, after patterning through etching, carrying out press processing with a molding die 55 or the like to remove the prominence prior to the resin sealing step. This makes it possible to more completely remove the residual resin member 54. From the standpoint of improving the mounting strength of a semiconductor device, removal of at least a prominence on the side surface 4s of the outer lead 4 is necessary, because the outer lead 4 having an almost erected and substantially trapezoidal cross-section facilitates climbing of solder at the time of solder reflow mounting and is effective for accelerating good solder fillet formation extending to the upper surface of the outer lead 4. In addition, such a shape is also effective for relaxing the stress upon mounting.

On the other hand, there is no such eager request for strength of the side surface of the inner lead 5, because it is sealed with a resin sealing body in a resin sealing step conducted later. In addition, since adhesion between the resin sealing body and a leadframe made of a metal is not strong, a prominence left on the side surface of the inner lead 5 can improve the adhesion with the resin sealing body, making it possible to improve the reliability of a semiconductor device. It is therefore preferred to selectively carry out press processing of the side surface of the outer lead 4 by using a molding die 55 having, as shown in FIG. 62, a planar shape capable of avoiding the inner lead 5.

14. Description on a modification example (local scanning system) of the laser irradiation system in each embodiment of the present application (mainly, FIGS. 64 and 65)

In the laser irradiation process described in Sections 3, 9, and 11, examples of conducting scanning extensively all over the package was mainly described. In this section, on the other hand, a system of repeating local scanning to extend it to the necessary portions of the whole package will be described as a modification example.

Figure 64:
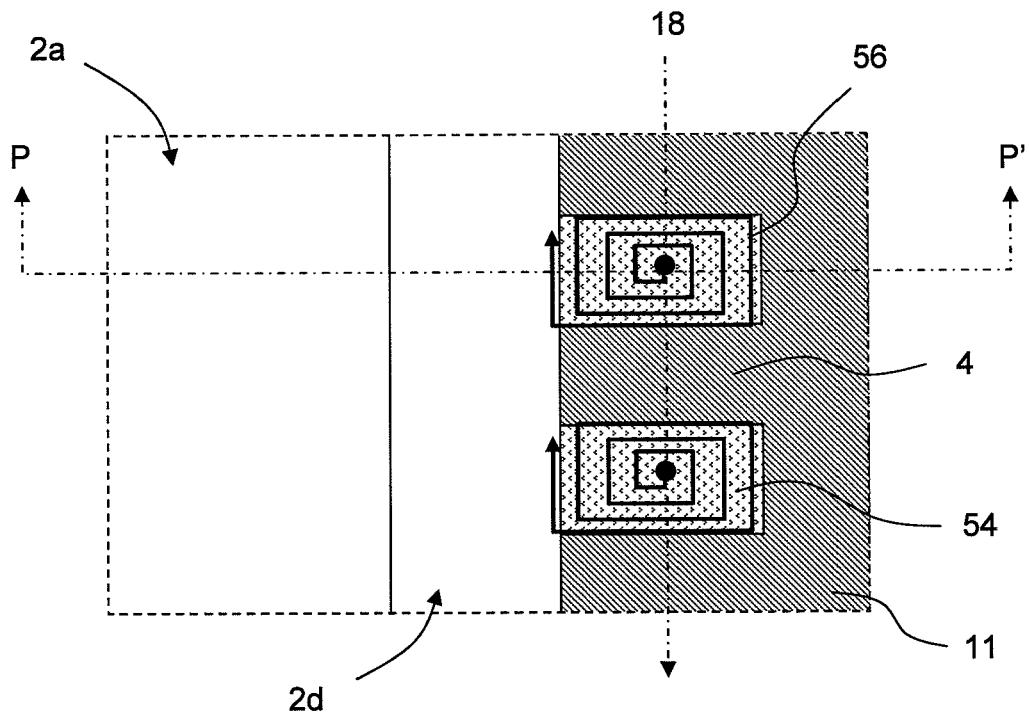
FIG. 64 is a fragmentary enlarged top view (during local laser scanning) of the sealing body peripheral portion R3 shown in FIG. 34 which is a modification example (integrated system of primary and secondary local laser scanning) of the resin removal process using laser.
Figure 65:
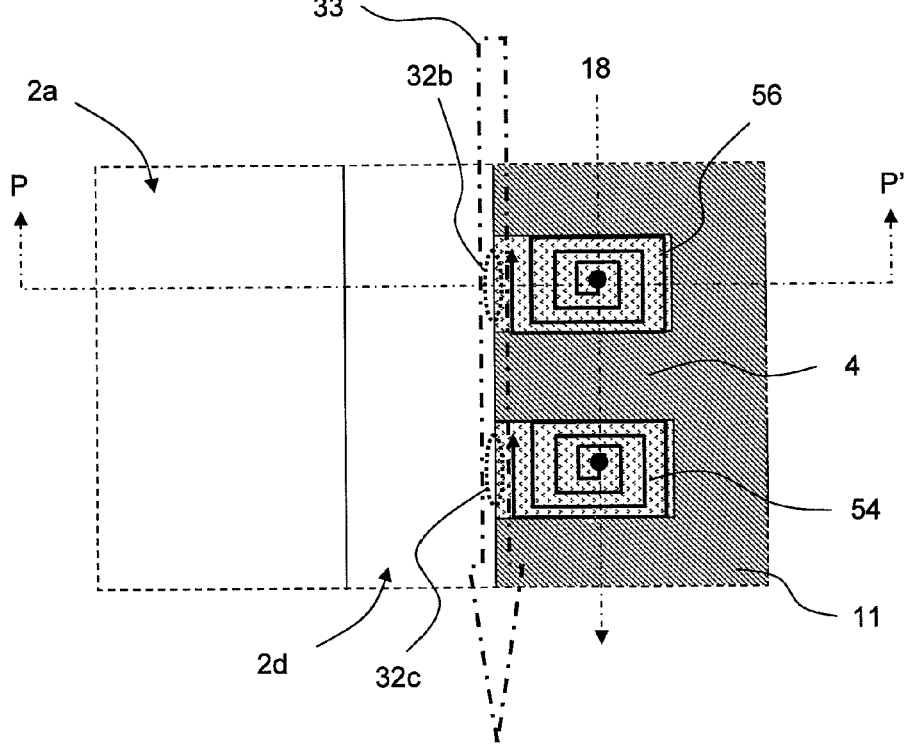
FIG. 65 is a fragmentary enlarged top view (during local laser scanning) of the sealing body peripheral portion R3 shown in FIG. 34 which is a modification example (primary local laser scanning system) of the resin removal process using laser.

FIG. 64 is a fragmentary enlarged top view (during local laser scanning) of the sealing body peripheral portion R3 shown in FIG. 34 which is a modification example (integrated system of primary and secondary local laser scanning) of the resin removal process using laser. FIG. 65 is a fragmentary enlarged top view (during local laser scanning) of the sealing body peripheral portion R3 shown in FIG. 34 which is a modification example (primary local laser scanning system) of the resin removal process using laser. Based on these drawings, a description will be made of the modification example (local scanning system) of the laser irradiation system in each embodiment of the present application.

(1) Integrated System of Primary and Secondary Local Laser Scanning (Mainly, FIG. 64)

In this system, as shown in FIG. 64, a region corresponding to the outer lead-to-outer lead opening 10 is subjected to a primary laser irradiation step and a secondary laser irradiation step as an integrated local laser irradiation step, for example, along a local scanning path 56. When the irradiation to one region is conducted and completed, a region corresponding to a next outer lead-to-outer lead opening 10 is subjected to a similar treatment after transfer thereto along the global scanning path 18. Here, when laser irradiation is conducted in a path such as the local scanning path 56, metals scattered and attached in the initial scanning path striding over the outer leads 4 can be removed, together with the resin surface layer, by the irradiation on the resin conducted in a final stage.

In this case, incidentally, the secondary resin removal portion 35 may be either an upper-half secondary resin removal portion or a penetration-type secondary resin removal portion. The package form may be either a package with a resin terrace or a typical package. In the package with a resin terrace, similar to Section 11, the local scanning path 56 should be compressed toward the outside in the longitudinal direction of the lead.

(2) Primary Local Laser Scanning System (Mainly, FIG. 65)

In this system, as shown in FIG. 65, a region corresponding to each outer lead-to-outer lead opening 10 is subjected to only a primary laser irradiation step as the local laser irradiation step, for example, along the local scanning path 56. When the irradiation to one region is conducted and completed, a region corresponding to a next outer lead-to-outer lead opening 10 is subjected to a similar treatment after transfer thereto along the global scanning path 18. As the secondary laser irradiation step, spot irradiation is then performed collectively along the secondary laser beam scanning path 33 similar to Section 9 after completion of the primary laser irradiation step.

In this case, the secondary resin removal portion 35 may be either an upper-half secondary resin removal portion or a penetration-type secondary resin removal portion. The package form may be either a package with a resin terrace or a typical package. In the package with a resin terrace, similar to Section 11, the local scanning path 56 should be compressed toward the outside in the longitudinal direction of the lead.

15. Description on a peripheral gas system upon laser irradiation in each embodiment of the present application (mainly, FIGS. 66 to 68)

In this section, a supplementary description to the description made relating to FIG. 22 in Section 3 will be made. Described specifically, a description will be made of details of a mounting structure of the leadframe 12 on the θ table 65 in FIG. 22.

Figure 66:
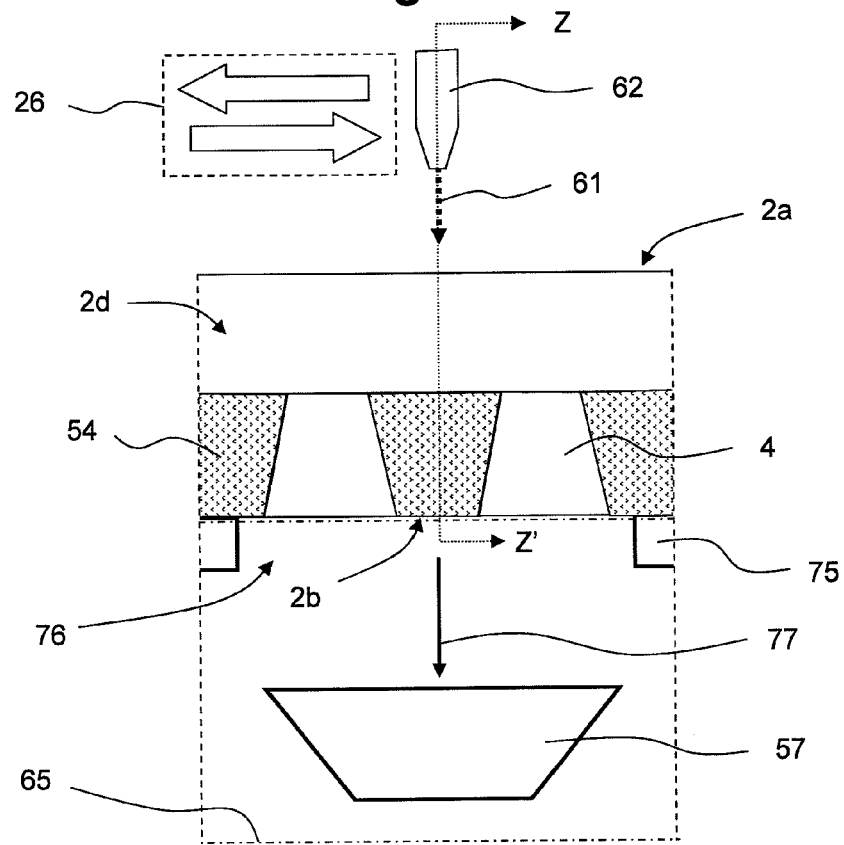
FIG. 66 shows a principal part of a laser irradiation apparatus and the partial side surface of a package (typical package) for describing a peripheral gas system upon laser irradiation in each embodiment of the present application.
Figure 67:
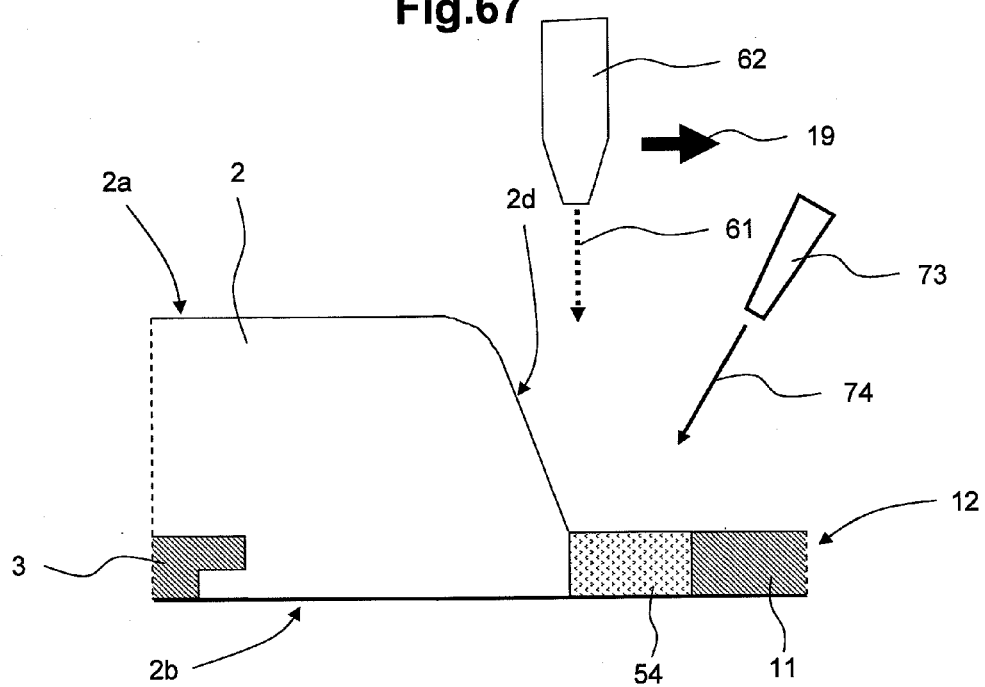
FIG. 67 is a schematic cross-sectional view corresponding to the Z-Z' of FIG. 66.
Figure 68:
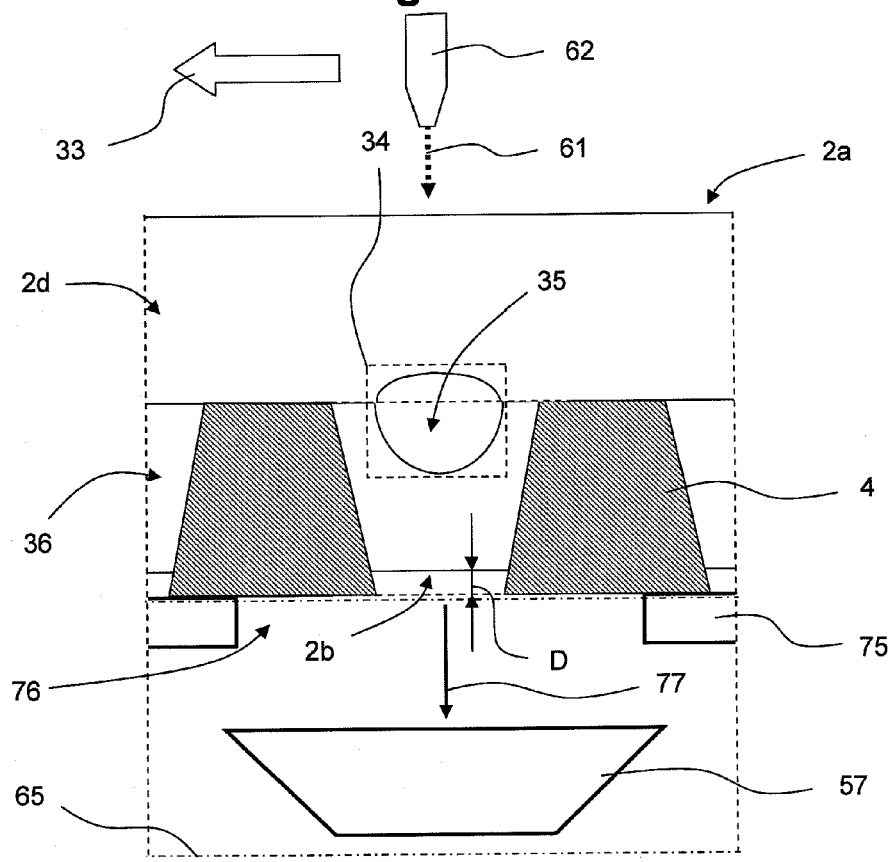
FIG. 68 shows a principal part of a laser irradiation apparatus and the partial side surface of a package (bottom-surface sheet mold package) for describing a peripheral gas system upon laser irradiation in each embodiment of the present application.

FIG. 66 shows a principal part of a laser irradiation apparatus and a partial side surface of a package (typical package) for describing a peripheral gas system upon laser irradiation in each embodiment of the present application. FIG. 67 is a schematic cross-sectional view corresponding to the Z-Z' of FIG. 66. FIG. 68 shows a principal part of a laser irradiation apparatus and a partial side surface of a package (lower-surface sheet mold package) for describing a peripheral gas system upon laser irradiation in each embodiment of the present application. Based on these drawings, the peripheral gas system upon laser irradiation in each embodiment of the present application will next be described.

(1) Basic Form of a Gas System (Mainly, FIGS. 66 and 67)

As illustrated in FIGS. 66 and 67, taking a primary laser irradiation step as an example (this structure is basically similar to a secondary laser irradiation step), the gas system has such a structure that an atmospheric gas (for example, air, or an inert gas such as argon gas or nitrogen gas is also usable if necessary) is supplied from a gas supply nozzle 73 upon laser scanning and it is suctioned and discharged from a lower gas exhaust hole 57 through an exhaust opening 76 provided in a leadframe holding jig 75. Such a structure enables to reduce re-deposition of scattering such as metal vapor generated in the primary laser irradiation step. Needless to say, the structure as described above is not essential.

(2) An Example of Sheet Molding (Mainly, FIG. 68)

The configuration of a gas system effective, upon laser irradiation, for a sheet mold package, that is, a package obtained by resin molding while laying a release sheet on the lower side will be described with the secondary laser irradiation step as an example.

As shown in FIG. 68, the sheet mold package has, between the lower surface of the outer lead 4 and the lower surface 2b of the resin sealing body 2 (package), a clearance D so that the atmospheric gas supplied from the gas supply nozzle 73 shown in FIG. 67 passes between the outer leads 4 and is suctioned and exhausted from a gas exhaust hole 57 placed below.

16. Summary

The invention made by the present inventors was described specifically based on some embodiments. The present invention is not limited to or by them but can be changed without departing from the gist of the invention.

For example, in the embodiment described above, mainly a QFN type plastic package was described specifically. The invention is not limited to it but needless to say, it can be applied widely to plastic packages of another form, such as those having a protruded resin portion between outer leads or those having a resin member remained on the side surface of outer leads. The embodiments were described mainly in the case where transfer molding was employed. The invention is not limited to it but can be applied also to another plastic molding method such as compression molding.

In the embodiments described above, the cross-sectional shape of the outer lead 4 was described. The bumper 7 placed at the corner of the resin sealing body 2 may also have a similar shape to that of the outer lead 4. This makes it possible to further improve the mounting strength of a semiconductor device.

In the embodiments described above, a system of moving the XY tables having thereon the resin removal laser beam delivery head 62 or the leadframe was described specifically as a laser beam scanning system. Needless to say, the present invention can also be applied to a system of raster scanning a laser beam while operating a plurality of galvano mirrors.

Incidentally, in the embodiments described above, with regards to the kind and wavelength of laser, an example of using an Nd:YAG laser with 1064 nm wavelength was described. The present invention is not limited to it but needless to say, it can be applied also to a laser of the same kind with a different wavelength, another solid laser such as YAG laser, $YVO_4$ laser, and fiber laser, and a gas laser such as carbon dioxide laser and excimer laser (wavelength at around 1064 nm or another wavelength).

INDUSTRIAL APPLICABILITY

The present invention can be applied to sealing of integrated circuits such as semiconductor device, single devices, composite modules, and the like.

EXPLANATION OF REFERENCE NUMERALS

1: Semiconductor chip
1a: Upper surface of semiconductor chip (device surface)
2: Resin sealing body (package)
2a: Upper surface (of resin sealing body)
2b: Bottom surface (of resin sealing body)
2c: Chamfered corner (of resin sealing body)
2d: Side surface (of resin sealing body)
2e: Ejector pin trace
3: Die pad
3a: Upper surface (of die pad)
3b: Lower surface (of die pad)
4: Outer lead
4r: Actual shape of outer-lead side surface
4s: Outer-lead side surface
5: Inner lead
5i: Inner-lead inner end portion (bonding portion)
5ir: Actual shape of the side surface of the inner-lead inner end portion
5p: Inner lead main portion
5r: Actual shape of the side surface of inner lead main portion
5s: Inner-lead side surface
6: Gold wire (bonding wire)
7: Bumper
8: Adhesive layer
9: Die pad support lead (suspending lead)
10: Outer lead-to-outer lead opening
11: Dam bar (tie bar)
12: Leadframe
12a: Upper surface (of leadframe)
12b: Lower surface (of leadframe)
12c: Frame portion (of leadframe)
14: Bonding pad
15: Half etch portion
16: Slit
17: Corner opening
18,18a,18b,18c: Primary laser beam scanning path (global scanning path)
19: Primary laser beam scanning path shifting direction
20,20a,20b,20c: Primary laser beam irradiation sub-region
21: Portion to be cut with a dam bar cutting die
22: Portion to be cut with a corner cutting die
23: Outer circumference of resin sealing body (or mold cavity)
24: Laser irradiation region (outer circumference thereof)
25: Solder plating layer
26: Primary laser beam scanning direction
30: Laser beam cross-section
32,32a,32b,32c: Laser beam spot irradiation region
33: Secondary laser beam scanning path
34: First portion
35: Secondary resin removal portion
36: Resin exposed portion
37: Resin remaining portion (resin terrace)
38: Irregularity due to etching
42: Solder fillet (or re-solidified layer)
45: Wiring substrate
46: Land
51: Molding die
53: Mold cavity
54: Lead-to-lead resin protrusion (outer lead residual resin member)
55: Molding die
56: Local scanning path
57: Gas exhaust hole
58: Location aware optical system
59: Laser irradiation apparatus
60: Laser apparatus base
61,61a,61b,61c: Resin removal laser light (laser beam)
62: Resin removal laser beam delivery head
63: Laser X-table
64: Laser Y-table
65: θ Table
66: Z moving mechanism
67: Horizontally rotating φ moving mechanism (horizontally rotating arm)
68: θ Moving mechanism
69: Object-placing X-table
70: Object-placing Y-table
71: Marking laser light (laser beam)
72: Marking laser beam delivery head
73: Gas supply nozzle
74: Gas jet
75: Leadframe retaining jig
76: Exhaust opening
77: Gas flow
91: Perpendicular line (or line parallel to laser beam)
92: Plane substantially parallel to the side surface of outer lead (of cross-section C-C' of FIG. 25) (regression plane)
100: Assembly step
101: Die bonding step
102: Wire bonding step
103: Resin sealing step
104: Laser resin removal step
105: Hydraulic deburring treatment
106: Solder plating step
107: Laser marking step
108: Cutting and separating step
109: Mounting step (solder flow)
D: Clearance of the lower surface
LB: Lead bumper spacing
LL: Lead spacing
P: Lead pitch
R1: Back-surface corner portion of sealing body
R2: Outer lead-to-outer lead region
R3: Sealing body peripheral portion
S: Spot irradiation length
Td: Pulse duration time
Tr: Pulse repeating interval
W: Flared amount
θ: Inclination angle of laser light

The invention claimed is:

1. A method for manufacturing a semiconductor device, comprising the steps of:
   (a) setting a leadframe to which a semiconductor chip is fixed in a molding die, and sealing the semiconductor chip with a sealing resin so as to form a resin sealing body on the leadframe,
   the leadframe comprising:
      (i) a die pad to which the semiconductor chip is fixed,
      (ii) a plurality of inner leads extending to a side surface of the resin sealing body from an outer periphery of the die pad so as to form substantially a same plane with a bottom surface of the resin sealing body, and a plurality of outer leads connected to the inner leads, respectively, and protruding from the side surface of the resin sealing body;
      (iii) a dam bar connecting vicinities of outer end portions of the outer leads;
      (iv) lead-to-lead resin protrusion formed between the outer leads and protruding from the side surface of the resin sealing body;
   the method for manufacturing the semiconductor device further comprising the steps of:
   (b) after step (a), removing the lead-to-lead resin protrusions by irradiating a laser light to the lead-to-lead resin protrusions;
   (c) after step (b), irradiating a laser light to a first portion of the resin, which is at a boundary between a resin surface exposed by removing a lead-to-lead resin protrusion and a remaining resin surface, thereby removing the first portion of the resin; and
   (d) after step (c), forming a metal film on surface of the leadframe protruded from the resin sealing body,
   wherein in step (c) the laser light is irradiated obliquely relative to an irradiation direction of the laser light in step (b).

2. The method for manufacturing a semiconductor device according to claim 1, wherein in step (b), the laser light is irradiated to the lead-to-lead resin protrusions and the outer leads, respectively, to remove the lead-to-lead resin protrusions and expose a side surface of each of the outer leads.

3. The method for manufacturing a semiconductor device according to claim 2, wherein in step (b), the laser light is obliquely irradiated to the side surface of each of the outer leads.

4. The method for manufacturing a semiconductor device according to claim 2, wherein cross-sections of the outer leads perpendicular to longitudinal directions thereof have erected and substantially trapezoidal shapes, and in step (b), the laser light is irradiated from an upper surface side of the leadframe.

5. The method for manufacturing a semiconductor device according to claim 4, wherein removal of the first portion of the resin in step (c) is performed by carrying out spot irradiation of the laser light to remove an upper surface side of the resin.

6. The method for manufacturing a semiconductor device according to claim 5, wherein the first portion of the resin is a portion of the resin sealing body.

7. The method for manufacturing a semiconductor device according to claim 6, wherein in step (c), the laser light is spot irradiated from a direction which is inclined toward a center portion of the resin sealing body.

8. The method for manufacturing a semiconductor device according to claim 5, wherein the first portion of the resin is a remaining portion of the lead-to-lead resin protrusion.

9. The method for manufacturing a semiconductor device according to claim 4, wherein the removal of the first portion of the resin in step (c) is performed so as to penetrate from an upper surface side to a lower surface side of the resin by the spot irradiation of the laser light.

* * * * *